United States Patent
Shirota et al.

(10) Patent No.: US 7,459,748 B2
(45) Date of Patent: Dec. 2, 2008

(54) SEMICONDUCTOR MEMORY DEVICE

(75) Inventors: Riichiro Shirota, Fujisawa (JP); Fumitaka Arai, Yokohama (JP); Toshiyuki Enda, Zushi (JP); Hiroyoshi Tanimoto, Yokohama (JP); Naoki Kusunoki, Fuchu (JP); Nobutoshi Aoki, Yokohama (JP); Makoto Mizukami, Kawasaki (JP); Kiyotaka Miyano, Shinagawa-ku (JP); Ichiro Mizushima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/549,770

(22) Filed: Oct. 16, 2006

(65) Prior Publication Data

US 2007/0102749 A1    May 10, 2007

(30) Foreign Application Priority Data

Oct. 17, 2005  (JP) .............................. 2005-301906
Jun.  9, 2006  (JP) .............................. 2006-160500

(51) Int. Cl.
*H01L 29/76* (2006.01)
(52) U.S. Cl. .............................. 257/314; 257/E21.209
(58) Field of Classification Search ................. 257/298, 257/E21.209, E21.662, E21.679
See application file for complete search history.

(56) References Cited

U.S. PATENT DOCUMENTS

| 5,358,887 | A | * | 10/1994 | Hong ........................ 438/153 |
|---|---|---|---|---|
| 6,115,287 | A | | 9/2000 | Shimizu et al. |
| 2005/0057966 | A1 | * | 3/2005 | Nazarian ................ 365/185.01 |
| 2005/0111260 | A1 | * | 5/2005 | Nazarian ................ 365/185.17 |
| 2006/0049449 | A1 | * | 3/2006 | Iino et al. .................... 257/315 |
| 2006/0252187 | A1 | * | 11/2006 | Ramaswamy et al. ........ 438/151 |
| 2007/0040218 | A1 | * | 2/2007 | Haensch et al. .............. 257/347 |
| 2007/0069292 | A1 | * | 3/2007 | Yamada ...................... 257/347 |
| 2007/0102749 | A1 | | 5/2007 | Shirota et al. |
| 2007/0138576 | A1 | * | 6/2007 | Mizukami et al. ............ 257/390 |

OTHER PUBLICATIONS

U.S. Appl. No. 11/396,507, filed Apr. 5, 2006, Toshiyuki Enda et al.
U.S. Appl. No. 11/401,937, filed Apr. 12, 2006, Riichiro Shirota et al.
U.S. Appl. No. 11/549,770, filed Oct. 16, 2005, Shirota et al.
U.S. Appl. No. 11/563,073, filed Nov. 24, 2006, Iino et al.
U.S. Appl. No. 11/608,393, filed Dec. 8, 2006, Mizukami et al.
U.S. Appl. No. 11/616,522, filed Dec. 27, 2006, Arai et al.
U.S. Appl. No. 11/834,886, filed Aug. 7, 2007, Watanabe et al.
U.S. Appl. No. 11/841,257, filed Aug. 20, 2007, Mizukami et al.
U.S. Appl. No. 11/947,008, filed Nov. 29, 2007, Nishihara et al.
U.S. Appl. No. 11/963,046, filed Dec. 21, 2007, Arai et al.

* cited by examiner

*Primary Examiner*—Thao P. Le
(74) *Attorney, Agent, or Firm*—Oblon, Spivak, McClelland, Maier & Neustadt, P.C.

(57) ABSTRACT

A semiconductor memory device includes: a semiconductor substrate; a semiconductor layer formed on the semiconductor substrate with an insulating film interposed therebetween, the semiconductor layer being in contact with the semiconductor substrate via an opening formed in the insulating film; and a NAND cell unit formed on the semiconductor layer with a plurality of electrically rewritable and non-volatile memory cells connected in series and first and second select gate transistors disposed at both ends thereof.

13 Claims, 50 Drawing Sheets

Memory Cell Array Area    Mark Area

Memory Cell Array Area    Mark Area

Memory Cell Array Area    Mark Area

FIG. 29A

Opening under SG

| Time (μs) | p-well Voltage (V) | Source Voltage (V) | Drain Voltage (V) | Floating Gate Voltage (V) | Select Gate Voltage (V) | Control Gate Voltage (V) |
|---|---|---|---|---|---|---|
| 0 | 0 | 0 | 0 | 0 | 0 | 0 |
| 10 | 20 | 20 | 20 | 10 | 15 | 0 |
| 100 | 20 | 20 | 20 | 10 | 15 | 0 |

FIG. 29B

Opening under CB

| Time (μs) | p-well Voltage (V) | Source Voltage (V) | Drain Voltage (V) | Floating Gate Voltage (V) | Select Gate Voltage (V) | Control Gate Voltage (V) |
|---|---|---|---|---|---|---|
| 0 | 0 | 0 | 0 | 0 | 0 | 0 |
| 10 | 20 | 19 | 19 | 10 | 15 | 0 |
| 100 | 20 | 19 | 19 | 10 | 15 | 0 |

FIG. 33

| L(um) | S(um) | W(um) | TOX(um) | TSOI(um) | TBOX(um) | NSOI(cm-3) | PSOI(cm-3) | PSUB(cm-3) | VSUB(V) | ID(-0.5V) | ID(-0.2V) | ID(0.0V) | ID(0.2V) | ID(0.5V) | ID(0.2V)/ID(-0.2V) | ID(0.5V)/ID(-0.5V) |
|---|---|---|---|---|---|---|---|---|---|---|---|---|---|---|---|---|
| 0.08 | 0.08 | 0.08 | 0.008 | 0.01 | 0.02 | 4.98E+17 | 1.00E+16 | 1.00E+18 | 0 | 4.62E-12 | 3.11E-09 | 1.02E-07 | 4.62E-07 | 1.07E-06 | 1.48E+02 | 2.31E+05 |
| 0.08 | 0.08 | 0.08 | 0.008 | 0.02 | 0.02 | 1.48E+17 | 1.00E+16 | 1.00E+18 | 0 | 6.06E-12 | 3.16E-09 | 1.00E-07 | 4.89E-07 | 1.18E-06 | 1.55E+02 | 1.95E+05 |
| 0.08 | 0.08 | 0.08 | 0.008 | 0.01 | 0.04 | 3.30E+17 | 1.00E+16 | 1.00E+18 | -0.5 | 1.14E-12 | 1.81E-09 | 1.00E-07 | 5.31E-07 | 1.28E-06 | 2.93E+02 | 1.12E+06 |
| 0.08 | 0.08 | 0.08 | 0.008 | 0.02 | 0.02 | 4.50E+17 | 1.00E+16 | 1.00E+18 | -0.5 | 5.23E-12 | 3.18E-09 | 1.00E-07 | 4.70E-07 | 1.11E-06 | 1.48E+02 | 2.13E+05 |
| 0.08 | 0.08 | 0.08 | 0.008 | 0.02 | 0.04 | 1.02E+17 | 1.00E+16 | 1.00E+18 | -0.5 | 2.00E-12 | 2.15E-09 | 1.00E-07 | 5.41E-07 | 1.34E-06 | 2.51E+02 | 6.69E+05 |
| 0.08 | 0.08 | 0.08 | 0.008 | 0.04 | 0.02 | 1.47E+17 | 1.00E+16 | 1.00E+18 | -0.5 | 7.30E-12 | 3.42E-09 | 1.00E-07 | 4.79E-07 | 1.17E-06 | 1.40E+02 | 1.60E+05 |
| 0.08 | 0.08 | 0.08 | 0.008 | 0.04 | 0.06 | 5.62E+16 | 1.00E+16 | 1.00E+18 | -0.5 | 5.84E-12 | 2.94E-09 | 1.01E-07 | 5.19E-07 | 1.29E-06 | 1.76E+02 | 2.21E+05 |
| 0.08 | 0.08 | 0.08 | 0.008 | 0.01 | 0.06 | 2.60E+17 | 1.00E+16 | 1.00E+18 | -1 | 6.63E-13 | 1.47E-09 | 1.00E-07 | 5.64E-07 | 1.38E-06 | 3.83E+02 | 2.08E+06 |
| 0.08 | 0.08 | 0.08 | 0.008 | 0.02 | 0.04 | 2.73E+17 | 1.00E+16 | 1.00E+18 | -1 | 1.99E-12 | 2.23E-09 | 1.00E-07 | 5.21E-07 | 1.27E-06 | 2.33E+02 | 6.40E+05 |
| 0.08 | 0.08 | 0.08 | 0.008 | 0.02 | 0.06 | 8.15E+16 | 1.00E+16 | 1.00E+18 | -1 | 1.27E-12 | 1.84E-09 | 1.00E-07 | 5.64E-07 | 1.41E-06 | 3.06E+02 | 1.11E+06 |
| 0.08 | 0.08 | 0.08 | 0.008 | 0.04 | 0.02 | 2.74E+17 | 1.00E+16 | 1.00E+18 | -1 | 6.45E-12 | 3.38E-09 | 1.01E-07 | 4.72E-07 | 1.14E-06 | 1.40E+02 | 1.77E+05 |
| 0.08 | 0.08 | 0.08 | 0.008 | 0.04 | 0.04 | 9.10E+16 | 1.00E+16 | 1.00E+18 | -1 | 3.96E-12 | 2.79E-09 | 1.00E-07 | 5.08E-07 | 1.25E-06 | 1.82E+02 | 3.16E+05 |
| 0.08 | 0.08 | 0.08 | 0.008 | 0.06 | 0.06 | 1.30E+17 | 1.00E+16 | 1.00E+18 | -1 | 5.31E-12 | 2.82E-09 | 1.01E-07 | 5.10E-07 | 1.26E-06 | 1.74E+02 | 2.37E+05 |
| 0.08 | 0.08 | 0.08 | 0.008 | 0.06 | 0.02 | 7.02E+16 | 1.00E+16 | 1.00E+18 | -1 | 5.67E-12 | 3.12E-09 | 1.00E-07 | 4.66E-07 | 1.10E-06 | 1.49E+02 | 1.94E+05 |
| 0.08 | 0.08 | 0.08 | 0.008 | 0.01 | 0.06 | 5.22E+17 | 1.00E+16 | 1.00E+18 | -1.5 | 7.21E-13 | 1.60E-09 | 1.00E-07 | 5.32E-07 | 1.28E-06 | 3.33E+02 | 1.77E+06 |
| 0.08 | 0.08 | 0.08 | 0.008 | 0.02 | 0.04 | 4.46E+17 | 1.00E+16 | 1.00E+18 | -1.5 | 1.97E-12 | 2.30E-09 | 1.01E-07 | 5.08E-07 | 1.23E-06 | 2.21E+02 | 6.23E+05 |
| 0.08 | 0.08 | 0.08 | 0.008 | 0.02 | 0.06 | 1.99E+17 | 1.00E+16 | 1.00E+18 | -1.5 | 1.29E-12 | 1.90E-09 | 9.99E-08 | 5.45E-07 | 1.35E-06 | 2.87E+02 | 1.05E+06 |
| 0.08 | 0.08 | 0.08 | 0.008 | 0.04 | 0.02 | 3.96E+17 | 1.00E+16 | 1.00E+18 | -1.5 | 5.62E-12 | 3.28E-09 | 1.00E-07 | 4.68E-07 | 1.12E-06 | 1.43E+02 | 2.00E+05 |
| 0.08 | 0.08 | 0.08 | 0.008 | 0.04 | 0.04 | 1.66E+17 | 1.00E+16 | 1.00E+18 | -1.5 | 3.73E-12 | 2.78E-09 | 1.00E-07 | 5.00E-07 | 1.22E-06 | 1.80E+02 | 3.28E+05 |
| 0.08 | 0.08 | 0.08 | 0.008 | 0.04 | 0.06 | 6.48E+16 | 1.00E+16 | 1.00E+18 | -1.5 | 2.92E-12 | 2.51E-09 | 9.99E-08 | 5.22E-07 | 1.30E-06 | 2.08E+02 | 4.45E+05 |
| 0.08 | 0.08 | 0.08 | 0.008 | 0.06 | 0.04 | 2.03E+17 | 1.00E+16 | 1.00E+18 | -1.5 | 4.85E-12 | 2.88E-09 | 1.01E-07 | 5.03E-07 | 1.24E-06 | 1.75E+02 | 2.56E+05 |
| 0.08 | 0.08 | 0.08 | 0.008 | 0.06 | 0.02 | 1.20E+17 | 1.00E+16 | 1.00E+18 | -1.5 | 5.48E-12 | 3.17E-09 | 1.01E-07 | 4.64E-07 | 1.09E-06 | 1.46E+02 | 1.99E+05 |
| 0.08 | 0.08 | 0.08 | 0.008 | 0.08 | 0.04 | 4.27E+16 | 1.00E+16 | 1.00E+18 | -1.5 | 4.30E-12 | 2.85E-09 | 1.00E-07 | 4.77E-07 | 1.14E-06 | 1.67E+02 | 2.65E+05 |

FIG. 35

| L(um) | S(um) | W(um) | TOX(um) | TSOI(um) | TBOX(um) | NSOI(cm-3) | PSOI(cm-3) | PSUB(cm-3) | VSUB(V) | ID(-0.5V) | ID(-0.2V) | ID(0.0V) | ID(0.2V) | ID(0.5V) | ID(0.2V)/ID(-0.2V) | ID(0.5V)/ID(-0.5V) |
|---|---|---|---|---|---|---|---|---|---|---|---|---|---|---|---|---|
| 0.08 | 0.08 | 0.08 | 0.008 | 0.01 | 0.02 | 4.92E+17 | 1.00E+16 | 1.00E+18 | 0 | 4.40E-12 | 2.99E-09 | 9.97E-08 | 4.60E-08 | 1.07E-06 | 1.54E+02 | 2.44E+05 |
| 0.08 | 0.08 | 0.08 | 0.008 | 0.02 | 0.02 | 1.47E+17 | 1.00E+16 | 1.00E+18 | 0 | 5.93E-12 | 3.11E-09 | 9.97E-08 | 4.91E-07 | 1.19E-06 | 1.58E+02 | 2.01E+05 |
| 0.08 | 0.08 | 0.08 | 0.008 | 0.04 | 0.02 | 2.17E+16 | 1.00E+16 | 1.00E+18 | 0 | 8.93E-12 | 3.51E-09 | 1.00E-07 | 4.88E-07 | 1.21E-06 | 1.39E+02 | 1.35E+05 |
| 0.08 | 0.08 | 0.08 | 0.008 | 0.01 | 0.04 | 1.19E+18 | 1.00E+16 | 1.00E+18 | 0 | 4.28E-12 | 3.24E-09 | 1.00E-07 | 4.29E-08 | 9.78E-07 | 1.33E+02 | 2.29E+05 |
| 0.08 | 0.08 | 0.08 | 0.008 | 0.02 | 0.04 | 3.29E+17 | 1.00E+16 | 1.00E+18 | 0 | 1.12E-12 | 1.79E-09 | 9.97E-08 | 5.31E-07 | 1.29E-06 | 2.97E+02 | 1.15E+06 |
| 0.08 | 0.08 | 0.08 | 0.008 | 0.02 | 0.02 | 4.49E+17 | 1.00E+16 | 1.00E+18 | -0.5 | 5.12E-12 | 3.14E-09 | 1.00E-07 | 4.71E-07 | 1.13E-06 | 1.50E+02 | 2.20E+05 |
| 0.08 | 0.08 | 0.08 | 0.008 | 0.04 | 0.04 | 1.01E+17 | 1.00E+16 | 1.00E+18 | -0.5 | 1.95E-12 | 2.11E-09 | 9.92E-08 | 5.43E-07 | 1.36E-06 | 2.58E+02 | 6.98E+05 |
| 0.08 | 0.08 | 0.08 | 0.008 | 0.04 | 0.02 | 1.31E+17 | 1.00E+16 | 1.00E+18 | -0.5 | 4.97E-12 | 3.40E-09 | 9.92E-08 | 4.32E-07 | 1.11E-06 | 1.27E+02 | 2.23E+05 |
| 0.08 | 0.08 | 0.08 | 0.008 | 0.01 | 0.02 | 1.85E+18 | 1.00E+16 | 1.00E+18 | -0.5 | 3.97E-12 | 3.33E-09 | 1.00E-07 | 4.14E-07 | 9.31E-07 | 1.24E+02 | 2.34E+05 |
| 0.08 | 0.08 | 0.08 | 0.008 | 0.04 | 0.06 | 7.13E+17 | 1.00E+16 | 1.00E+18 | -1 | 1.22E-12 | 1.97E-09 | 1.00E-07 | 4.98E-07 | 1.18E-06 | 2.52E+02 | 9.71E+05 |
| 0.08 | 0.08 | 0.08 | 0.008 | 0.01 | 0.06 | 2.58E+17 | 1.00E+16 | 1.00E+18 | -1 | 6.54E-13 | 1.46E-09 | 9.99E-08 | 5.65E-07 | 1.39E-06 | 3.87E+02 | 2.13E+06 |
| 0.08 | 0.08 | 0.08 | 0.008 | 0.02 | 0.06 | 2.34E+16 | 1.00E+16 | 1.00E+18 | -1 | 4.40E-13 | 1.18E-09 | 1.00E-07 | 6.38E-07 | 1.62E-06 | 5.40E+02 | 3.68E+06 |
| 0.08 | 0.08 | 0.08 | 0.008 | 0.02 | 0.02 | 7.46E+17 | 1.00E+16 | 1.00E+18 | -1 | 4.66E-12 | 3.18E-09 | 1.00E-07 | 4.60E-08 | 1.09E-06 | 1.44E+02 | 2.34E+05 |
| 0.08 | 0.08 | 0.08 | 0.008 | 0.02 | 0.04 | 2.72E+17 | 1.00E+16 | 1.00E+18 | -1 | 1.95E-12 | 2.20E-09 | 1.00E-07 | 5.24E-07 | 1.29E-06 | 2.38E+02 | 6.63E+05 |
| 0.08 | 0.08 | 0.08 | 0.008 | 0.01 | 0.06 | 8.07E+16 | 1.00E+16 | 1.00E+18 | -1 | 1.25E-12 | 1.82E-09 | 9.97E-08 | 5.67E-07 | 1.43E-06 | 3.12E+02 | 1.15E+06 |
| 0.08 | 0.08 | 0.08 | 0.008 | 0.04 | 0.04 | 1.98E+17 | 1.00E+16 | 1.00E+18 | -1 | 1.48E-12 | 3.33E-09 | 9.93E-08 | 3.36E-08 | 8.38E-07 | 1.01E+02 | 5.66E+05 |
| 0.08 | 0.08 | 0.08 | 0.008 | 0.04 | 0.04 | 8.44E+16 | 1.00E+16 | 1.00E+18 | -1 | 3.35E-12 | 2.89E-09 | 9.97E-08 | 4.87E-07 | 1.24E-06 | 1.69E+02 | 3.70E+05 |
| 0.08 | 0.08 | 0.08 | 0.008 | 0.01 | 0.04 | 2.48E+18 | 1.00E+16 | 1.00E+18 | -1.5 | 3.60E-12 | 3.38E-09 | 1.01E-07 | 4.05E-07 | 8.98E-07 | 1.20E+02 | 2.49E+05 |
| 0.08 | 0.08 | 0.08 | 0.008 | 0.01 | 0.01 | 1.09E+18 | 1.00E+16 | 1.00E+18 | -1.5 | 1.26E-12 | 2.09E-09 | 1.00E-07 | 4.77E-07 | 1.11E-06 | 2.28E+02 | 8.82E+05 |
| 0.08 | 0.08 | 0.08 | 0.008 | 0.01 | 0.01 | 5.20E+17 | 1.00E+16 | 1.00E+18 | -1.5 | 7.11E-13 | 1.59E-09 | 1.00E-07 | 5.34E-07 | 1.29E-06 | 3.37E+02 | 1.82E+06 |
| 0.08 | 0.08 | 0.08 | 0.008 | 0.01 | 0.02 | 2.18E+17 | 1.00E+16 | 1.00E+18 | -1.5 | 5.00E-13 | 1.31E-09 | 1.00E-07 | 5.83E-07 | 1.45E-06 | 4.43E+02 | 2.90E+06 |
| 0.08 | 0.08 | 0.08 | 0.008 | 0.02 | 0.08 | 1.03E+18 | 1.00E+16 | 1.00E+18 | -1.5 | 4.21E-12 | 3.25E-09 | 9.97E-08 | 4.51E-07 | 1.06E-06 | 1.39E+02 | 2.53E+05 |
| 0.08 | 0.08 | 0.08 | 0.008 | 0.02 | 0.04 | 4.44E+17 | 1.00E+16 | 1.00E+18 | -1.5 | 1.92E-12 | 2.26E-09 | 1.00E-07 | 5.11E-07 | 1.25E-06 | 2.26E+02 | 6.48E+05 |
| 0.08 | 0.08 | 0.08 | 0.008 | 0.02 | 0.06 | 1.99E+17 | 1.00E+16 | 1.00E+18 | -1.5 | 1.27E-12 | 1.89E-09 | 1.00E-07 | 5.50E-07 | 1.37E-06 | 2.91E+02 | 1.08E+06 |
| 0.08 | 0.08 | 0.08 | 0.008 | 0.02 | 0.06 | 6.60E+16 | 1.00E+16 | 1.00E+18 | -1.5 | 9.82E-13 | 1.67E-09 | 1.00E-07 | 5.80E-07 | 1.47E-06 | 3.48E+02 | 1.50E+06 |
| 0.08 | 0.08 | 0.08 | 0.008 | 0.02 | 0.04 | 2.37E+17 | 1.00E+16 | 1.00E+18 | -1.5 | 9.37E-13 | 3.93E-09 | 9.98E-08 | 2.98E-08 | 5.62E-07 | 7.60E+01 | 5.99E+05 |
| 0.08 | 0.08 | 0.08 | 0.008 | 0.04 | 0.04 | 1.43E+17 | 1.00E+16 | 1.00E+18 | -1.5 | 2.17E-12 | 3.06E-09 | 9.98E-08 | 4.24E-07 | 1.13E-06 | 1.38E+02 | 5.23E+05 |
| 0.08 | 0.08 | 0.08 | 0.008 | 0.04 | 0.06 | 6.05E+16 | 1.00E+16 | 1.00E+18 | -1.5 | 2.64E-12 | 2.61E-09 | 9.96E-08 | 5.10E-07 | 1.30E-06 | 1.95E+02 | 4.92E+05 |

FIG. 36

| L(um) | S(um) | W(um) | TOX(um) | TSOI(um) | TBOX(um) | NSOI(cm^-3) | PSOI(cm^-3) | PSUB(cm^-3) | VTH(V) | VSUB(V) | ITH(A) | SF(mV/dec) | ION(A) | TSOI/L | TBOX/L |
|---|---|---|---|---|---|---|---|---|---|---|---|---|---|---|---|
| 0.02 | 0.02 | 0.02 | 0.008 | 0.011 | 0.130 | 3.162E+16 | 1.00E+16 | 1.00E+18 | -0.5 | -2 | 1.09E-07 | 3.17E+02 | 3.02E-06 | 0.5500 | 6.5000 |
| 0.02 | 0.02 | 0.02 | 0.008 | 0.087 | 0.040 | 3.162E+16 | 1.00E+16 | 1.00E+18 | -0.5 | -2 | 1.01E-07 | 4.00E+02 | 2.88E-06 | 4.3500 | 2.0000 |
| 0.02 | 0.02 | 0.02 | 0.008 | 0.149 | 0.015 | 3.162E+16 | 1.00E+16 | 1.00E+18 | -0.5 | -2 | 9.91E-08 | 3.97E+02 | 2.96E-06 | 7.4500 | 0.7500 |
| 0.02 | 0.02 | 0.02 | 0.008 | 0.010 | 0.130 | 1.000E+17 | 1.00E+16 | 1.00E+18 | -0.5 | -2 | 1.09E-07 | 3.14E+02 | 2.99E-06 | 0.5000 | 6.5000 |
| 0.02 | 0.02 | 0.02 | 0.008 | 0.054 | 0.040 | 1.000E+17 | 1.00E+16 | 1.00E+18 | -0.5 | -2 | 1.02E-07 | 3.97E+02 | 2.79E-06 | 2.7000 | 2.0000 |
| 0.02 | 0.02 | 0.02 | 0.008 | 0.101 | 0.015 | 1.000E+17 | 1.00E+16 | 1.00E+18 | -0.5 | -2 | 9.77E-08 | 3.93E+02 | 2.86E-06 | 5.0500 | 0.7500 |
| 0.02 | 0.02 | 0.02 | 0.008 | 0.006 | 0.130 | 5.623E+17 | 1.00E+16 | 1.00E+18 | -0.5 | -2 | 8.70E-08 | 2.95E+02 | 2.62E-06 | 0.3000 | 6.5000 |
| 0.02 | 0.02 | 0.02 | 0.008 | 0.038 | 0.040 | 3.162E+16 | 1.00E+16 | 1.00E+18 | -0.5 | -1 | 1.02E-07 | 3.91E+02 | 2.81E-06 | 1.9000 | 2.0000 |
| 0.02 | 0.02 | 0.02 | 0.008 | 0.096 | 0.015 | 3.162E+16 | 1.00E+16 | 1.00E+18 | -0.5 | -1 | 1.01E-07 | 4.04E+02 | 2.91E-06 | 4.8000 | 0.7500 |
| 0.02 | 0.02 | 0.02 | 0.008 | 0.068 | 0.015 | 1.000E+17 | 1.00E+16 | 1.00E+18 | -0.5 | -1 | 1.01E-07 | 4.00E+02 | 2.84E-06 | 3.4000 | 0.7500 |
| 0.02 | 0.02 | 0.02 | 0.008 | 0.015 | 0.040 | 3.162E+16 | 1.00E+16 | 1.00E+18 | 0 | -2 | 1.02E-07 | 2.90E+02 | 2.06E-06 | 0.7500 | 2.0000 |
| 0.02 | 0.02 | 0.02 | 0.008 | 0.068 | 0.015 | 3.162E+16 | 1.00E+16 | 1.00E+18 | 0 | -2 | 9.79E-08 | 2.94E+02 | 2.24E-06 | 3.4000 | 0.7500 |
| 0.02 | 0.02 | 0.02 | 0.008 | 0.012 | 0.040 | 1.000E+17 | 1.00E+16 | 1.00E+18 | 0 | -2 | 9.35E-08 | 2.77E+02 | 2.00E-06 | 0.6000 | 2.0000 |
| 0.02 | 0.02 | 0.02 | 0.008 | 0.055 | 0.015 | 1.000E+17 | 1.00E+16 | 1.00E+18 | 0 | -2 | 1.04E-07 | 3.00E+02 | 2.20E-06 | 2.7500 | 0.7500 |
| 0.02 | 0.02 | 0.02 | 0.008 | 0.034 | 0.015 | 3.162E+16 | 1.00E+16 | 1.00E+18 | -0.5 | -2 | 1.01E-07 | 3.05E+02 | 2.15E-06 | 1.7000 | 0.7500 |
| 0.02 | 0.02 | 0.02 | 0.008 | 0.028 | 0.015 | 3.162E+16 | 1.00E+16 | 1.00E+18 | -0.5 | -1 | 9.87E-08 | 3.03E+02 | 2.11E-06 | 1.4000 | 0.7500 |
| 0.02 | 0.02 | 0.02 | 0.008 | 0.051 | 1.000 | 1.000E+17 | 1.00E+16 | 1.00E+18 | -0.5 | -2 | 9.78E-08 | 2.24E+02 | 2.89E-06 | 0.6375 | 12.5000 |
| 0.08 | 0.08 | 0.08 | 0.008 | 0.169 | 0.130 | 3.162E+16 | 1.00E+16 | 1.00E+18 | -0.5 | -2 | 1.09E-07 | 3.02E+02 | 3.41E-06 | 2.1125 | 1.6250 |
| 0.08 | 0.08 | 0.08 | 0.008 | 0.202 | 0.100 | 3.162E+16 | 1.00E+16 | 1.00E+18 | -0.5 | -2 | 1.07E-07 | 3.04E+02 | 3.41E-06 | 2.5250 | 1.2500 |
| 0.08 | 0.08 | 0.08 | 0.008 | 0.304 | 0.040 | 3.162E+16 | 1.00E+16 | 1.00E+18 | -0.5 | -2 | 1.08E-07 | 3.11E+02 | 3.41E-06 | 3.8000 | 0.5000 |
| 0.08 | 0.08 | 0.08 | 0.008 | 0.034 | 1.000 | 1.000E+17 | 1.00E+16 | 1.00E+18 | -0.5 | -2 | 1.00E-07 | 1.84E+02 | 3.24E-06 | 0.4250 | 12.5000 |
| 0.08 | 0.08 | 0.08 | 0.008 | 0.071 | 0.130 | 1.000E+17 | 1.00E+16 | 1.00E+18 | -0.5 | -2 | 1.09E-07 | 2.40E+02 | 2.90E-06 | 0.8875 | 1.6250 |
| 0.08 | 0.08 | 0.08 | 0.008 | 0.084 | 0.100 | 1.000E+17 | 1.00E+16 | 1.00E+18 | -0.5 | -2 | 1.09E-07 | 2.60E+02 | 2.39E-06 | 1.0500 | 1.2500 |
| 0.08 | 0.08 | 0.08 | 0.008 | 0.139 | 0.040 | 1.000E+17 | 1.00E+16 | 1.00E+18 | -0.5 | -2 | 1.09E-07 | 2.76E+02 | 2.45E-06 | 1.7375 | 0.5000 |
| 0.08 | 0.08 | 0.08 | 0.008 | 0.014 | 1.000 | 5.623E+17 | 1.00E+16 | 1.00E+18 | -0.5 | -2 | 9.76E-08 | 1.50E+02 | 3.14E-06 | 0.1750 | 12.5000 |
| 0.08 | 0.08 | 0.08 | 0.008 | 0.023 | 0.130 | 5.623E+17 | 1.00E+16 | 1.00E+18 | -0.5 | -2 | 1.35E-07 | 1.90E+02 | 2.74E-06 | 0.2875 | 1.6250 |
| 0.08 | 0.08 | 0.08 | 0.008 | 0.025 | 0.100 | 5.623E+17 | 1.00E+16 | 1.00E+18 | -0.5 | -2 | 9.85E-08 | 1.70E+02 | 2.93E-06 | 0.3125 | 1.2500 |
| 0.08 | 0.08 | 0.08 | 0.008 | 0.041 | 0.040 | 5.623E+17 | 1.00E+16 | 1.00E+18 | -0.5 | -2 | 1.02E-07 | 2.02E+02 | 2.39E-06 | 0.5125 | 0.5000 |
| 0.08 | 0.08 | 0.08 | 0.008 | 0.044 | 1.000 | 1.000E+17 | 1.00E+16 | 1.00E+18 | 0 | -2 | 9.12E-08 | 1.99E+02 | 3.32E-06 | 0.5500 | 12.5000 |
| 0.08 | 0.08 | 0.08 | 0.008 | 0.031 | 1.000 | 1.000E+17 | 1.00E+16 | 1.00E+18 | -0.5 | 0 | 9.72E-08 | 1.78E+02 | 3.11E-06 | 0.3875 | 12.5000 |
| 0.08 | 0.08 | 0.08 | 0.008 | 0.013 | 1.000 | 1.000E+17 | 1.00E+16 | 1.00E+18 | -0.5 | 0 | 8.78E-08 | 1.44E+02 | 3.22E-06 | 0.1625 | 12.5000 |
| 0.08 | 0.08 | 0.08 | 0.008 | 0.005 | 1.000 | 5.623E+17 | 1.00E+16 | 1.00E+18 | -0.5 | 0 | 9.01E-08 | 1.30E+02 | 2.46E-06 | 0.0625 | 12.5000 |
| 0.08 | 0.08 | 0.08 | 0.008 | 0.028 | 0.130 | 5.623E+17 | 1.00E+16 | 1.00E+18 | -0.5 | 0 | 9.31E-08 | 1.70E+02 | 1.70E-06 | 0.3500 | 1.6250 |
| 0.08 | 0.08 | 0.08 | 0.008 | 0.118 | 0.040 | 3.162E+16 | 1.00E+16 | 1.00E+18 | -0.5 | -2 | 9.93E-08 | 1.73E+02 | 1.81E-06 | 1.4750 | 0.5000 |
| 0.08 | 0.08 | 0.08 | 0.008 | 0.015 | 0.100 | 1.000E+17 | 1.00E+16 | 1.00E+18 | 0 | -0.5 | 1.02E-07 | 1.54E+02 | 2.05E-06 | 0.1875 | 1.2500 |
| 0.08 | 0.08 | 0.08 | 0.008 | 0.067 | 0.100 | 1.000E+17 | 1.00E+16 | 1.00E+18 | 0 | -0.5 | 1.02E-07 | 1.84E+02 | 1.31E-06 | 0.8375 | 1.2500 |
| 0.08 | 0.08 | 0.08 | 0.008 | 0.005 | 0.100 | 5.623E+17 | 1.00E+16 | 1.00E+18 | 0 | -0.5 | 9.34E-08 | 1.50E+02 | 1.96E-06 | 0.0625 | 1.2500 |
| 0.08 | 0.08 | 0.08 | 0.008 | 0.021 | 0.040 | 5.623E+17 | 1.00E+16 | 1.00E+18 | 0 | -0.5 | 9.85E-08 | 1.73E+02 | 1.48E-06 | 0.2625 | 0.5000 |
| 0.08 | 0.08 | 0.08 | 0.008 | 0.020 | 0.040 | 3.162E+16 | 1.00E+16 | 1.00E+18 | 0.5 | -0.5 | 8.43E-08 | 3.46E+02 | 5.39E-07 | 0.2500 | 0.5000 |
| 0.08 | 0.08 | 0.08 | 0.008 | 0.014 | 0.040 | 1.000E+17 | 1.00E+16 | 1.00E+18 | 0.5 | -0.5 | 1.03E-07 | 3.50E+02 | 4.90E-07 | 0.1750 | 0.5000 |
| 0.08 | 0.08 | 0.08 | 0.008 | 0.006 | 0.040 | 5.623E+17 | 1.00E+16 | 1.00E+18 | 0.5 | -0.5 | 8.94E-08 | 4.12E+02 | 5.16E-07 | 0.0750 | 0.5000 |

US 7,459,748 B2

SEMICONDUCTOR MEMORY DEVICE

CROSS-REFERENCE TO RELATED APPLICATION

This application is based on and claims the benefit of priority from the prior Japanese Patent Applications No. 2005-301906, filed on Oct. 17, 2005 and No. 2006-160500, filed on Jun. 9, 2006, the entire contents of which are incorporated herein by reference.

BACKGROUND OF THE INVENTION

1. Field of the Invention

This invention relates to a semiconductor memory device with electrically rewritable and non-volatile memory cells, and more particularly relates to an EEPROM (Electrically Erasable and Programmable ROMs) with NAND cell units formed on a partial SOI substrate.

2. Description of the Related Art

A NAND-type flash memory is known as one of EEPROMs. The NAND-type flash memory has a unit cell area smaller than that of a NOR-type flash memory, and is easy to make the capacity large because a plurality of electrically rewritable and non-volatile memory cells are connected in series to constitute a NAND cell unit.

Since the NAND-type flash memory uses FN tunneling current for writing data, the consumption current is smaller than that of the NOR-type flash memory, which uses hot carrier injection. Therefore, a page capacity being defined by a cell area, in which data write is performed at a time, it is possible to make the page capacity large, thereby being possible to write data at a substantially high rate.

To make the cell size of the NAND-type flash memory further smaller than that of the currently used cells, it is in need of making the device insulating area small. However, it leads to reduction of the breakdown voltage between cells. To achieve the miniaturization of cells without reducing the breakdown voltage, it is effective to use such a technology that forms the NAND cell unit array on an SOI (Silicon On Insulator) substrate. Such a technology has already been provided (e.g., refer to Unexamined Japanese Patent Application Publication No. 2000-174241).

SUMMARY OF THE INVENTION

According to an aspect of the present invention, there is provided a semiconductor memory device including:
a semiconductor substrate;
a semiconductor layer formed on the semiconductor substrate with an insulating film interposed therebetween, the semiconductor layer being in contact with the semiconductor substrate via an opening formed in the insulating film; and
a NAND cell unit formed on the semiconductor layer with a plurality of electrically rewritable and non-volatile memory cells connected in series and first and second select gate transistors disposed at both ends thereof.

According to another aspect of the present invention, there is provided a semiconductor memory device including:
a semiconductor substrate;
a semiconductor layer formed on the semiconductor substrate with an insulating film interposed therebetween; and
a NAND cell unit formed on the semiconductor layer with a plurality of electrically rewritable and non-volatile memory cells connected in series, wherein
openings are formed in the insulating film at locations corresponding to source/drain regions of the memory cells, and the semiconductor layer is in contact with the semiconductor substrate via the openings.

According to still another aspect of the present invention, there is provided a method of fabricating a semiconductor memory device including:
forming an insulating film on a semiconductor substrate;
forming openings in the insulating film;
depositing an amorphous or polycrystalline semiconductor layer on the insulating film, the semiconductor layer being in contact with the semiconductor substrate via the openings formed in the insulating film;
annealing the semiconductor layer to crystallize it; and
forming a NAND cell unit on the semiconductor layer, the NAND cell unit including a plurality of electrically rewritable and non-volatile memory cells connected in series and first and second select gate transistors disposed at both ends thereof.

BRIEF DESCRIPTION OF THE DRAWINGS

FIG. 29A shows a simulation condition of an erase operation in case where the openings are formed under the select gate lines SG.

FIG. 29B shows a simulation condition of an erase operation in case where the openings are formed under the source line/bit line contacts CB.

FIG. 33 shows ratios of ON/OFF currents of read cell in case of the cell array structure.

FIG. 35 shows ratios of ON/OFF currents of read cell in case of the cell array structure.

FIG. 36 shows such a calculated device condition as to obtain the drain current ITH=1 µA.

DETAILED DESCRIPTION OF THE EMBODIMENTS

Illustrative embodiments of this invention will be explained with reference to the accompanying drawings below.

Figure 1:
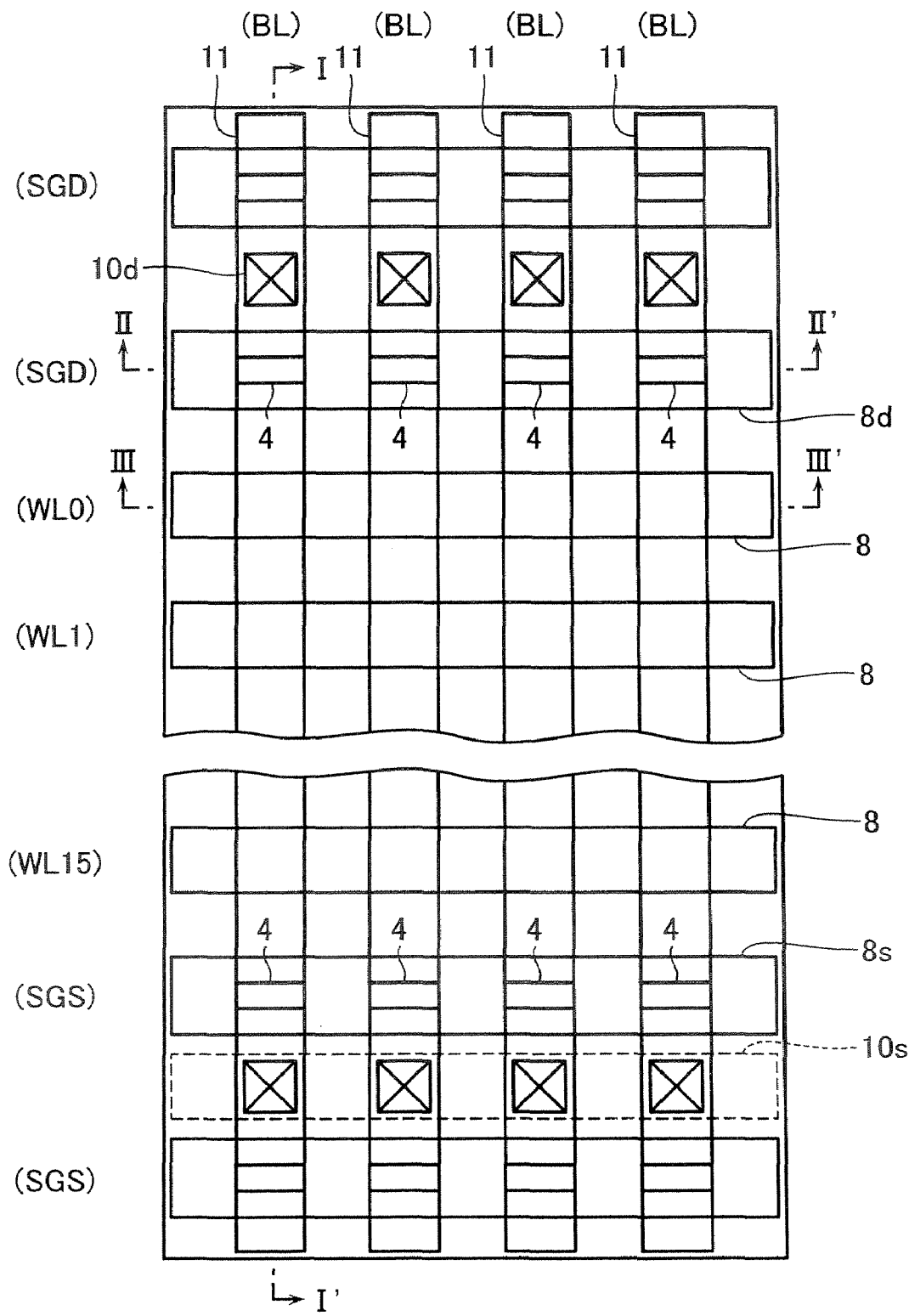
FIG. 1 shows plan view of a memory cell array of a NAND-type-flash memory in accordance with an embodiment of the present invention.
Figure 2:
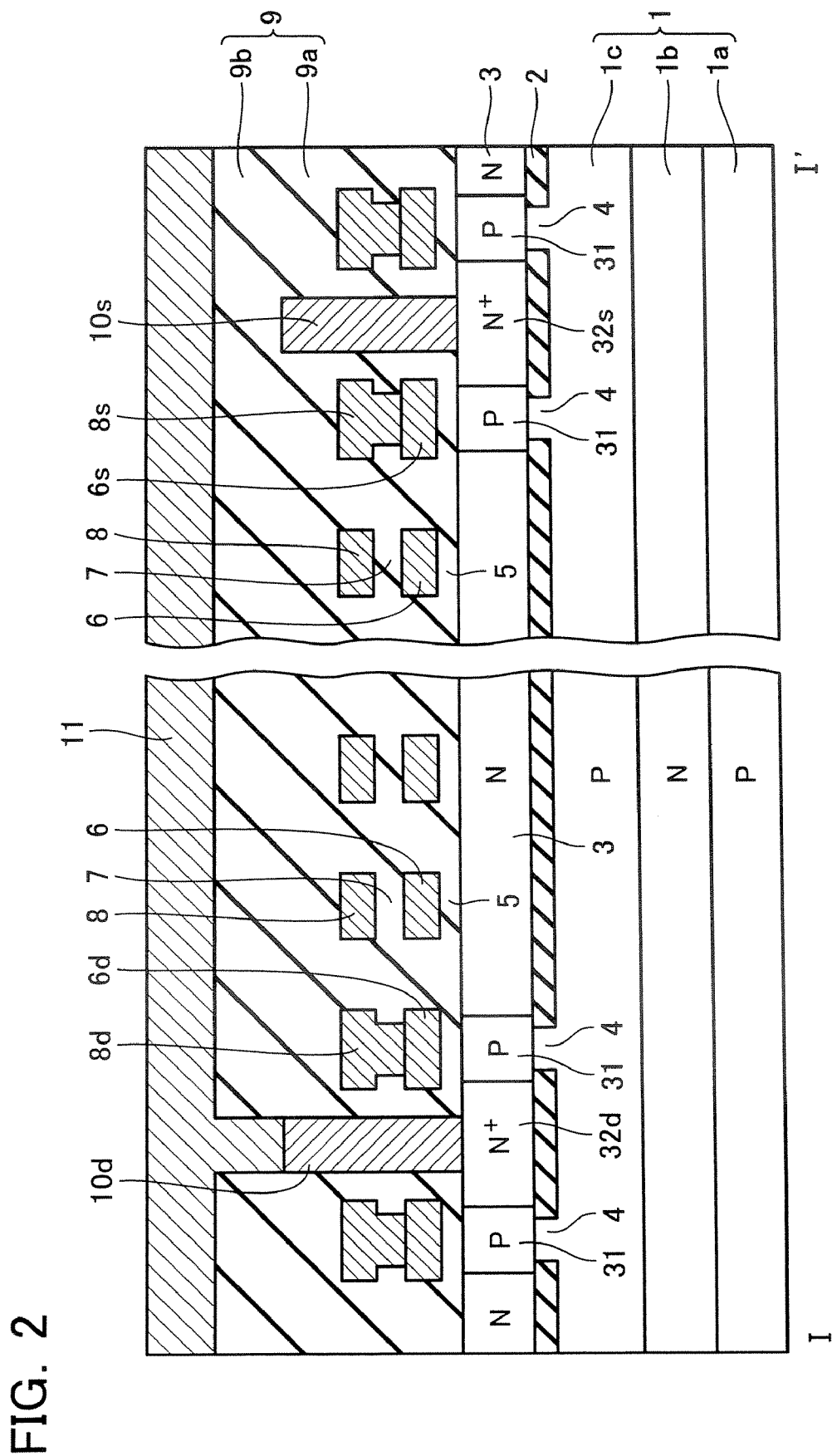
FIG. 2 shows a sectional view of the memory cell array taken along line I-I' in FIG. 1.
Figure 3:
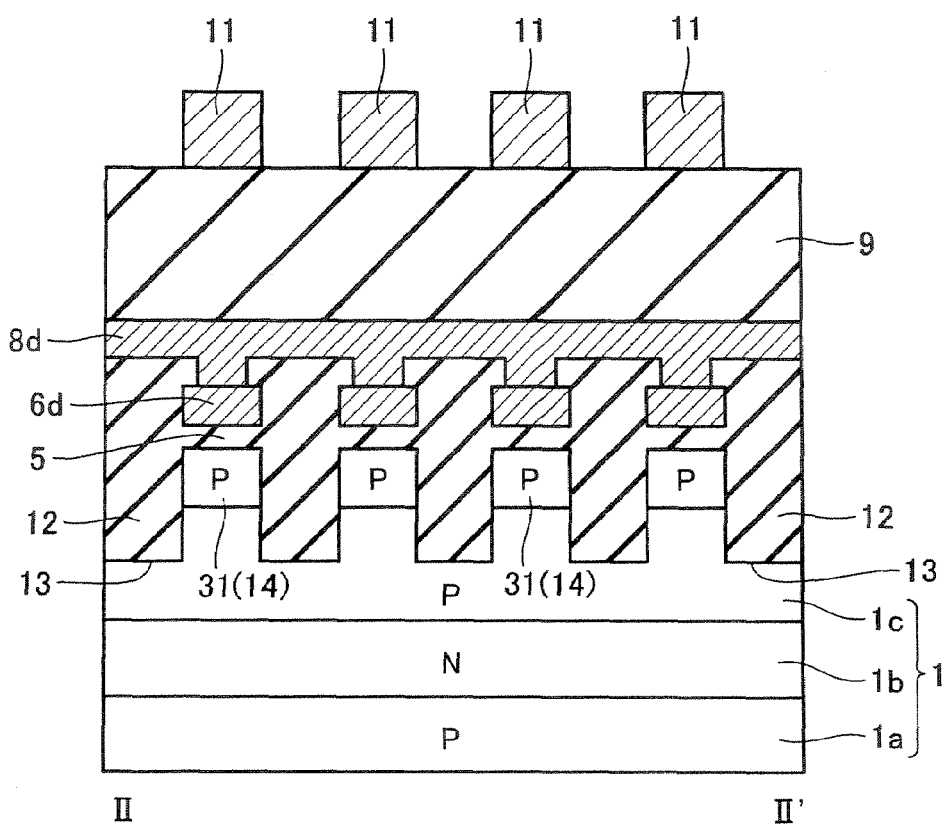
FIG. 3 shows a sectional view of the memory cell array taken along line II-II' in FIG. 1.
Figure 4:
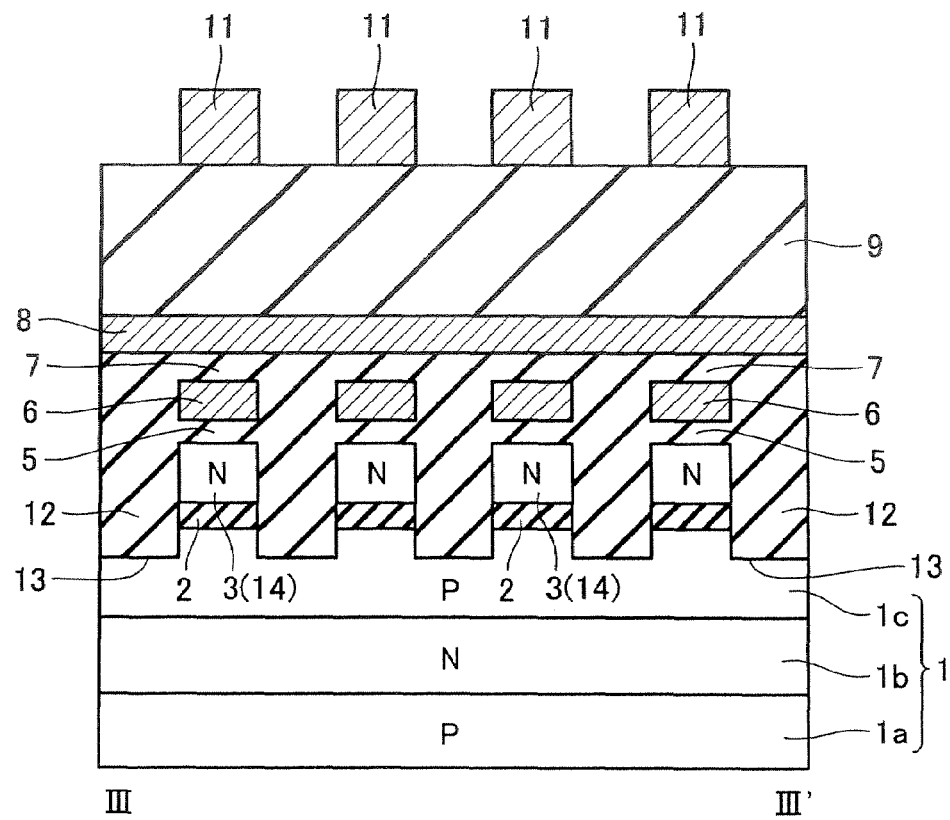
FIG. 4 shows a sectional view of the memory cell array taken along line III-III' in FIG. 1.

FIG. 1 is a plan view of a memory cell array of a NAND-type flash memory; FIG. 2 is its sectional view taken along a bit line (BL) (i.e., I-I' sectional view of FIG. 1); FIG. 3 is its sectional view taken along a select gate line (SGD) (i.e., II-II' sectional view of FIG. 1); and FIG. 4 is its sectional view taken along a word line (WL) (i.e., III-III' sectional view of FIG. 1).

The device body is an SOI (Silicon On Insulator) substrate, which has a single-crystalline silicon substrate 1 and a silicon layer 3 formed thereon. The silicon layer 3 is insulated from the substrate 1 with an insulating film, for example, a silicon oxide film 2, interposed between the substrate 1 and the silicon layer 3. The silicon layer 3 is not perfectly insulated from the substrate 1, but is in contact with the substrate 1 via openings (or holes) 4 formed in the oxide film 2. Including this meaning, the SOI substrate in accordance with this embodiment will be referred to as a "partial SOI substrate" hereinafter.

The silicon substrate 1 has such a well structure in the memory cell array area that an n-type of well 1b is formed on a p-type of silicon substrate 1a; and a p-type of well 1c on the n-type of well 1b.

The silicon layer 3 is a crystallized or re-crystallized one in such a way that an n-type polycrystalline or amorphous silicon layer is deposited on the oxide film 2 and then subjected to crystallizing anneal. In this crystallizing anneal process, crystallization is progressed with such a solid-phase epitaxial growth that the substrate area exposed at the opening 4 serves as a seed crystal.

The thickness of the silicon layer 3 is, for example, 1 nm or more and 3 L or less, where L is the gate length of the memory cell. The thickness of the oxide film 2 is, for example, 1 nm or more and 4 L or less. Alternatively, there is a possibility that the total thickness of the silicon layer 3 and oxide film 2 is set to be about the gate length L.

Silicon layer 3, on which p-type diffusion layers 31 are partially formed, is divided into stripe-shaped device formation areas 14 which are separated from each other with a device-isolating insulator film 12 as shown in FIGS. 3 and 4. Floating gates 6 are formed above the silicon layer 3 with tunnel insulating film 5 interposed therebetween, and control gates 8 are formed above the floating gates 6 with inter-gate insulating film 7 interposed therebetween.

Floating gates 6 are formed in the respective memory cells to be separated from each other; and control gates 8 are formed to be continued in one direction, thereby constituting word lines WL (WL0-WL15), each of which is a common one for multiple memory cells. Although, in this embodiment, the floating gate is formed of a polysilicon film, it may be formed as an insulating charge storage layer.

Figure 5:
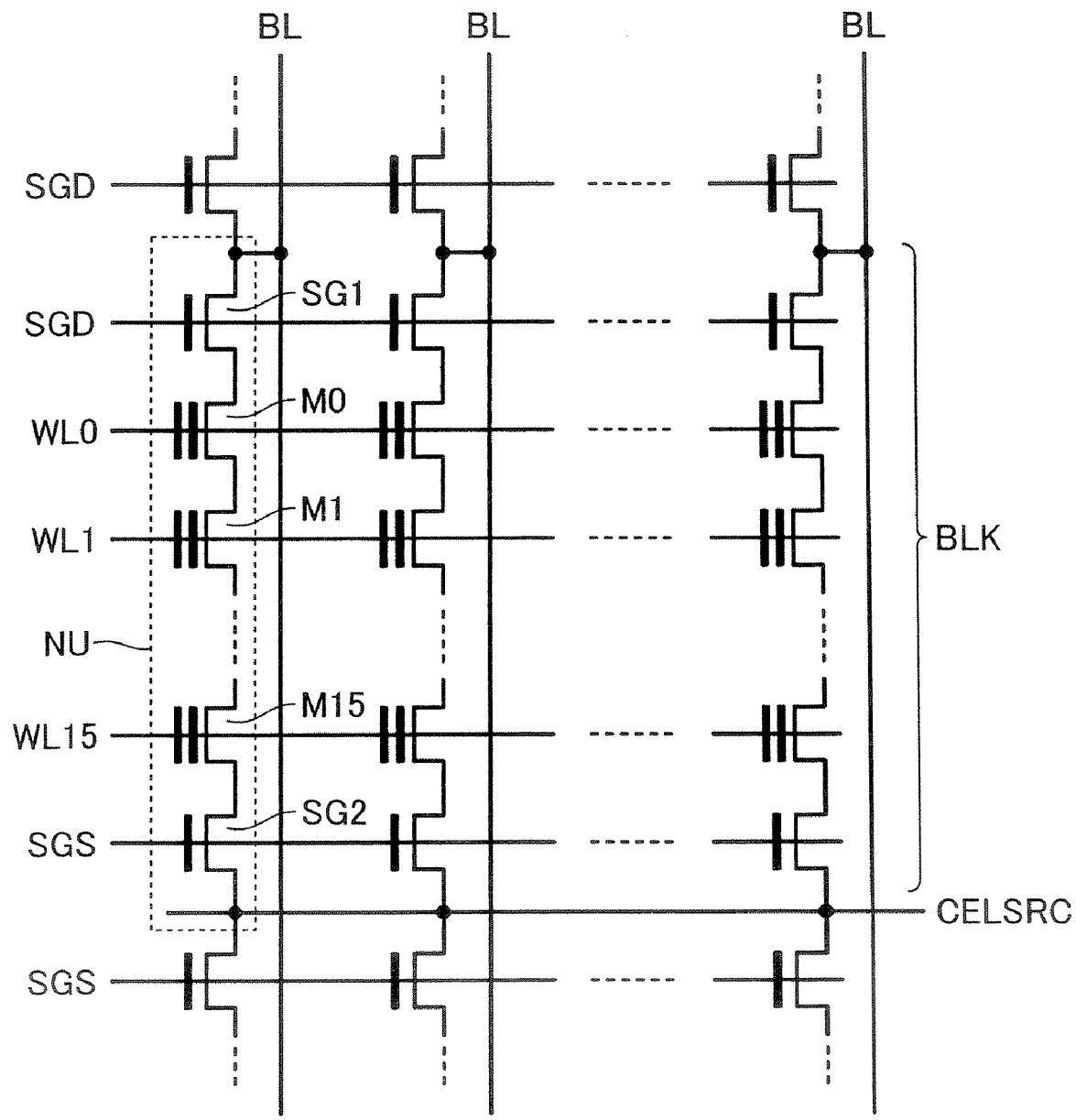
FIG. 5 shows an equivalent circuit of the memory cell array.

FIG. 5 shows an equivalent circuit of the memory cell array. Select gate transistors SG1 and SG2 are disposed at both ends of the serially connected memory cells M0-M15 to constitute a NAND cell unit. Gates of these select gate transistors SG1 and SG2 are formed of the same polysilicon films 6d, 8d and 6s, 8s as floating gate 6 and control gate 8, which are stacked and in contact with each other, thereby constituting select gate lines SGD and SGS disposed in parallel with word lines WL.

The memory cell array is covered with an interlayer insulating film 9, on which bit lines (BL) 11 are formed. Within the interlayer insulating film 9, a common source line (CELSRC) 10s is buried to connect sources of the NAND cell units in common, i.e., in contact with the common source region ($n^+$-diffusion layer) 32s of the select gate transistors SG2, and bit line contact plug 10d is formed and buried with the same conductive material film as the common source line. The bit line 11 is connected to the common drain region ($n^+$-diffusion layer) 32d of the select gate transistors SG1 via the contact plug 10d.

The silicon layer 3 is n-type one, and this n-type silicon layer 3 is used as channel bodies and source/drain regions of multiple memory cells constituting a NAND cell unit as it is without forming source and drain diffusion layers, and adjacent two memory cells have a common source/drain region. Therefore, the memory cell is formed as a depletion(D)-type of n-channel transistor as formed.

In this embodiment, the select gate transistor areas disposed at both ends of the NAND cell unit are located above the openings 4, which serve as seeds for epitaxial growth of the silicon layer 3. p-type layers 31 are formed on these areas so that the select gate transistors SG1 and SG2 are formed as enhancement(E)-type of n-channel transistors, which are cut off with 0[volts] gate voltage. $N^+$-type diffusion layers are formed under the bit line contact plug 10d and source line 10s (i.e., the drain region of select gate transistor SG1 and the source region of select gate transistor SG2) for making these contacts good.

Figure 6:
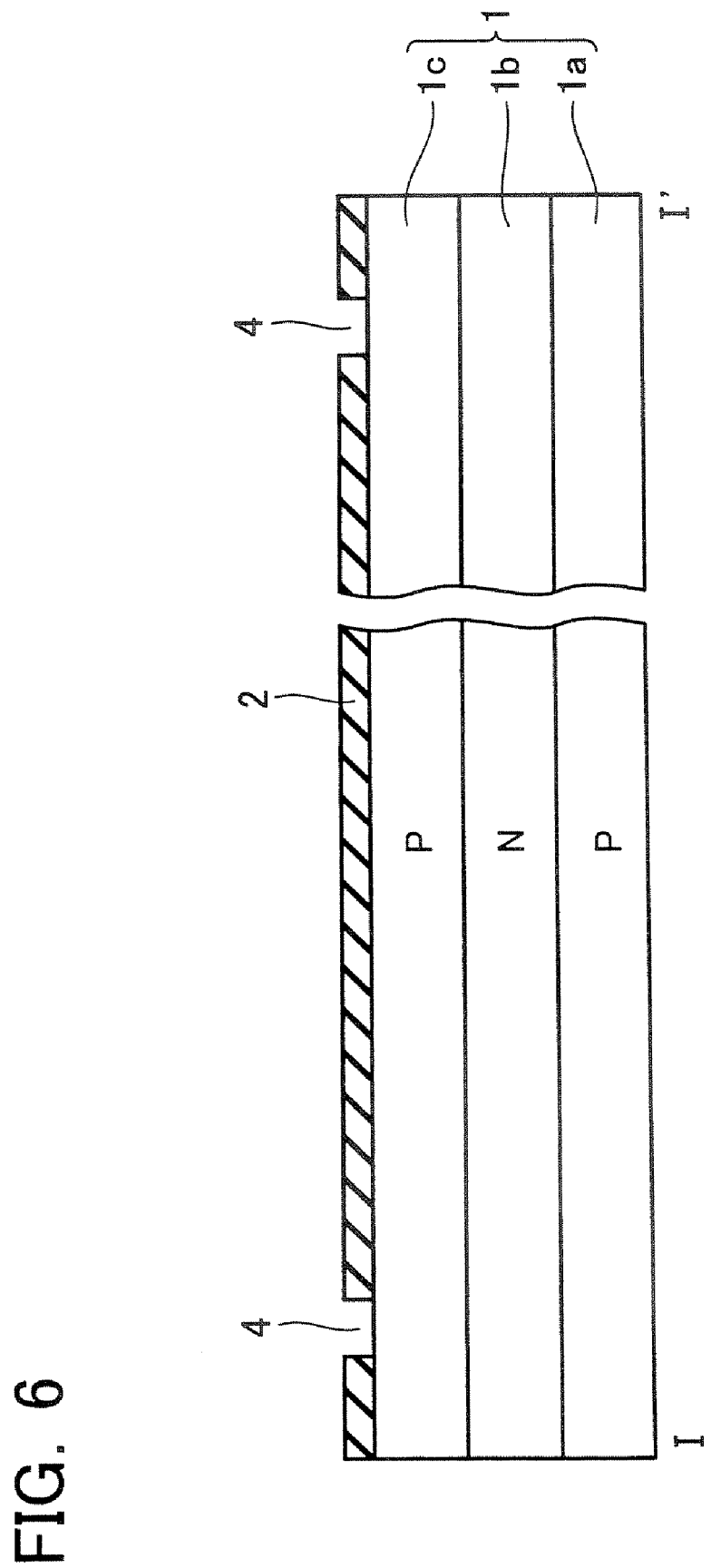
FIG. 6 is I-I' sectional view showing a wafer process for forming the partial SOI substrate in accordance with this embodiment.

Next, the fabrication process of the flash memory in accordance with this embodiment will be explained with reference to FIGS. 6 to 17. FIGS. 6 to 9 show the fabricating steps with I-I' sectional views of FIG. 1. As shown in FIG. 6, silicon oxide film 2 is formed on the silicon substrate 1, and openings 4 are formed at the select gate transistor areas in the oxide film 2. The openings 4 are stripe-shaped as being continued in the direction perpendicular to the sheet face of FIG. 6.

Figure 7:
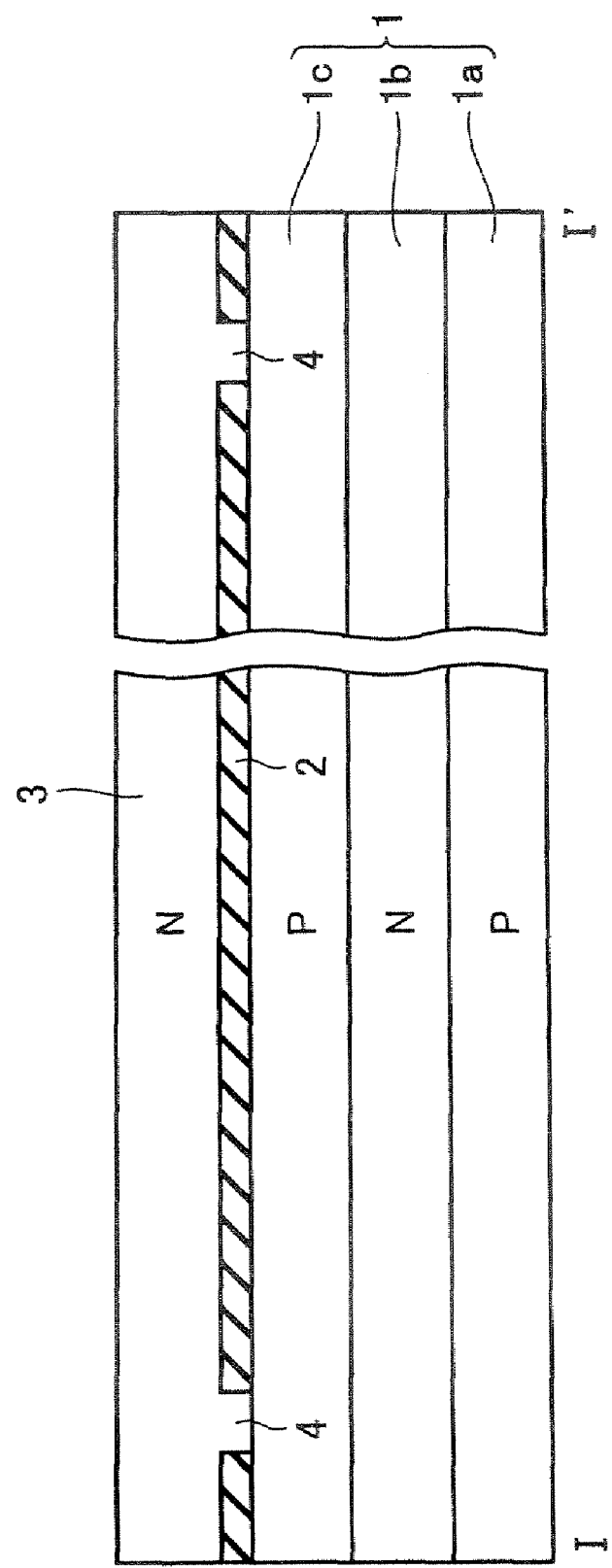
FIG. 7 is I-I' sectional view showing the fabrication process of the partial SOI substrate.

Following it, as shown in FIG. 7, n-type silicon layer 3 is formed on the oxide film 2. Explaining in detail, a polycrystalline silicon layer or an amorphous silicon layer is deposited, and it will be subjected to a crystallizing anneal process. As a result, solid-phase epitaxial growth is progressed from the substrate crystalline portion exposed at the opening 4 used as a seed, and a good crystalline silicon layer 3 is obtained. After this crystallizing anneal, it may be performed a planarization process for planarizing the silicon layer surface.

Figure 8:
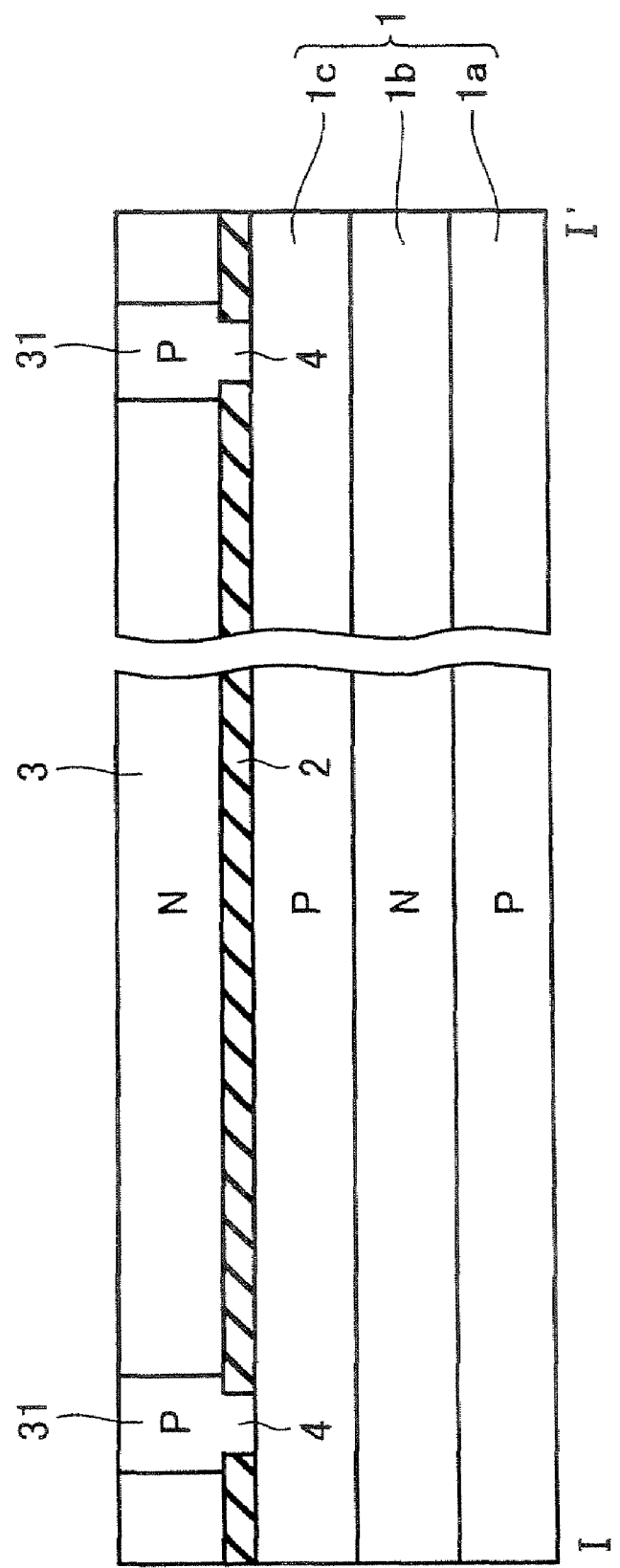
FIG. 8 is I-I' sectional view showing the process of forming the p-type diffusion layer in the select gate transistor area.

Next, as shown in FIG. 8, p-type diffusion layers 31 are formed by ion implantation at the portions of the openings 4 where select gate transistors are to be formed later.

Figure 9:
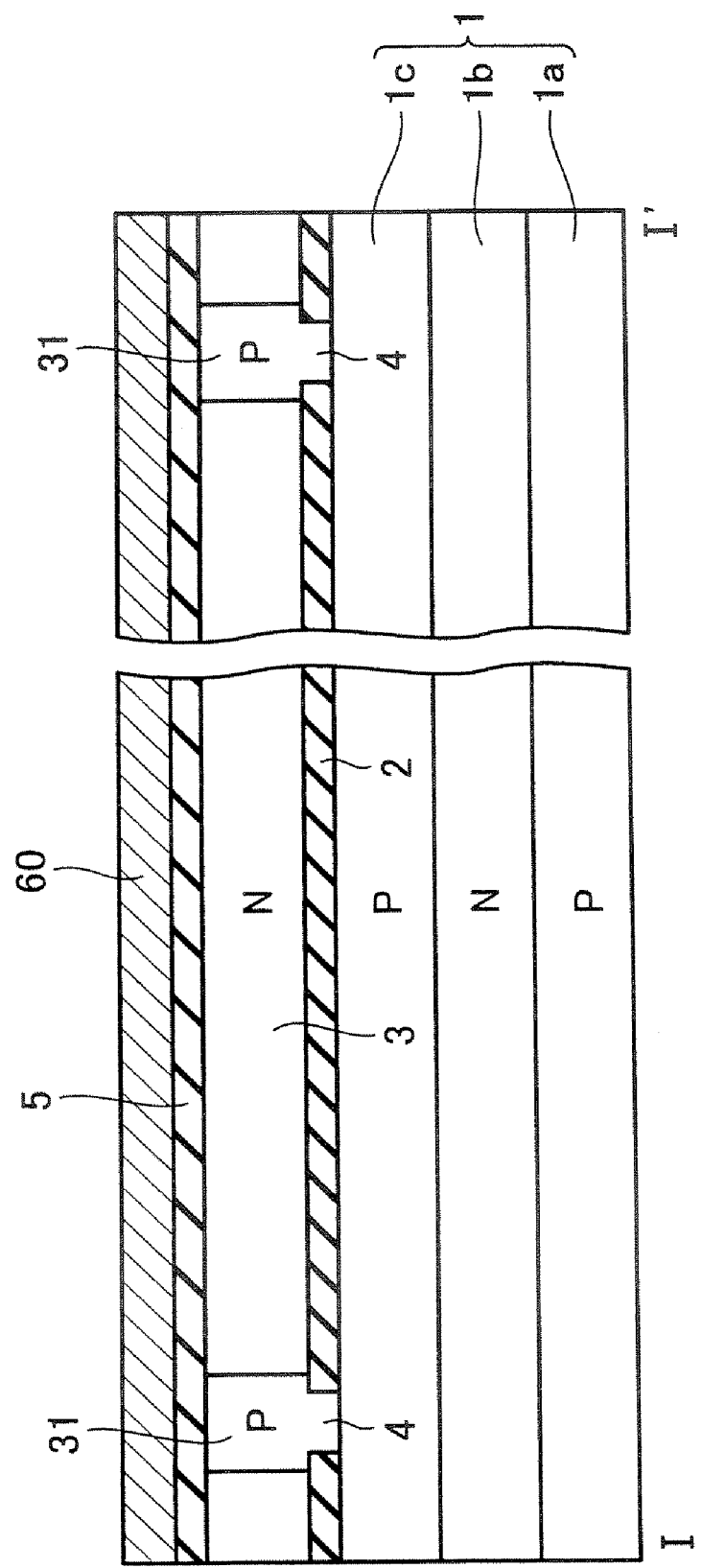
FIG. 9 is I-I' sectional view showing the process of forming a first gate material film.
Figure 10:
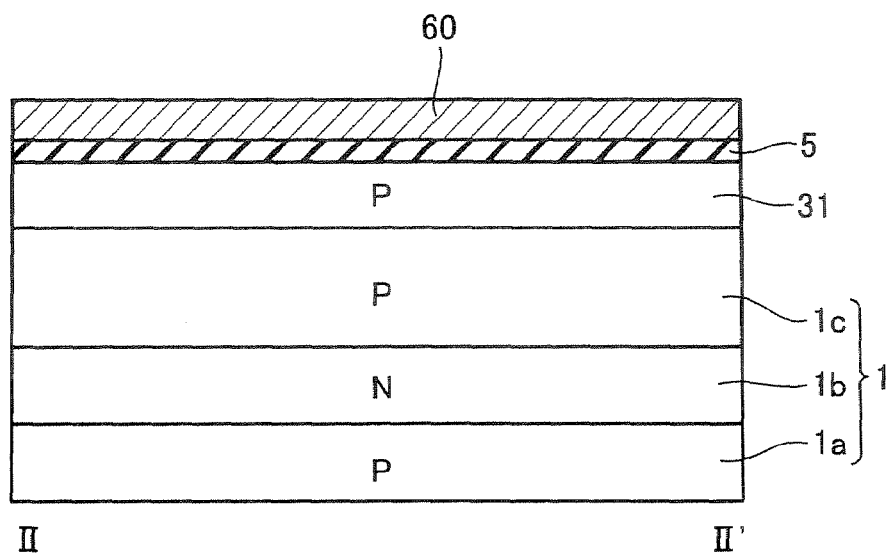
FIG. 10 is II-II' sectional view showing the process of forming the first gate material film.
Figure 11:
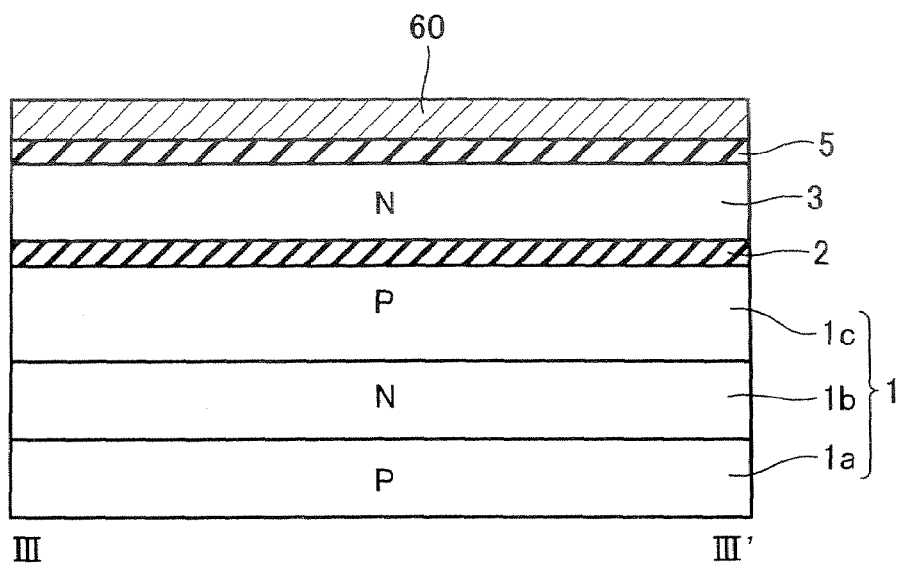
FIG. 11 is III-III' sectional view showing the process of forming the first gate material film.

As shown in FIG. 9, a tunnel oxide film 5 is formed on the silicon layer 3 and then a first polysilicon layer 60 is deposited thereon for forming floating gates. FIGS. 10 and 11 show this state in the II-II' and III-III' sectional views of FIG. 1.

Figure 12:
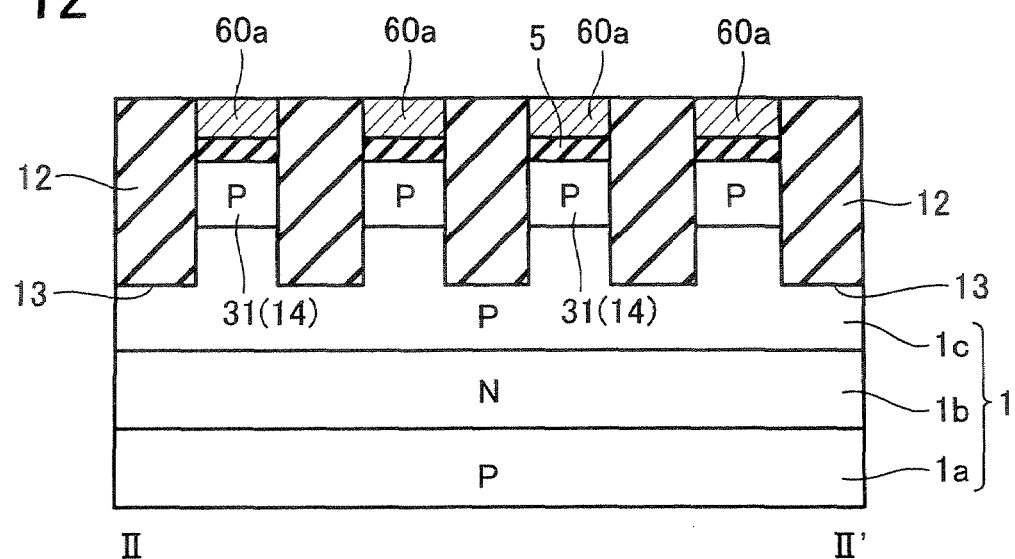
FIG. 12 is II-II' sectional view showing the device isolation process.
Figure 13:
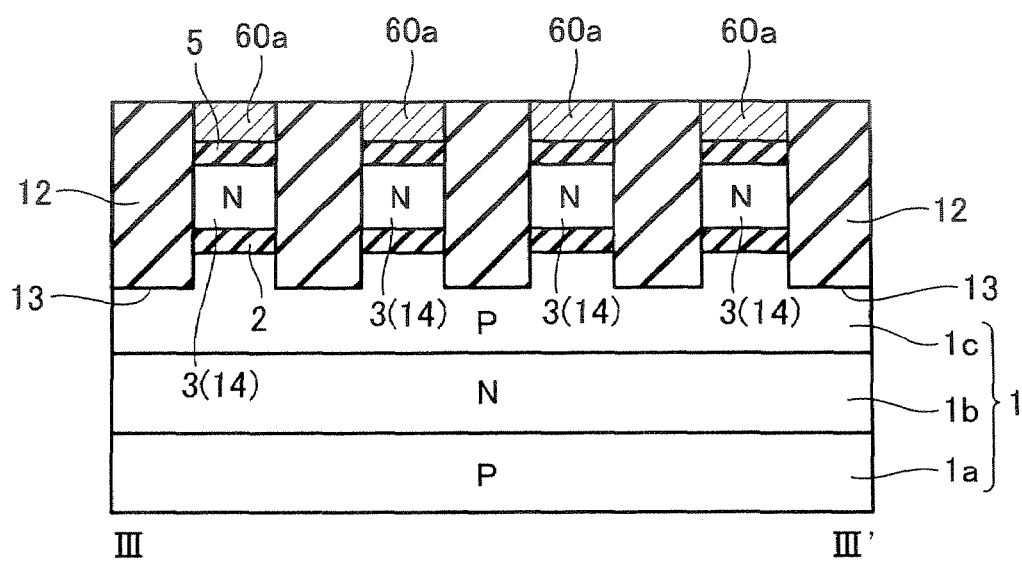
FIG. 13 is III-III' sectional view showing the device isolation process.

Next, as shown in FIGS. 12 and 13 (sectional views corresponding to FIGS. 10 and 11, respectively), a device isolation trench 13 is formed by RIE (Reactive Ion Etching) with such a depth that reaches at least the oxide film 2 from the polysilicon layer 60 (in practice, reaches the p-type well 1c), and device isolation film 12 is buried in the trench 13.

As a result of this device isolation process, n-type silicon layer 3 is patterned to have plural stripe-shaped device formation areas 14, which are isolated from each other in the word line direction and elongated in the bit line direction. At this time, the floating gate-use polysilicon film 60 is patterned to plural stripe-shaped polysilicon films 60a each with the same pattern as the device formation area 14.

Figure 14:
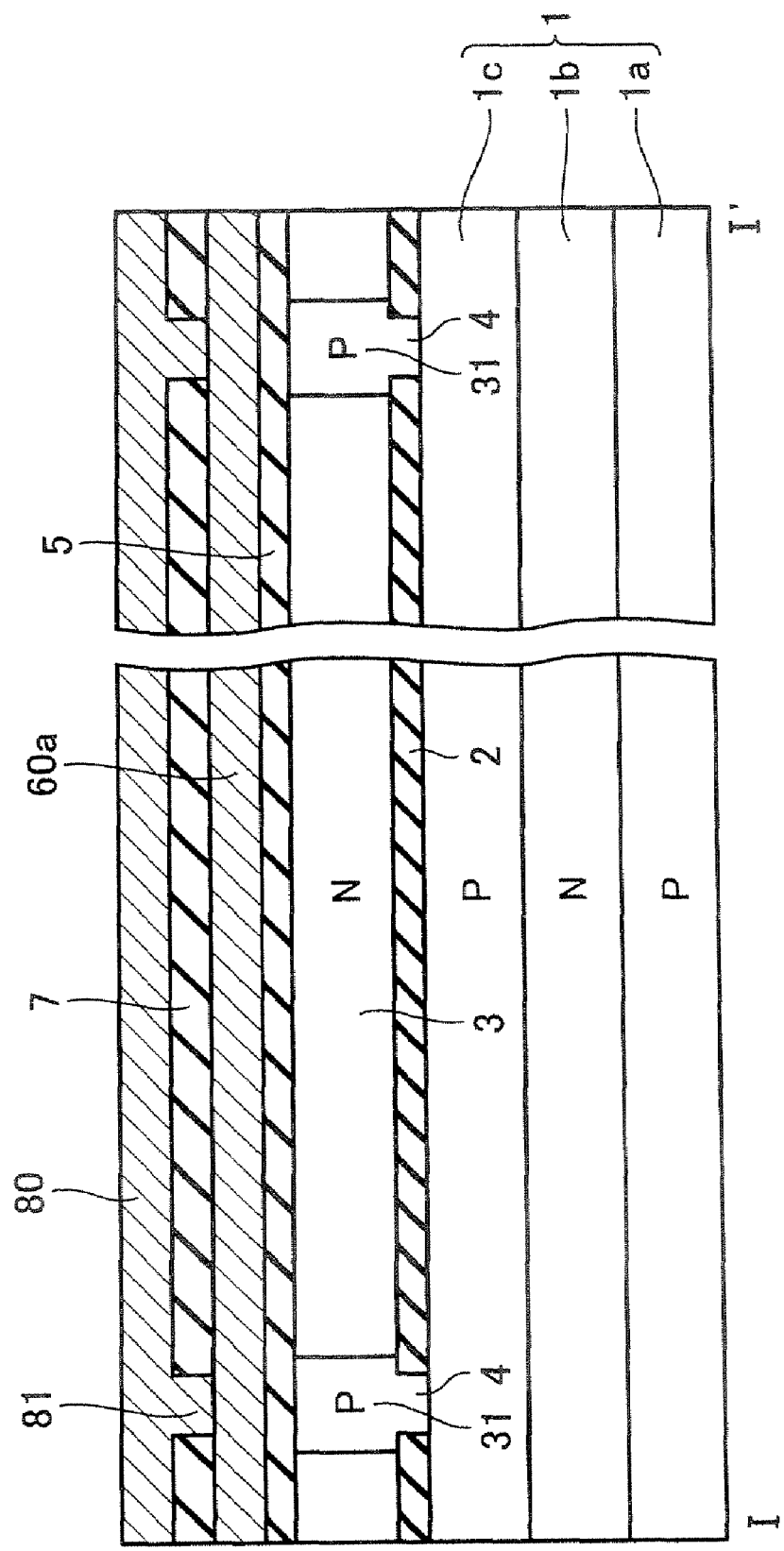
FIG. 14 is I-I' sectional view showing the process of forming a second gate material film.
Figure 15:
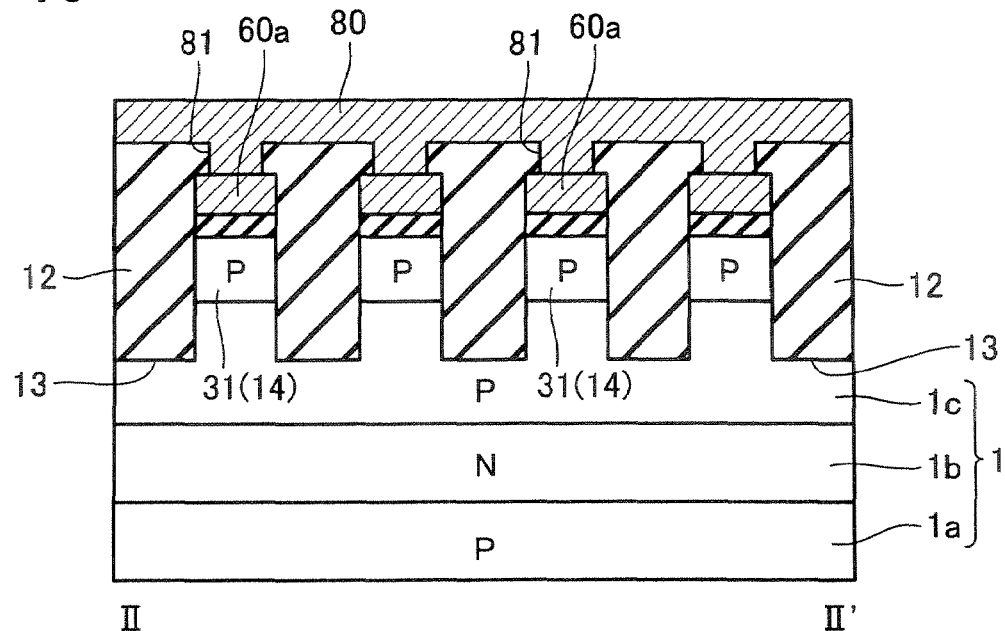
FIG. 15 is II-II' sectional view showing the process of forming the second gate material film.
Figure 16:
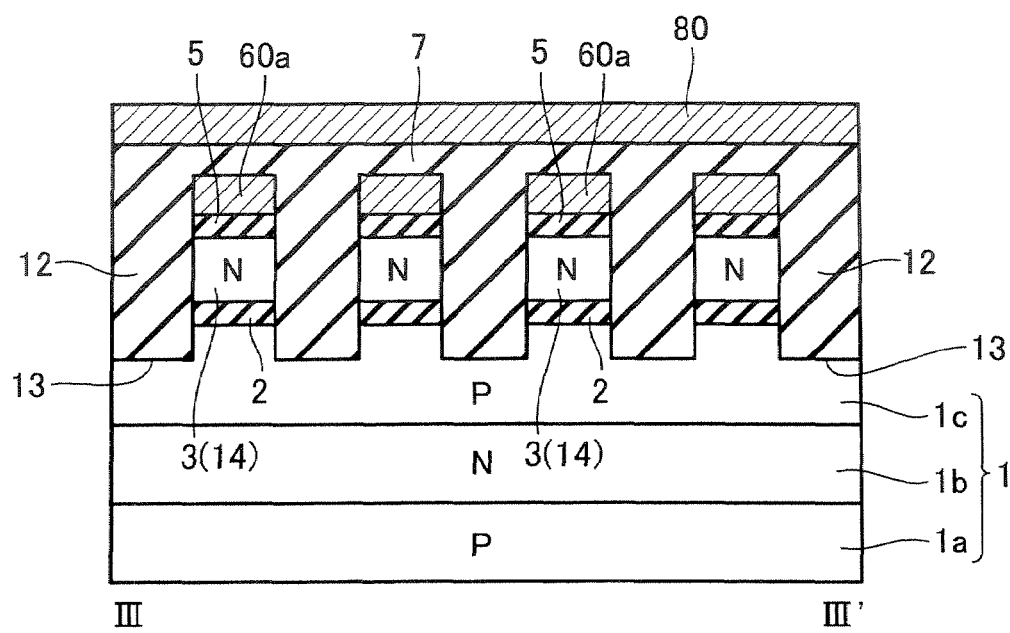
FIG. 16 is III-III' sectional view showing the process of forming the second gate material film.

Following it, as shown in FIGS. 14 to 16, after forming inter-gate insulating film 7, second polysilicon film 80 is deposited for forming control gates. At this time, as shown in FIGS. 14 and 15, hole 81 is formed in the inter-gate insulating film 7 above the cell area on the select gate line, and the second polysilicon film 80 is contacted with the first polysilicon film 60 via the hole 81.

Figure 17:
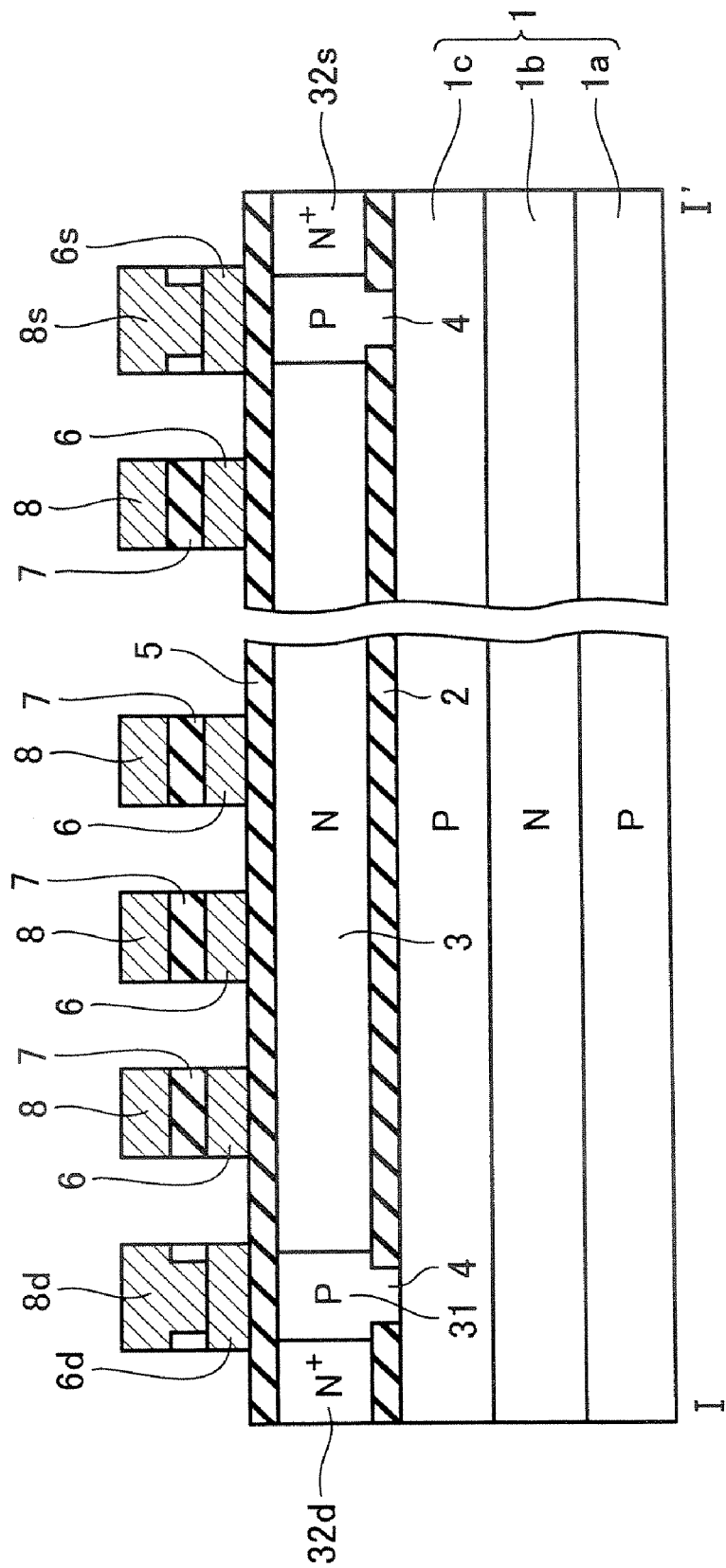
FIG. 17 is I-I' sectional view showing the process of patterning the word lines and select gate lines.

Then, as shown in FIG. 17, the second and first polysilicon films 80 and 60 are etched by RIE, so that word line 8, and select gate lines 8d and 8s are patterned. As a result, the first polysilicon film 60 is remained as floating gates 6 and the select gate portions 8d and 8s only at the cell areas and transistor areas. Next, ion implantation is performed to form $n^+$-type layer 32 at source line contact and bit line contact portions.

Then, as shown in FIGS. 2 to 4, first interlayer insulating film 9a is deposited, in which contact holes are formed, and common source line 10s and bit line contact plug 10d are buried in these contact holes. Following it, second interlayer insulating film 9b is deposited, in which bit line contact holes are formed, and then bit lines 11 are formed.

As apparent from the above-described fabrication process, to position the openings 4 formed in the oxide film 2 just under the select gate lines SGD, SGS, it is in need of aligning the p-type layer 31, word lines WL and select gate lines SGD, SGS in relation with the openings 4 because these are not self-aligned.

Figure 18:
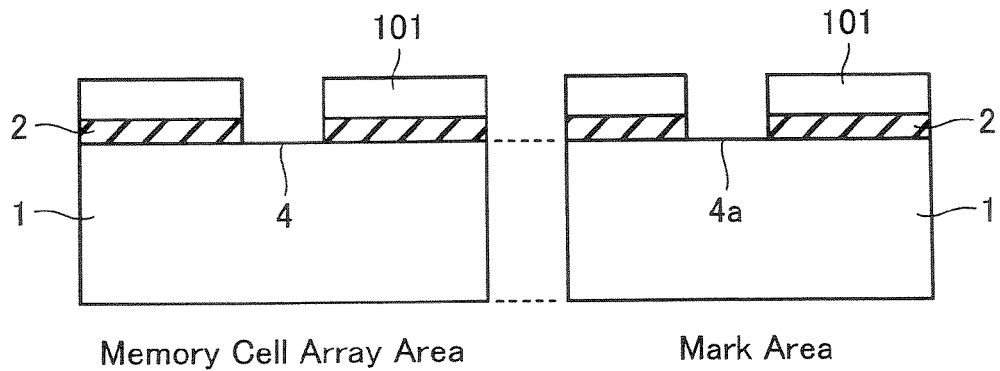
FIG. 18 shows an oxide film etching process for forming an alignment mark.

An alignment mark fabricating process will be explained with reference to FIGS. 18 to 20. FIG. 18 shows a process for forming the opening 4 in the oxide film 2 with a mask material film 101 on the cell array area. At this process time, a mark-use opening 4a is formed in the oxide film 2 at a certain mark area on the wafer peripheral area.

Figure 19:
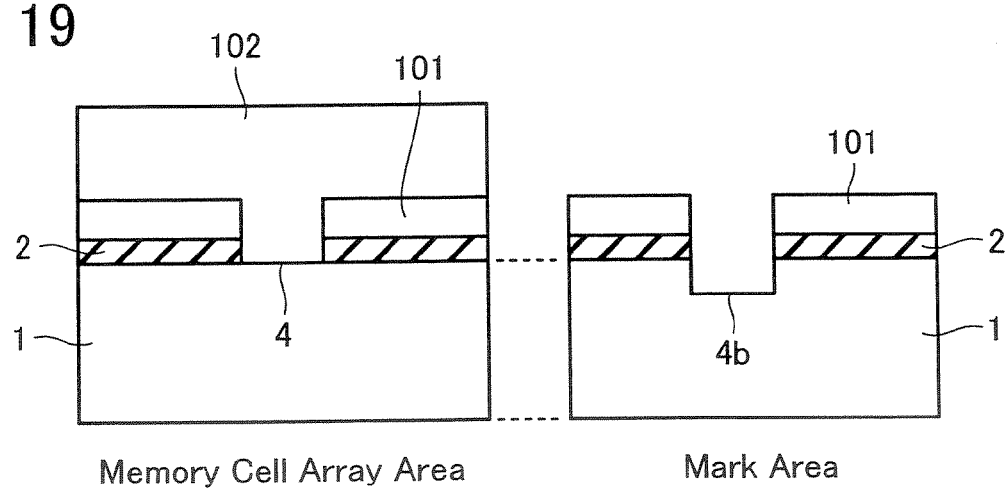
FIG. 19 shows a silicon etching process for forming the alignment mark.
Figure 20:
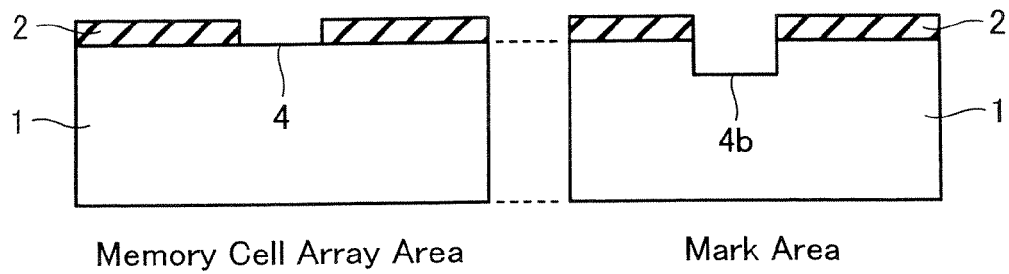
FIG. 20 shows the completion state of the alignment mark.

Then, as shown in FIG. 19, the memory cell array area is covered with resist 102, and the silicon substrate is etched via the mark-use opening 4a. As a result, mark-use trench 4b is formed on the substrate. Following it, the resist 102 and mask material film 101 are removed.

Forming the mark-use trench 4b on the peripheral area as described above, mask alignments in the future processes will be made possible.

The operations of the flash memory in accordance with this embodiment will be explained below. As described above, each of as formed memory cells is in a depletion (D)-type state (i.e., erase state), and data write in the narrow sense is defined by: injecting electrons into the floating gate and making the memory cell enhancement (E)-type with a positive threshold voltage. This memory state with the positive threshold state is dealt with, for example, a "0" data state.

Data erase is defined by: discharging electrons in the floating gate, thereby setting the memory cell to be in the erased state (D-type state). The erased state is dealt with a "1" data state. With these states, binary data may be stored. Controlling the cell threshold distributions to have multiple write threshold states, multi-level data storage may be possible. Explained below is the binary data storage scheme.

Figure 21:
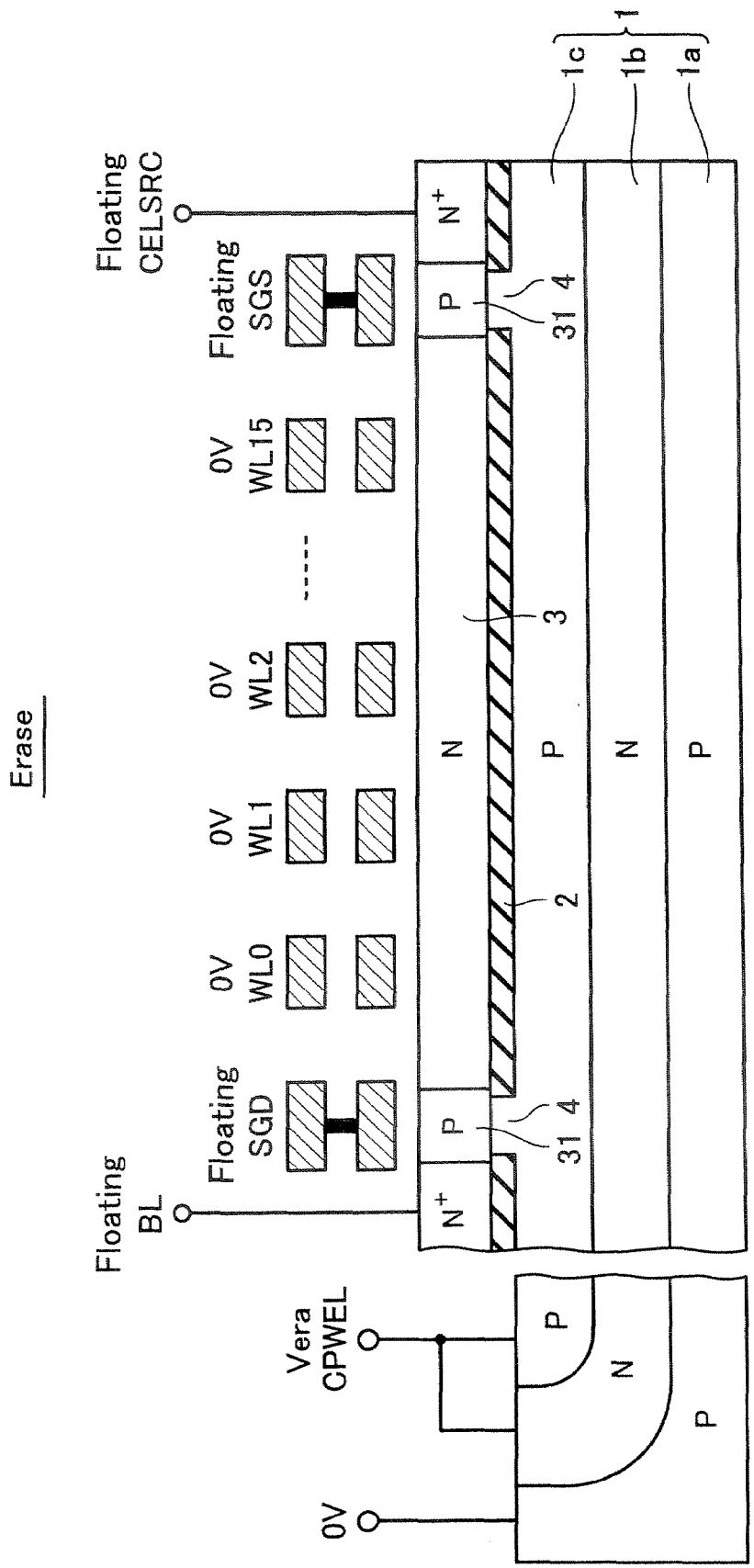
FIG. 21 shows bias relationships in the erase mode of the flash memory in accordance with the embodiment.

FIG. 21 shows a bias relationship in a NAND cell unit at an erase time. Data erase is performed for an erase unit, one block BLK, which is defined as a set of NAND cell units sharing word lines WL0-WL15 in the equivalent circuit shown in FIG. 5.

As shown in FIG. 21, in a selected block, select gate lines SGD, SGS, bit lines BL and common source line CELSRC are set to be floating; the entire word lines WL0-WL15 are set at 0V; and positive erase voltage Vera is applied to a well node CPWEL, which is in contact with the p-type well 1c and n-type well 1b. The erase voltage Vera is a boosted voltage generated from a boost circuit to be higher than the power supply voltage, for example, 15V to 24V.

Under this bias condition, the PN junction between the n-type layer 3 and the p-type layer 31 under the select gate line in the NAND cell unit is forward biased. Therefore, the n-type layer 3 is charged up to the erase voltage Vera via the p-type layer 31 at the opening 4 from the p-type well 1c. As a result, a large electric field is applied between the floating gate and the cell channel in each memory cell, and electrons in the floating gate are discharged by FN tunneling, so that the erase state (i.e., "1" data state) with a negative threshold voltage may be obtained.

At this time, n-type layers 3 in the non-selected blocks are also charged up to Vera. However, word lines in the non-selected blocks are set to be floating, and the floating gates are boosted by capacitive coupling, so that the memory cells in the non-selected block are not erased.

Figure 22:
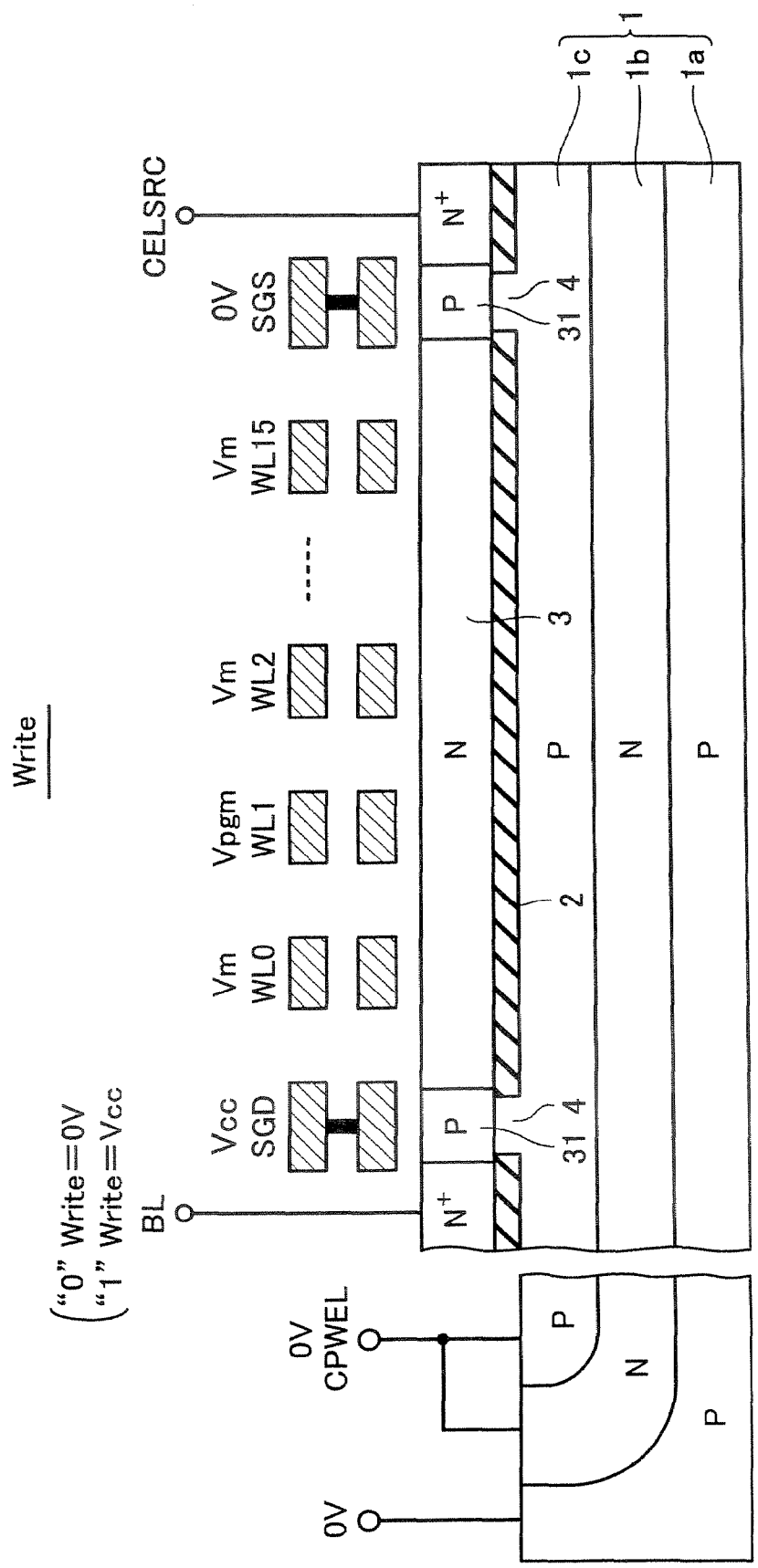
FIG. 22 shows bias relationships in the write mode of the flash memory.

FIG. 22 shows a bias relationship at a data write time. Supposing that a set of memory cells arranged along a word line is defined as one page or two pages, data write is performed by a page. FIG. 22 shows a case where word line WL1 is selected.

Well node CPWEL is applied with 0V (or small and negative voltage); the selected word line WL1 is applied with write voltage Vpgm, that is set at 15V to 20V; the remaining non-selected word lines are applied with positive medium voltage Vm lower than Vpgm; select gate line SGD on the bit line side is applied with Vdd; select gate line SGS on the source line side is applied with 0V; and common source line CELSRC is applied with 0V or a suitable positive voltage.

Prior to the above-described write bias application, 0V ("0" write data) and Vdd ("1" write data) are applied to bit lines BL in accordance with write data. When "0" write time, the NAND cell channel is applied with 0V. In case of "1" write, the select gate transistor SG1 is turned off when source thereof is charged up to Vdd-Vth (Vth: threshold voltage of select gate transistors), so that the NAND cell channel is made floating.

The write voltage Vpgm and medium voltage Vm being applied under the above-described state, electrons are injected into the floating gate in the "0" write selected cell by FN tunneling. As a result, "0" data defined by a positive threshold voltage may be written into the selected cell. By contrast, the floating cell channel is boosted in potential by capacitive coupling in the "1" write cell, so that electron injection does not occur in it. Therefore, the "1" write cell is kept in the "1" data state.

Figure 23:
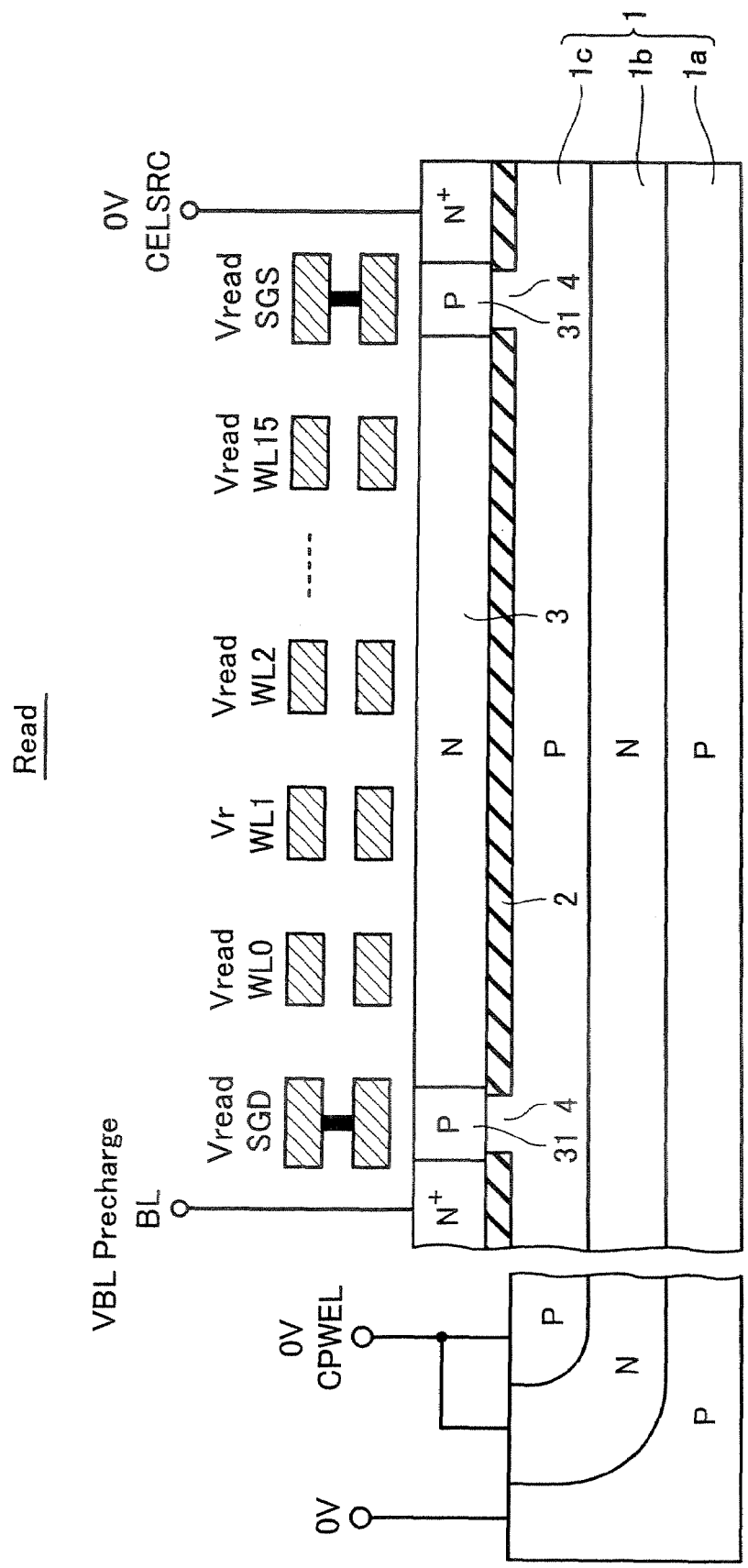
FIG. 23 shows bias relationships in the read mode of the flash memory.

FIG. 23 shows a bias relationship at a data read time. Data read also is performed by a page. FIG. 23 shows a case where word line WL1 is selected.

The common source line CELSRC is set at 0V, and bit line BL is precharged to a positive voltage VBL, and kept in a floating state. Well node CPWEL is applied with 0V (or small positive voltage); the selected word line is applied with read voltage Vr (e.g., 0V); the remaining non-selected word lines are applied with pass voltage Vread, which is able to turn on cell without regard to cell data; and select gate lines SGD and SGS are applied with pass voltage Vread.

As a result, in case cell data is "0", the selected cell is kept off, and the bit line BL will not be discharged. By contrast, in case the selected cell's data is "1", the bit line will be discharged via the NAND cell unit including the selected cell, which is turned on. Therefore, detecting the bit line voltages with sense amplifiers after having performed bit line discharge operation for a certain period, one page data are read out.

The substrate used in this embodiment is not a perfect SOI substrate, which has a silicon layer perfectly isolated from the substrate, but a partial SOI substrate. While it is required of this partial SOI substrate to be subjected to crystallizing process, it may be obtained inexpensively in comparison with the ordinary SOI substrate. Selecting the thickness of the silicon layer, device isolation is easy. Further, it is possible to achieve such a miniaturized cell structure that is not obtained in case of an ordinary bulk type.

In addition, in case of a NAND-type flash memory with the ordinary SOI substrate, it is in need of specifically thinking for applying the erase voltage to the channel body of the NAND cell unit. By contrast, in this embodiment, the silicon layer serving as a channel body is in contact with the substrate via the opening formed in the oxide. Therefore, it is easy to apply the erase voltage to the channel bodies via the substrate for erasing NAND cell units in a lump, so that it is able to certainly perform data erase.

Figure 24:
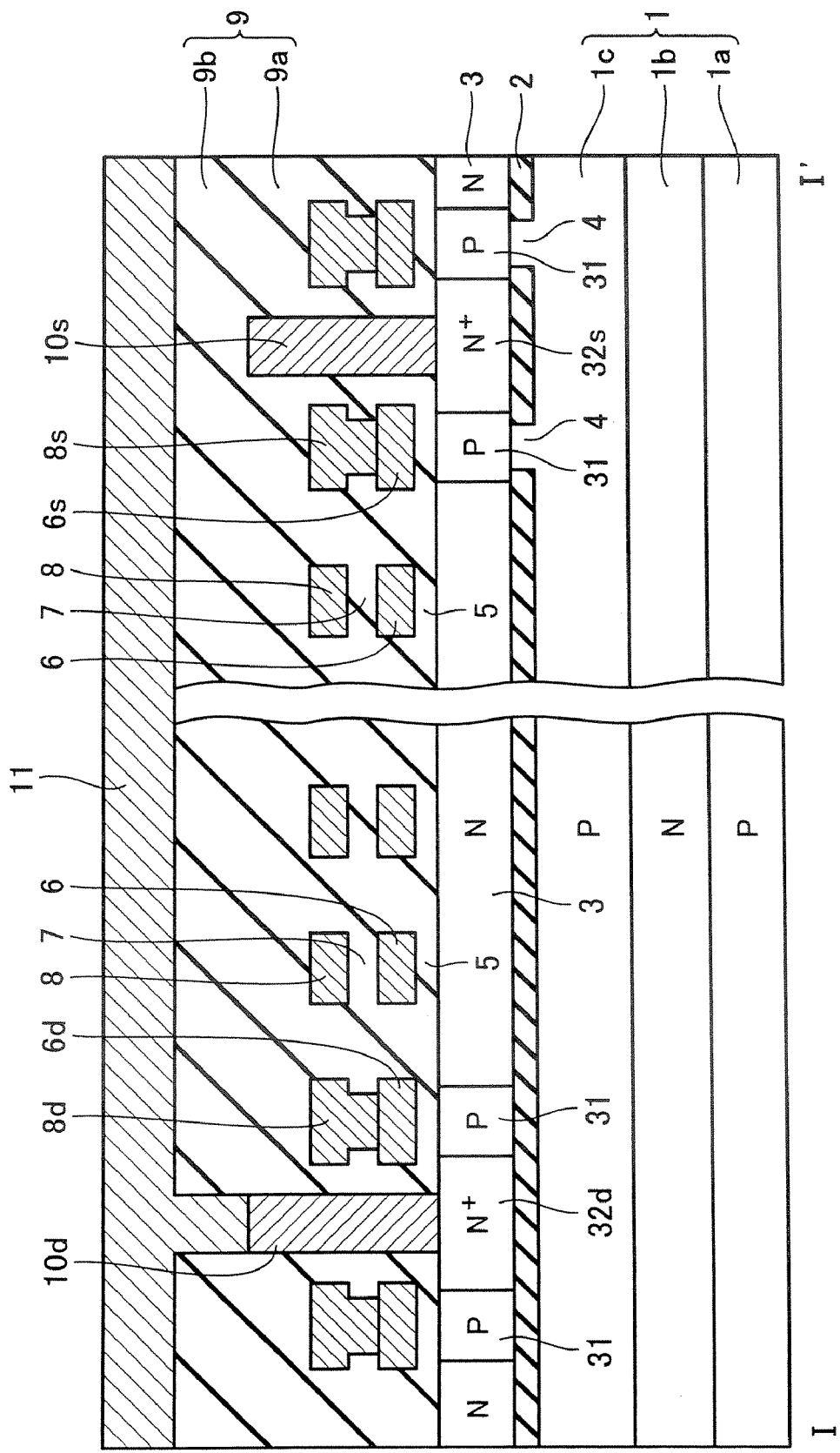
FIG. 24 shows I-I' sectional view in an example, in which the oxide opening is formed only under the source line side select gate line.
Figure 25:
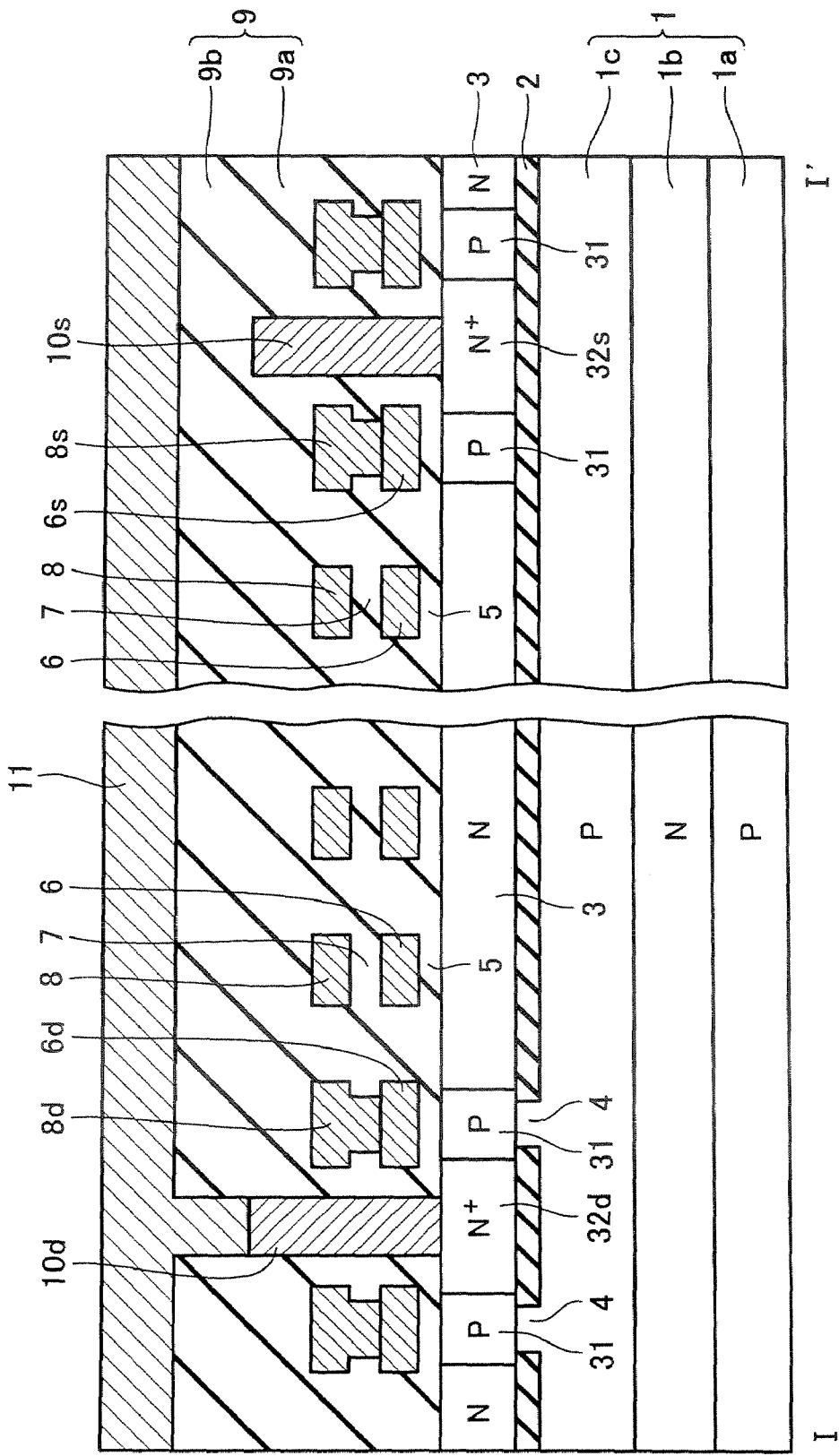
FIG. 25 shows I-I' sectional view in another example, in which the oxide opening is formed only under the bit line side select gate line.

FIGS. 24 to 27 show sectional views in other embodiments, which correspond to FIG. 2. In FIG. 2, openings 4 are formed in the oxide film 2 under both of the select gate line (SGD) 8d on the bit line side and the select gate line (SGS) 8b on the source line side. By contrast, FIG. 24 shows such an example that the openings 4 are formed only under the source line side select gate lines (SGS) 8s, while FIG. 25 shows another example, in which the openings 4 are formed only under the bit line side select gate lines (SGD) 8d.

Figure 26:
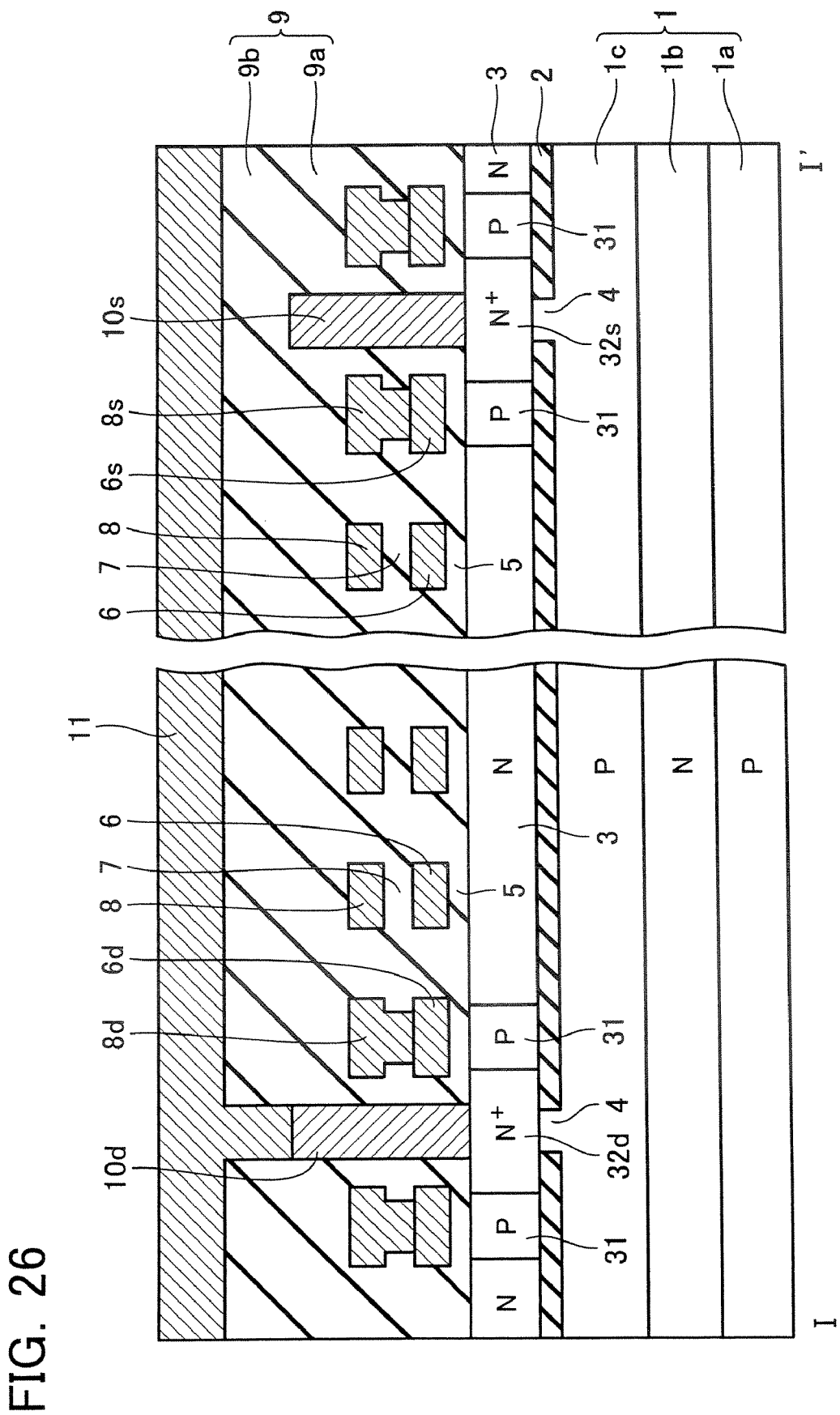
FIG. 26 shows I-I' sectional view in another example, in which the oxide openings are formed under the bit line and source line contacts.

In FIG. 26, the openings 4 are formed in the oxide 2 under the $n^+$-type diffusion layers 32d and 32s serving as the bit line (BL) contact area and source line (CELSRC) contact area, respectively. In this case, when the erase voltage Vera is applied to p-type layer 1c on the substrate, the PN junctions between p-type layer 1c and $n^+$-type layers 32s, 32d are reversely biased. However, suitably setting the erase voltage value and impurity concentration of each diffusion layer, it becomes possible to apply a required and positive voltage to the channel body of the NAND cell unit.

In detail, having formed to cause breakdown of the PN junctions between p-type layer 1c and n+-type layers 32d, 32s, impact ionization occurs in the p-type layer 31, and holes in generated electron-hole pairs are carried to and stored in the n-type channel body of the NAND cell unit. As a result, the channel body will be boosted to such a positive voltage that is necessary for the erase operation.

While in the example shown in FIG. 26, the openings 4 are formed in the oxide 2 under the n+-type diffusion layers 32d and 32s at both of the bit line (BL) contact area and the source line (CELSRC) contact area, it is effective that the opening is formed under either one of the bit line (BL) contact area and the source line (CELSRC) contact area.

Figure 27:
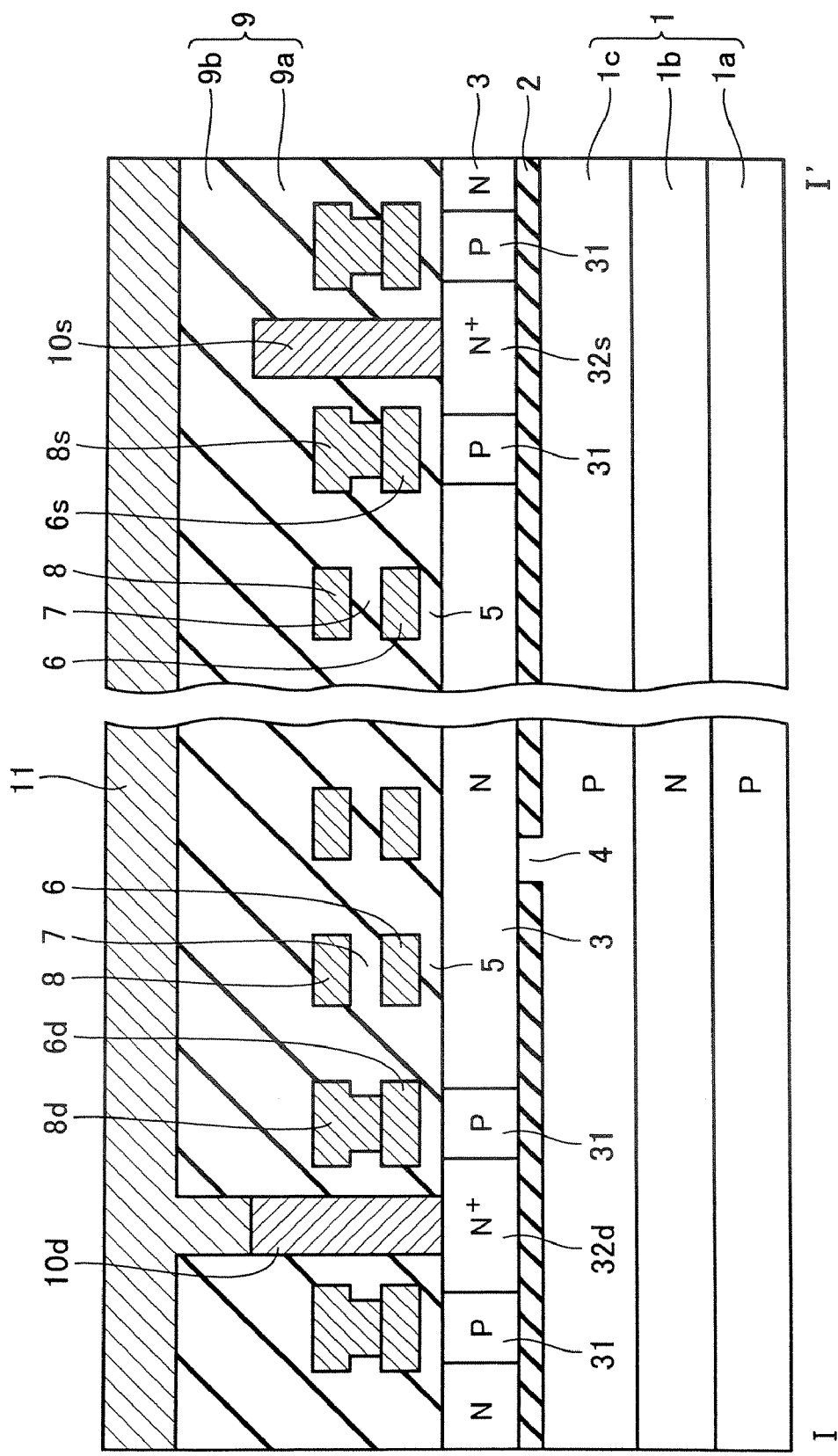
FIG. 27 shows I-I' sectional view in another example, in which the oxide opening is formed under the memory cell.

FIG. 27 shows still another example, in which the opening 4 is formed in the oxide 2 under a certain memory cell in the NAND cell unit. In this example, the channel bodies in the NAND cell unit may be charged up in accordance with the erase voltage Vera applied to the p-type layer 1c, so that the erase operation is made possible like the above-described embodiments.

Figure 28:
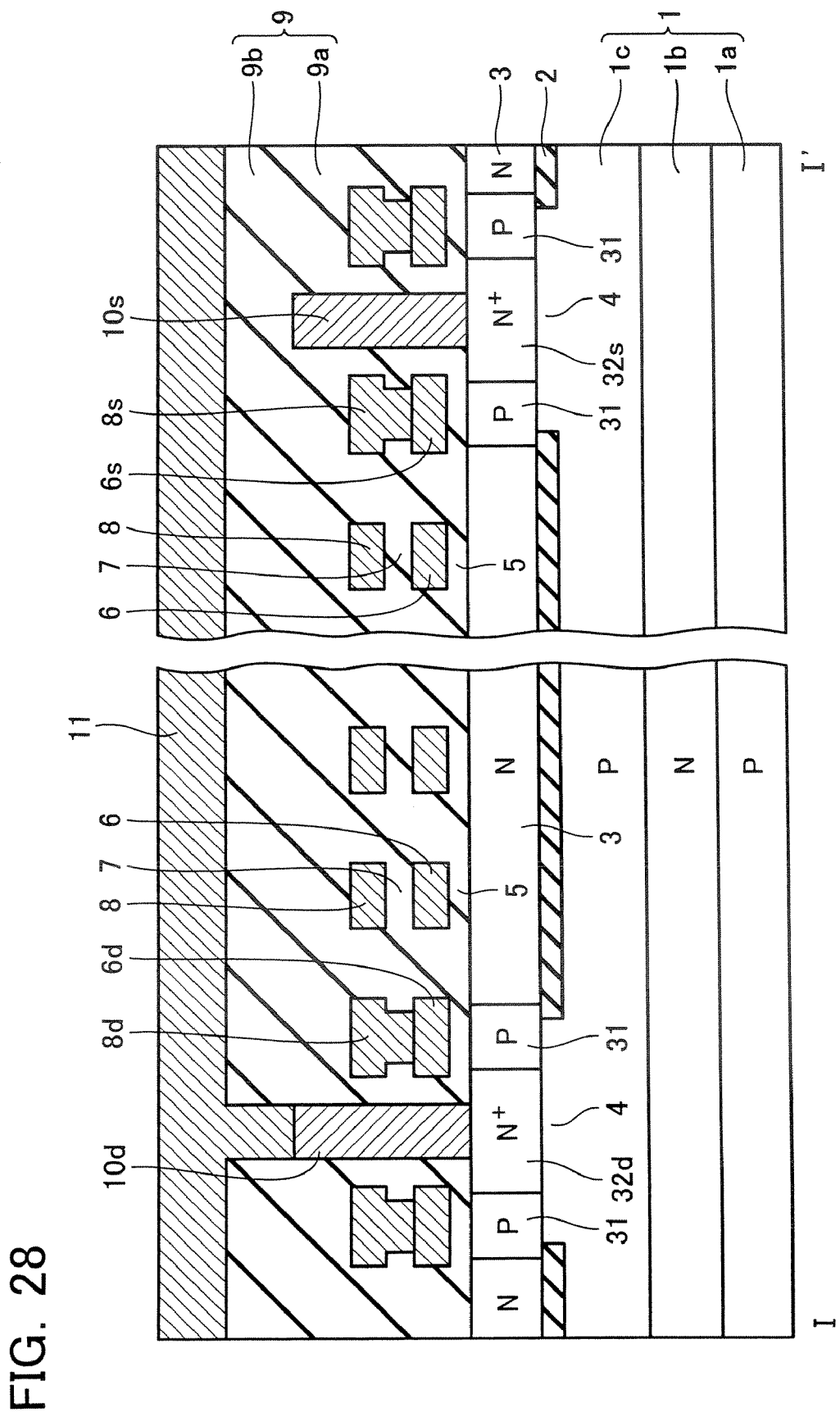
FIG. 28 shows I-I' sectional view in another example, in which the oxide openings are formed under the area extending from the bit line and source line contacts to the select gate line.

FIG. 28 shows still another example, in which the openings 4 are formed under a area extending from n+-type layer 32d (i.e., common drain region of the select gate transistors SG1) to p-type layer 31 (i.e., channel bodies of the select gate transistors SG1), and under another area extending from n+-type layer 32s (i.e., common source region of the select gate transistors SG2) to p-type layer 31 (i.e., channel bodies of the select gate transistors SG2). Having not shown in the drawings, it is useful that the opening 4 is formed to cover the area from p-type layer 31 to n-type silicon layer 3.

Next, device simulation data will be explained below. Device conditions are as follows: the ratio of line L to space S of the stripe-shaped device formation area is L/S=80 nm/80 nm; word line width is W=80 nm; select gate line width is LSG=100 nm; impurity concentration of p-type well is PSUB=1E18 cm$^{-3}$; and impurity concentration of p-type layer under the select gate line is PSGC=1E16 cm$^{-3}$.

The thickness of the silicon layer in the partial SOI substrate is selected in the range of TSOI=10 nm to 80 nm, and the thickness of the device isolation film is selected in the range of TBOX=20 nm to 80 nm. The tunnel oxide thickness is TOX=8 nm. The number of memory cells in the NAND cell unit is 5.

Initially, with respect to such a structure that the openings are formed under the select gate lines (SG) and such a structure that the openings are formed under the source line/bit line contacts (CB), the simulation results of erase operations under the condition of: word line is set at 0V; and p-type well is applied with 20V will be explained.

FIGS. 29A and 29B show simulation conditions with respect to the respective structures. Here, source and drain voltages are those at n+-type layers 32s and 32d, to which the source line CELSRC and bit line BL are connected, respectively. In a practical erase operation, the source line CELSRC and bit line BL are set to be floating, so that each of the n+-type layers 32s and 32d has a voltage level defined by the voltage applied to the p-type well 1c. However, for the convenience of numerical calculation, the simulation is performed with the source and drain voltage applied as shown in FIGS. 29A and 29B.

In case of such the structure that the openings are formed under the select gate lines (SG), since the PN junction between p-type diffusion layer 31 under the select gate line SG and n+-type diffusion layer 32s (or 32d) is forward biased, source and drain voltages are set at the same voltage as that of p-type well, 20V. In case of such the structure that the opening is formed under the source line/bit line contact (CB), it is provided such an NPN structure that p-type diffusion layers 31 is sandwiched by n+-type layer 32s (or 32d) and n-type silicon layers 3. Therefore, source and drain voltages are set at 19V that is lower than the p-type well voltage 20V with built-in-potential of a PN-junction.

Note here that the apply voltage is made linearly changed in accordance with time from timing 0 μsec to 10 μsec. That is, p-type well voltage is changed with 2V/μsec and finally boosted to 20V. The apply voltage is not changed from 10 μsec to 100 μsec.

Figure 30:
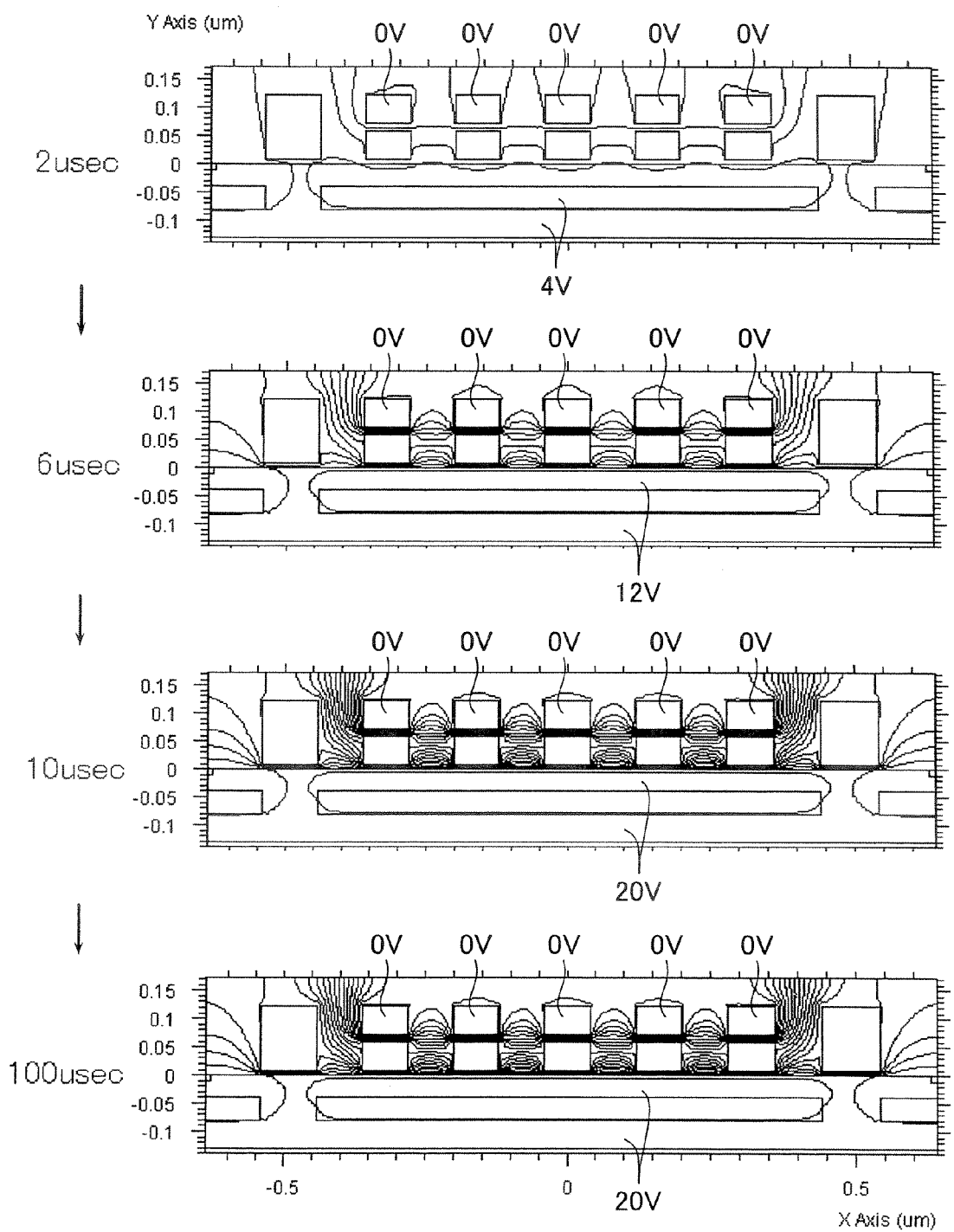
FIG. 30 shows potential changes at the erase voltage applying time in the cell array structure, in which the oxide opening is formed under the select gate lines.
Figure 31:
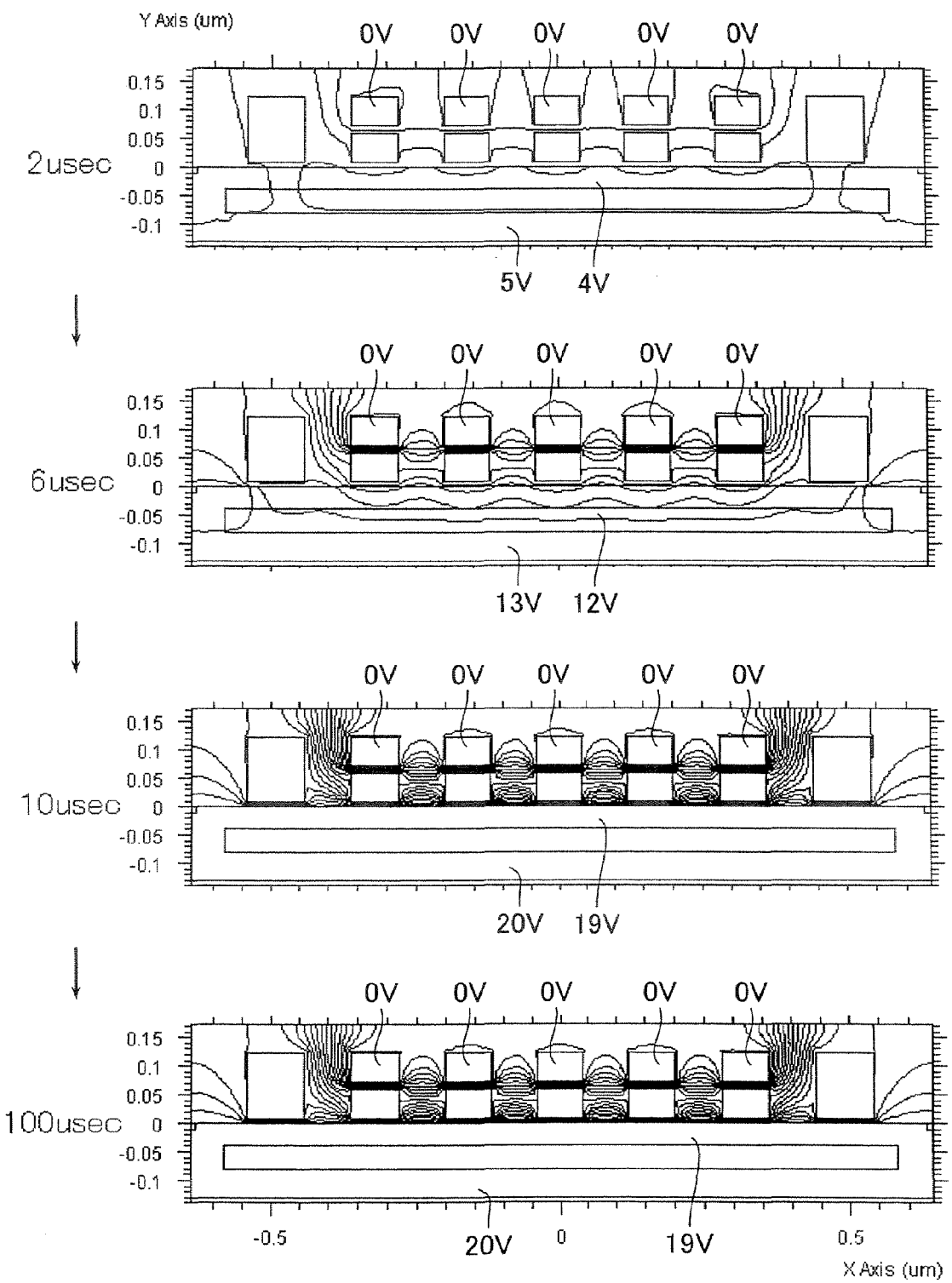
FIG. 31 shows potential changes at the erase voltage applying time in the cell array structure, in which the oxide opening is formed under the source line/bit line contacts.

FIGS. 30 and 31 show the changes of potential distributions in the device under the condition of the above-described erase voltage application with respect to such structures that the openings are formed under the select gate line SG and under the source line/bit line contact CB, respectively. The potential distribution, which is shown by contour lines, is a result of calculating vacuum level. That is, taking account of the work function, p-type layer, which is externally applied with 0V, is set at about −5 eV. In FIGS. 30 and 31, the potential change of the p-type well and the channel body portion (n-type silicon) are depicted in relation with 0V of word line (control gate).

In detail, the channel body potentials are: about 4V after 2 μsec; about 12V after 6 μsec; and about 20V and 19V after 10 μsec. In FIG. 30, it appears that there is a level difference between the channel body and p-type well. This is because of that vacuum level is shown. In practice, both of the channel body and p-type well become 20V after 10 μsec. By contrast, in FIG. 31, it appears that there is not a level difference between the channel body and the p-type well. However, in practice, when the p-type well is set at 20V, the channel body is set at 19V that is the same as source and drain.

As a result of the above-described simulation data, in both cases where the openings are formed under the select gate line SG and under the source line/bit line contact CB, it will be confirmed that a certain level erase-use electric field is applied between the channel body and the floating gate, whereby the device may be erased.

Figure 32:
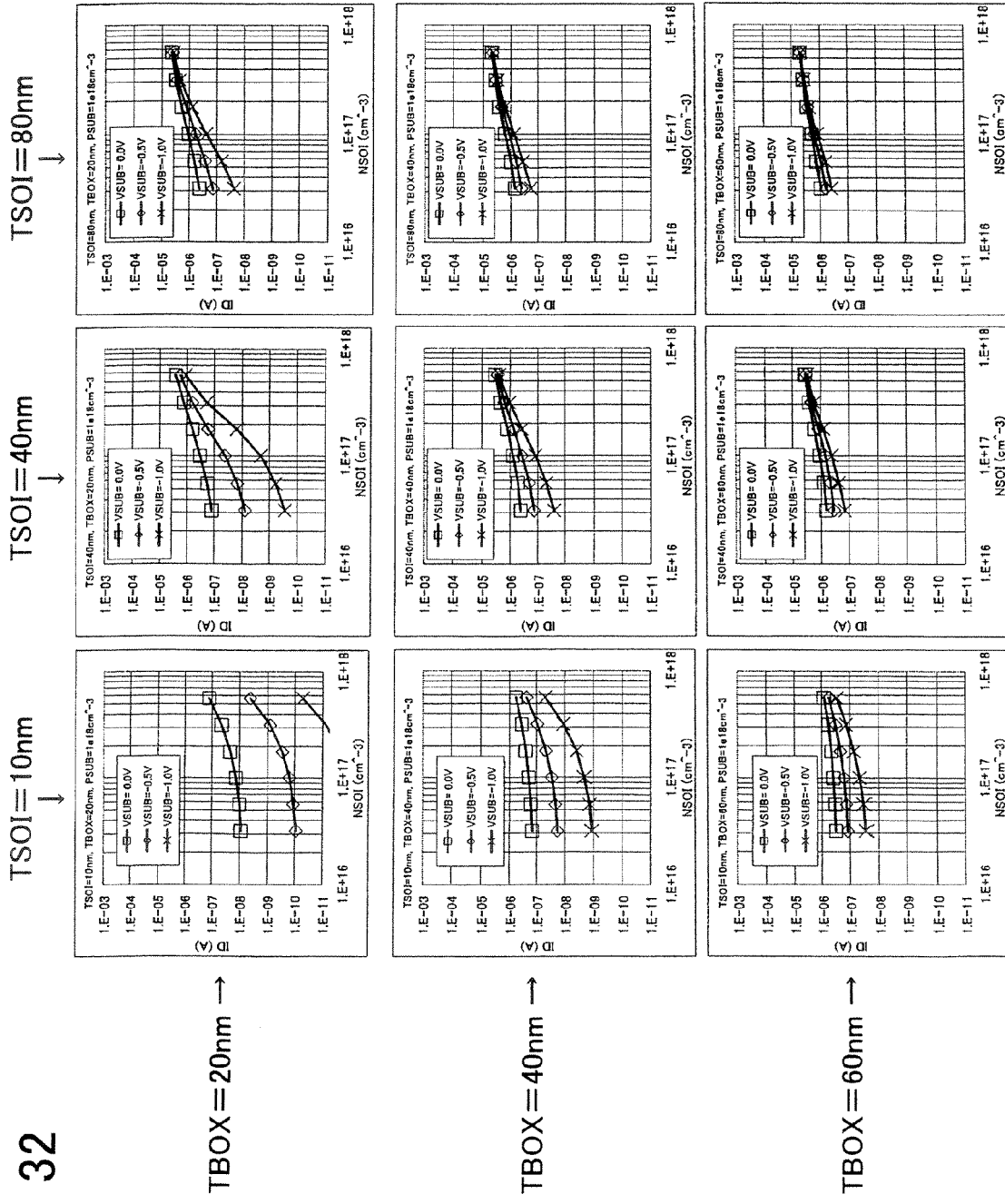
FIG. 32 shows the relationship between read cell current and impurity concentration of the silicon layer in the cell array structure, in which the oxide opening is formed under the select gate line, with reference to combinations of the silicon layer thicknesses and the oxide film thicknesses.

FIG. 32 shows read current characteristics of NAND cell unit in the case where the opening is formed under the select gate line SG. Here is provided the relationships between the read current (bit line current) ID of a selected cell and the impurity concentration NSOI of the n-type silicon layer with relation to the p-type well voltage VSUB used as parameters with respect to 3×3 combinations of: TSOI=10, 40 and 80 nm; and TBOX=20, 40 and 60 nm.

Here, the drain voltage is VD=0.7V; floating gate voltage of the non-selected cells is 2.5V; and floating gate voltage of the selected cell is 0V. Further, the impurity concentration of the p-type well is PSUB=1E18 cm$^{-3}$.

FIG. 33 shows read cell currents ID(−0.5V), ID(−0.2V), ID(0.0V), ID(0.2V) and ID(0.5V), which are obtained with the selected cell's floating gate voltages VFG=−0.5, −0.2, 0.0, 0.2 and 0.5V, respectively, and the selected cell's ON/OFF current ratios ID(0.2V)/ID(−0.2V) and ID(0.5V)/ID(−0.5V). Note here that the impurity concentration NSOI of the n-type silicon layer is adjusted to satisfy the following relationship: when the floating gate voltage of the selected cell is 0V, the drain current is ID=0.1 μA.

The simulation results shown in FIGS. 32 and 33 teach that it is possible to read out cell data based on the cell's ON/OFF current ratio, and select an optimum condition of the read current characteristic with regard to the sizes and impurity concentrations of the respective portions of the device.

Figure 34:
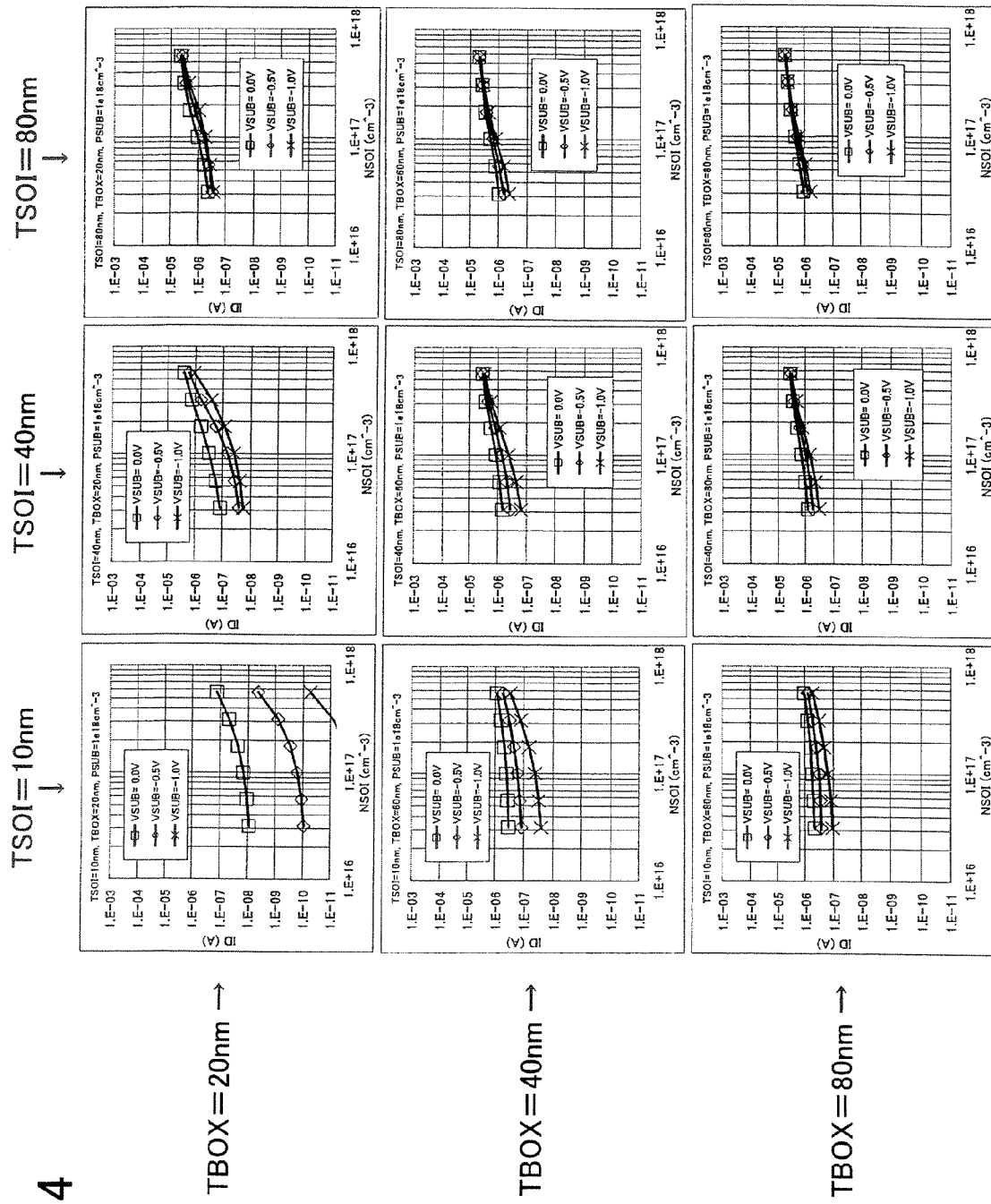
FIG. 34 shows the relationship between read cell current and impurity concentration of the silicon layer in the cell array structure, in which the oxide opening is formed under the source line/bit line contacts, with reference to combinations of the silicon layer thicknesses and the oxide film thicknesses.

FIGS. 34 and 35 show the simulation results in the case where the opening is formed under the bit line contact CB under about the same conditions as those in FIGS. 32 and 33. In FIG. 34, the relationships between the read current (bit line current) ID of a selected cell and the impurity concentration NSOI of the n-type silicon layer are shown with relation to the p-type well voltage VSUB used as parameters with respect to 3×3 combinations of: TSOI=10, 40 and 80 nm; and TBOX=20, 40 and 60 nm. Other conditions are the same as those in FIG. 32.

FIG. 35 shows the results of the selected cell's ON/OFF current ratios ID(0.2V)/ID(−0.2V) and ID(0.5V)/ID(−0.5V) obtained under the conditions like those in FIG. 33.

FIG. 36 shows a simulation result in the case where the opening is formed under the select gate line SG. That is, such a device condition is simulated that the drain current (i.e., bit line current) becomes ITH=0.1 μA in the cases of threshold voltage VTH=−0.5V, 0V and 0.5V. While each value of ITH is slightly shifted from 0.1 μA, it shows the error generated as a result of the condition searching calculation. It may be guessed that the similar result will be obtained in the case where the opening is formed under the source line/bit line contact CB.

In FIG. 36, "SF" is S factor in each threshold state (unit: mV/dec.); "ION" is the drain current when the floating gate voltage corresponds to the threshold voltage of +2.5V (unit: A); "TSOI/L" is the SOI film thickness normalized by the gate length L; and "TBOX/L" is the BOX film thickness normalized by the gate length L. Other items are the same as those in FIGS. 33 and 35.

FIGS. 37-41 are graphs each showing the result in FIG. 36 on an x-y coordinate, where TSOI/L and TBOX/L are plotted on x-axis and y-axis, respectively.

Figure 37:
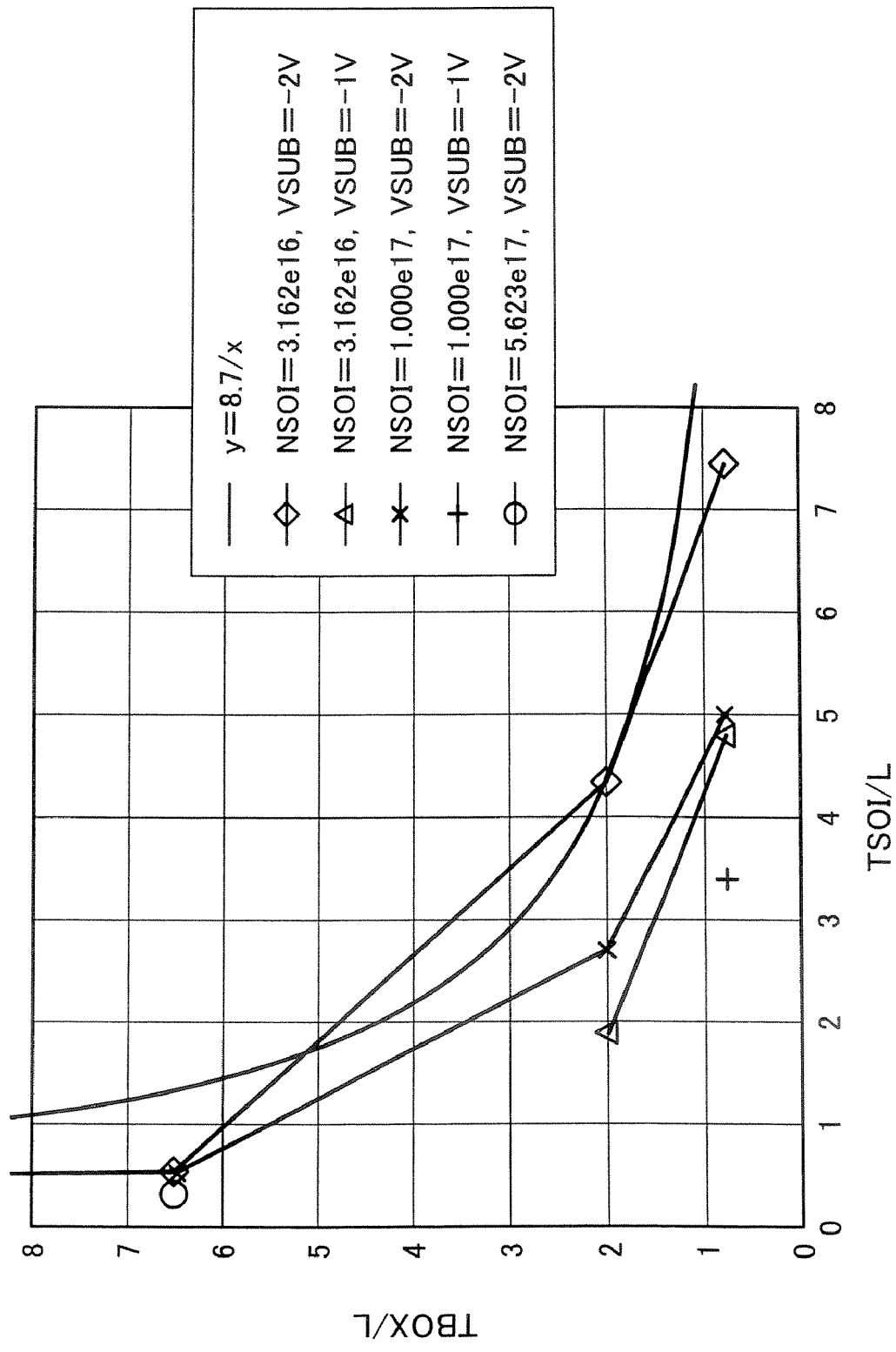
FIG. 37 shows an operable area on the x-y coordinate with TBOX/L axis and TSOI/L axis in case of: L=S=W=20 nm; and VTH=−0.5V selected from the result shown in FIG. 36.

FIG. 37 shows a case of: L=S=W=20 nm; and VTH=−0.5V. Symbols such as circle (o), triangle (Δ) and so on are the calculation results in FIG. 36, and it is shown that the memory device is operable when TBOX and TSOI are defined by the combinations of the above-described symbols.

In FIG. 37, a curve of: y=8.7/x is shown. The calculation result teaches that there is an operable area defined by the combinations of TBOX and TSOI under the curve.

Figure 38:
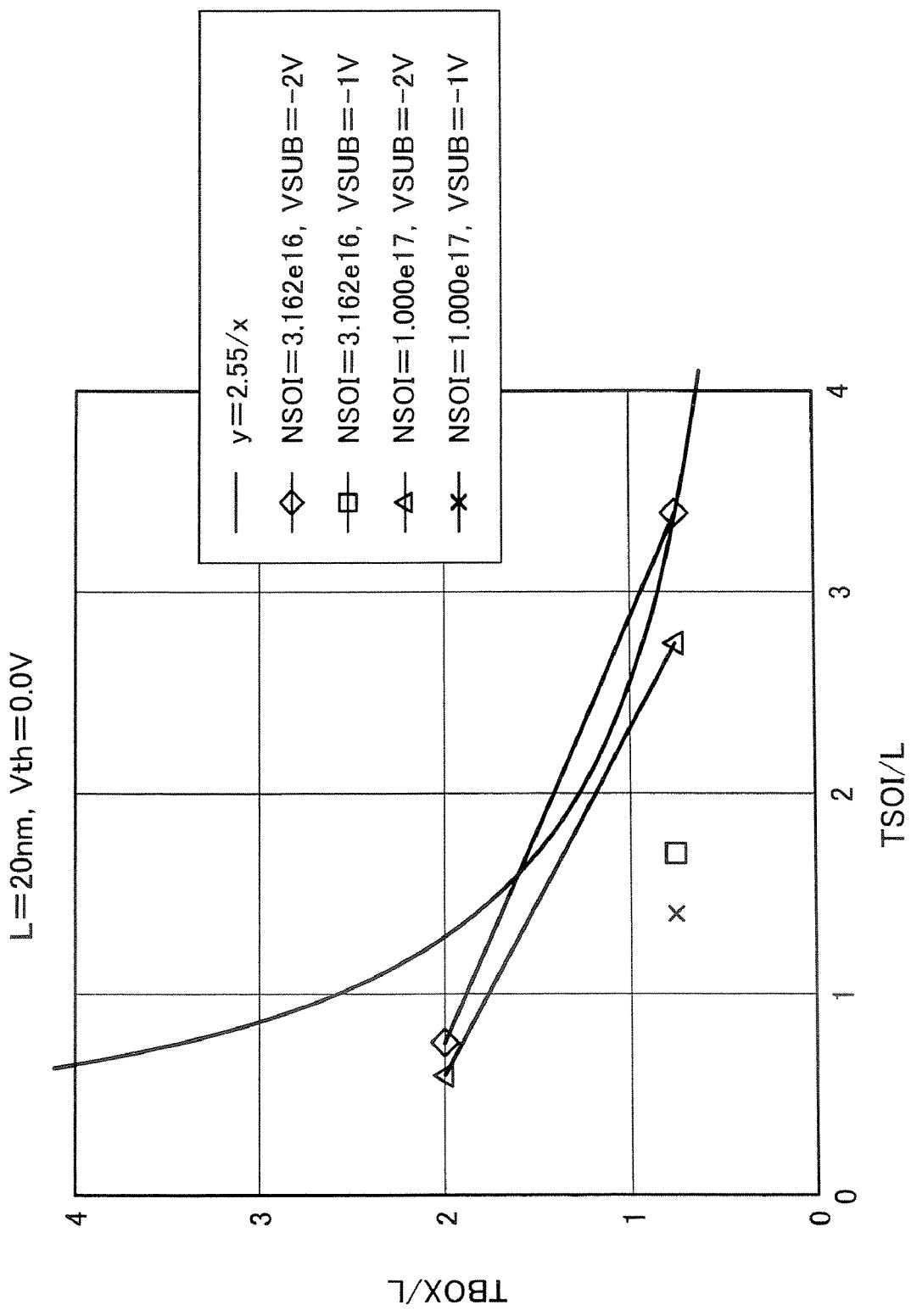
FIG. 38 shows an operable area on the x-y coordinate in case of: L=S=W=20 nm; and VTH=0V.

FIG. 38 shows a case of: L=S=W=20 nm; and VTH=0V. In this case, the curve defining the operable area is expressed as follows: y=2.55/x.

Figure 39:
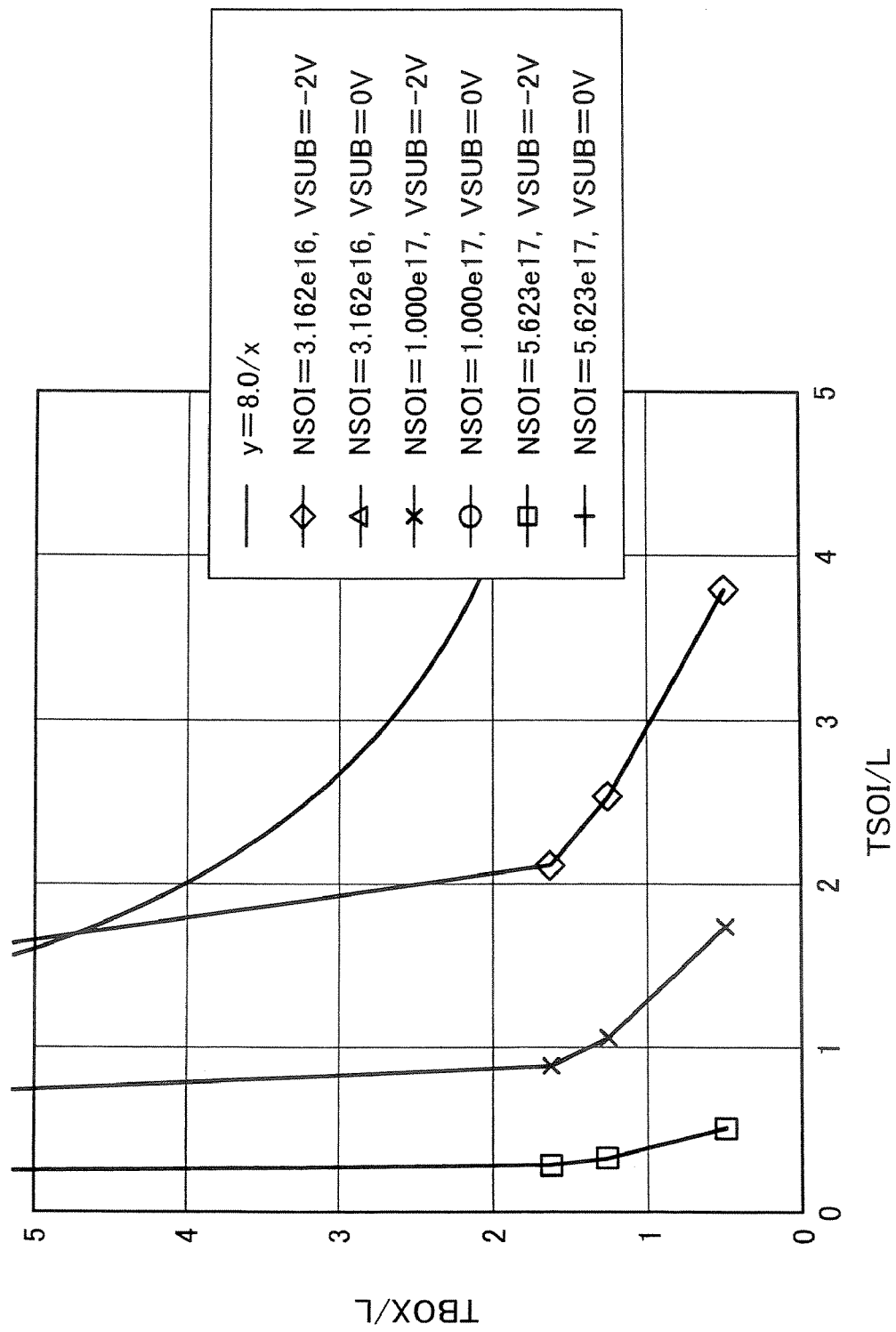
FIG. 39 shows an operable area on the x-y coordinate in case of: L=S=W=80 nm; and VTH=−0.5V.

FIG. 39 shows a case of: L=S=W=80 nm; and VTH=−0.5V. In this case, the curve defining the operable area is expressed as follows: y=8.0/x.

Figure 40:
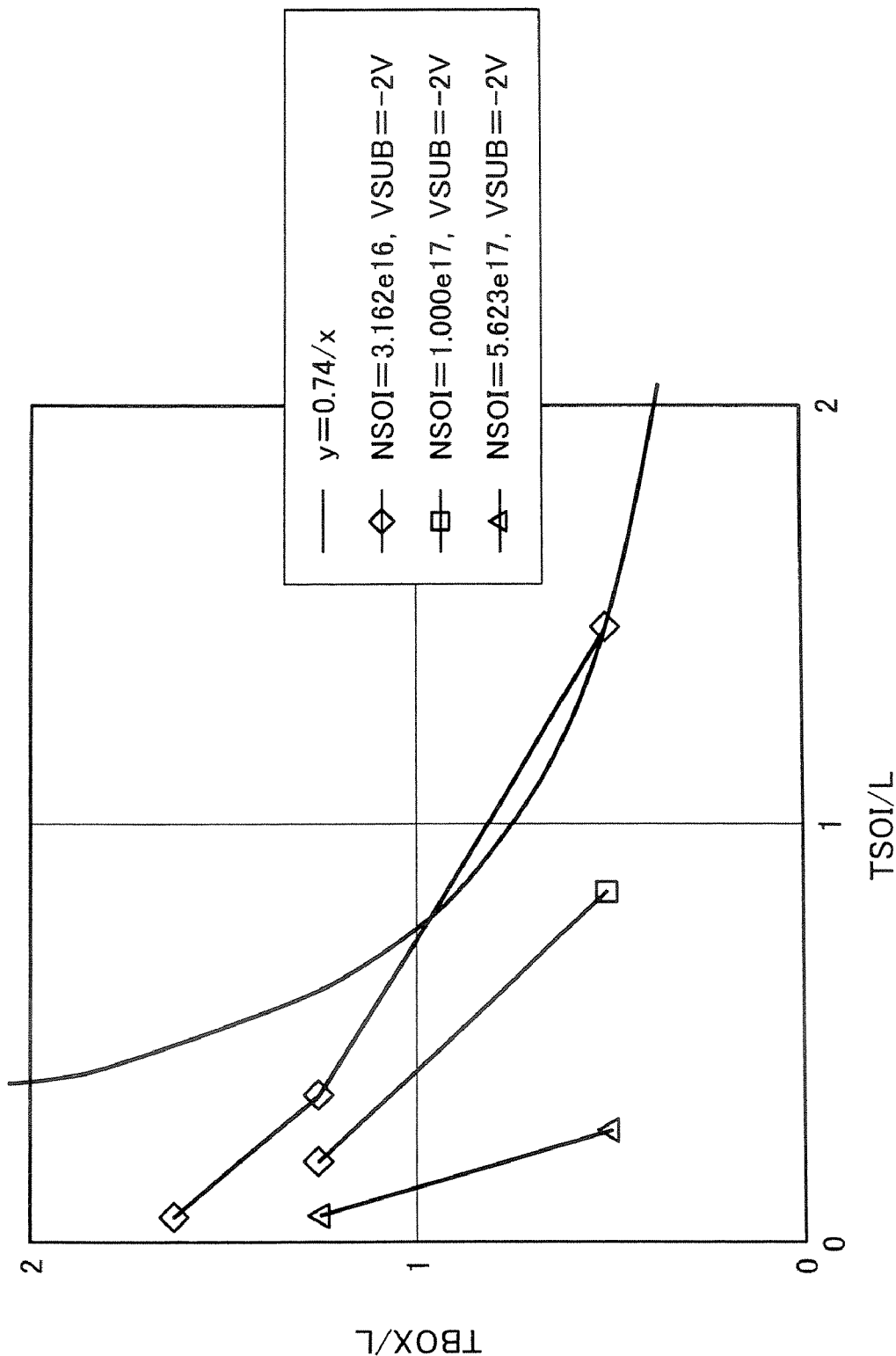
FIG. 40 shows an operable area on the x-y coordinate in case of: L=S=W=80 nm; and VTH=0V.

FIG. 40 shows a case of: L=S=W=80 nm; and VTH=0V. In this case, the curve defining the operable area is expressed as follows: y=0.74/x.

Figure 41:
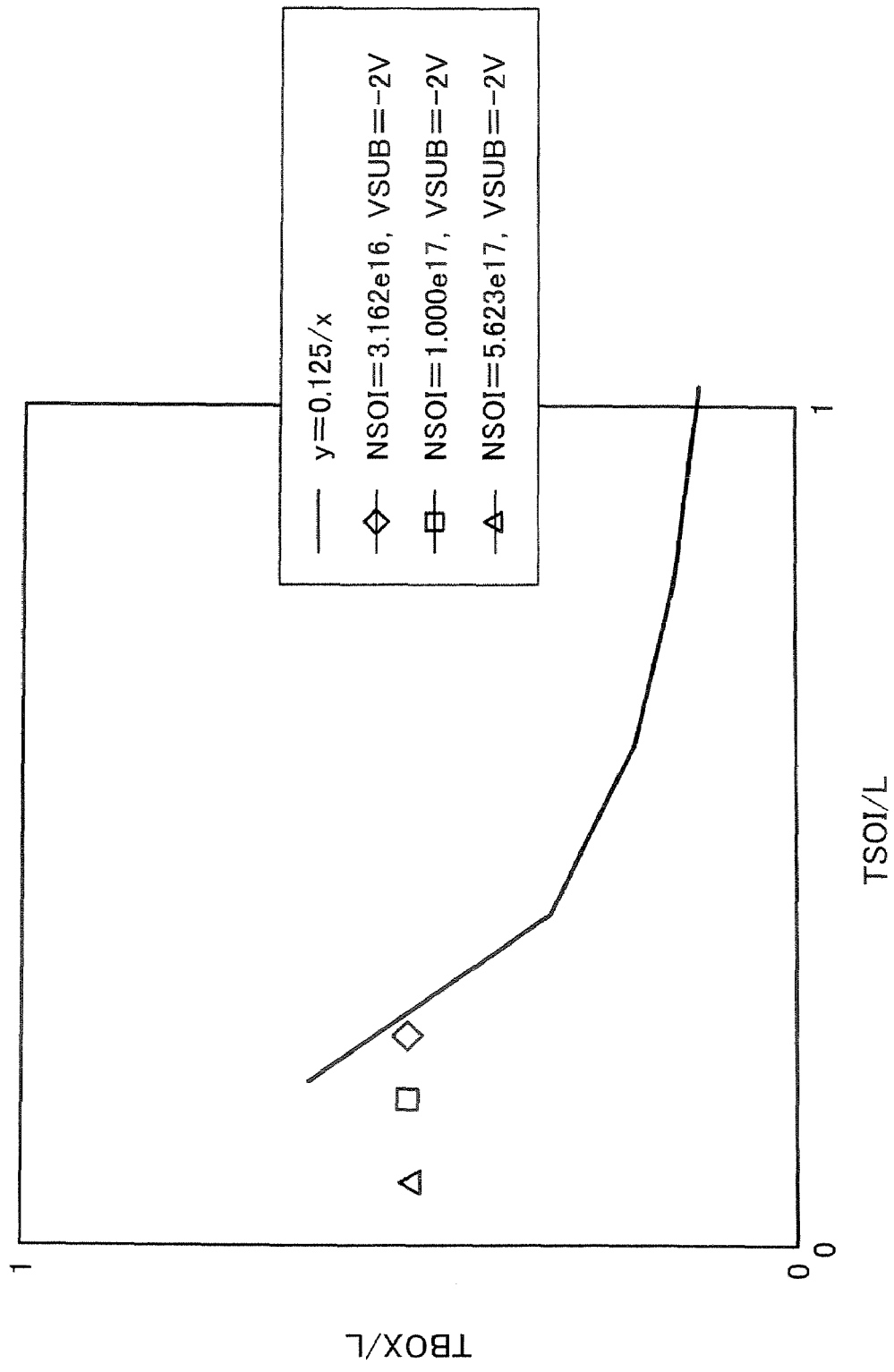
FIG. 41 shows an operable area on the x-y coordinate in case of: L=S=W=80 nm; and VTH=0.5V.

FIG. 41 shows a case of: L=S=W=80 nm; and VTH=0.5V. In this case, the curve defining the operable area is expressed as follows: y=0.125/x.

The results of FIGS. 37 to 41 may be explained as follows: the negative substrate bias VSUB serves for suppressing the drain current via the BOX film and SOI film; as the BOX film becomes thicker, the capacitive coupling of VSUB to the SOI film becomes less, so that the drain current suppressing effect is reduced; and even if the BOX film is thin, as the SOI film becomes thick, the drain current suppressing effect is reduced.

FIGS. 37-41 show that in the outside area of each approximate hyperbolic curve, the BOX film is too thick, or the SOI film is too thick, to obtain the preferable drain current in the suitable range of VSUB (i.e., 0V to 2V), i.e., to obtain the preferred threshold voltage.

As described above, it has been cleared from the simulation result that data read is made possible in both cases of: the opening is formed under the select gate line SG; and it is formed under the bit line contact CB. Comparing these read properties with each other, the property in case that the opening is formed under the select gate line SG is more highly dependent on the well voltage VSUB than that in the other case, so that the freedom of trimming and the like is also large.

The above-described embodiment may be variously modified as follows:

(a) It is effective to use a p-channel type of transistor as a memory cell, which is obtained by reversing p-type and n-type in the above-described embodiment.

Figure 42:
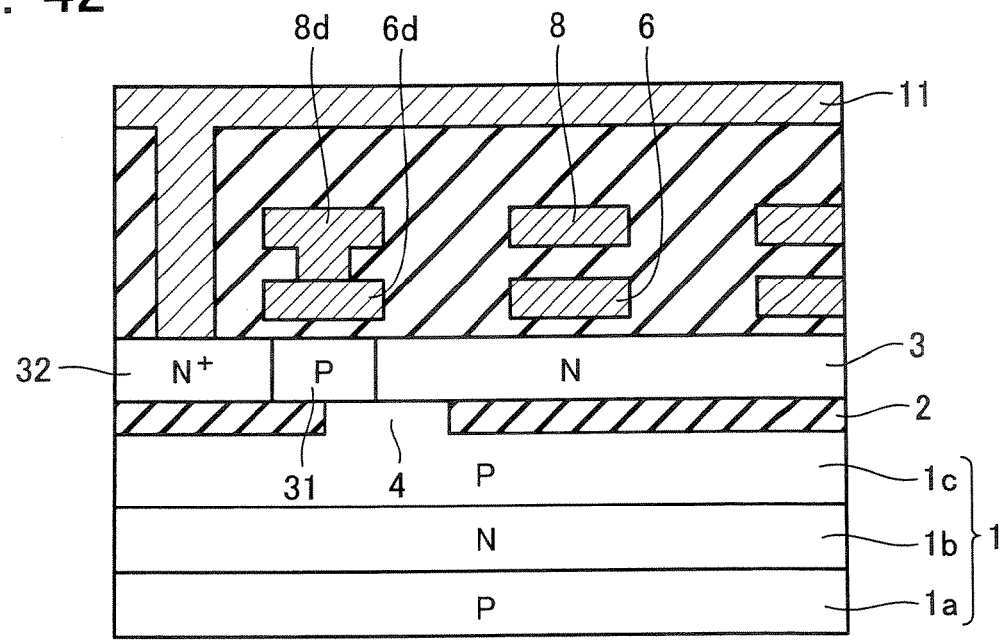
FIG. 42 shows a sectional view of a memory cell array, which corresponds to FIG. 2, in accordance with another embodiment.

(b) It is not always necessary that the opening 4 under the select gate line SG is, as shown in FIG. 2, aligned with the select gate line SG. As shown in FIG. 42, it is permitted that the opening 4 is shifted from the location just under the select gate line SG.

Figure 43:
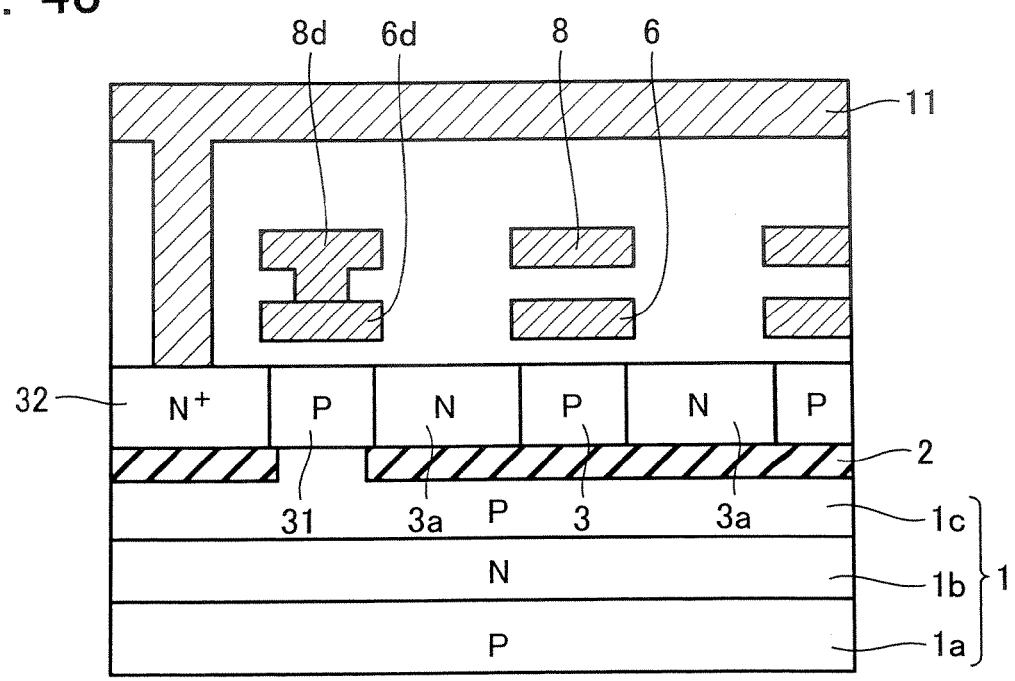
FIG. 43 shows a sectional view of a memory cell array, which corresponds to FIG. 2, in accordance with still another embodiment.

(c) In the above-described embodiment, n-type of silicon layer 3 is used, and the memory cell is formed as a D-type transistor. By contrast, as shown in FIG. 43, it is effective to use p-type silicon layer as the channel region of the memory cell, in which n-type layers 3a are formed at source and drain regions. In this case, at an erase time when erase voltage Vera is applied to the p-type well 1c, hole current may be supplied to the whole NAND cell channel via the p-type layer 31 under the select gate line SG from the opening 4. Therefore, it is possible to perform data erase in a lump like the above-described embodiment.

Figure 44:
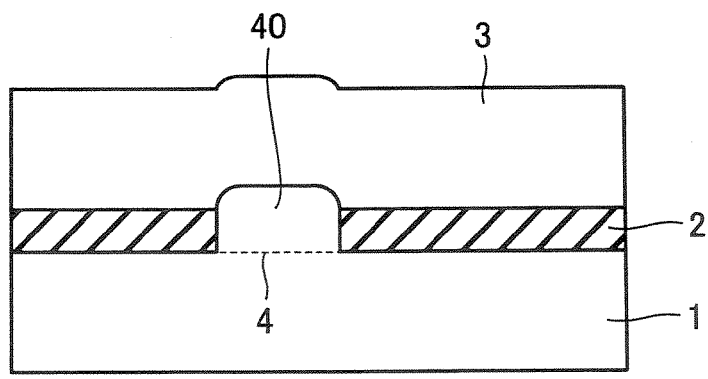
FIG. 44 is a sectional view for explaining a fabrication method of a partial SOI substrate in accordance with another embodiment.

(d) As a method of forming a crystalline silicon layer 3, it is useful to add a vapor-phase growing process. As shown in FIG. 44, firstly, form the epitaxial layer 40 on the opening portion of the substrate 1 with the opening 4 formed by use of vapor-phase growth; then, as similar to the above-described embodiment, deposit the amorphous silicon or polysilicon layer 3 on it; and finally perform crystallizing anneal.

As a result, crystallization is progressed from the vapor-phase epitaxial layer 40 serving as a seed, it is possible to obtain a well-crystallized silicon layer 3.

Figure 45:
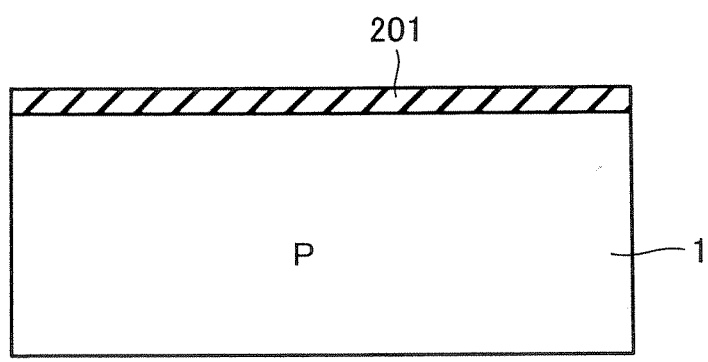
FIG. 45 is a sectional view for explaining a fabricating method of a partial SOI substrate by use of SIMOX.
Figure 46:
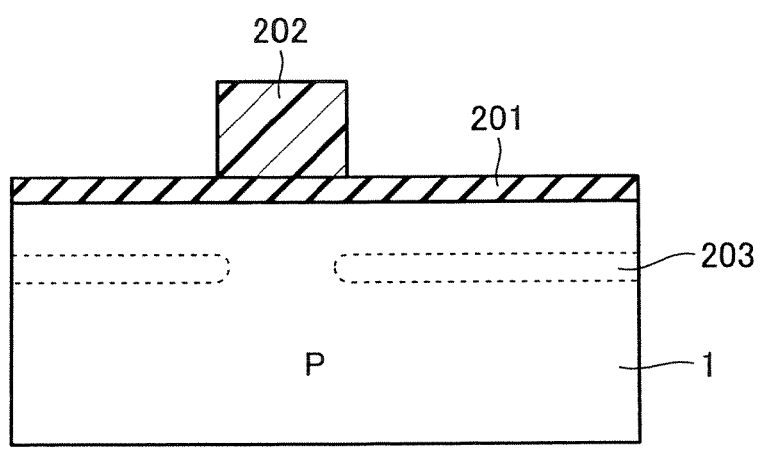
FIG. 46 is a sectional view for explaining another fabricating method of a partial SOI substrate by use of SIMOX.
Figure 47:
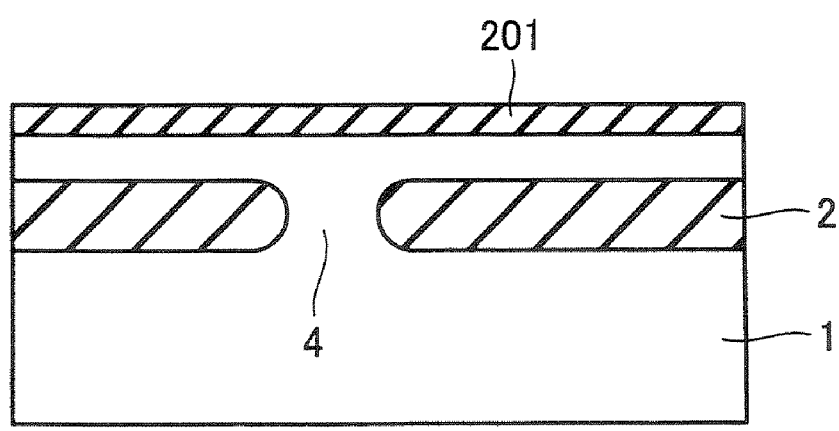
FIG. 47 is a sectional view for explaining the fabricating method of the partial SOI substrate by use of SIMOX.
Figure 48:
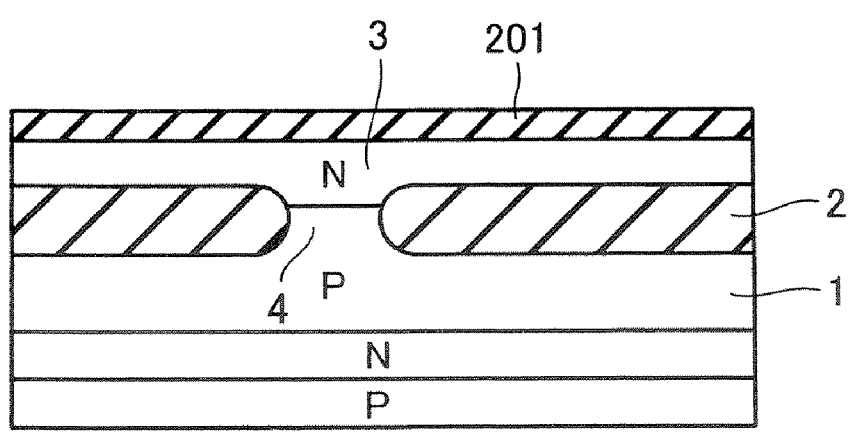
FIG. 48 is a sectional view for explaining the fabricating method of the partial SOI substrate by use of SIMOX.

(e) As a method of forming a partial SOI substrate, SIMOX (Separation by Implanted Oxygen) may be used as follows. As shown in FIG. 45, thermal oxide film 201 is formed on the substrate 1. Then, as shown in FIG. 46, resist mask 202 is patterned on the oxide film 201, and oxygen ion ($^{16}o^+$) is implanted in this state under the condition of: dose amount of $4 \times 10^{17}$ cm$^{-2}$; and acceleration voltage of 140 keV, so as to selectively form oxygen implanted layer 203. Following it, anneal is performed in, for example, 1300° C., N$^2$ atmosphere for 6 hours. As a result, as shown in FIG. 47, oxide film 2 is formed in the substrate. Then, As- and B-ion implantations are performed under suitable conditions, respectively, so that as shown in FIG. 48, the partial SOI substrate may be obtained like the above-described embodiment, in which n-type silicon layer 3 is formed on the oxide film 2.

Figure 49:
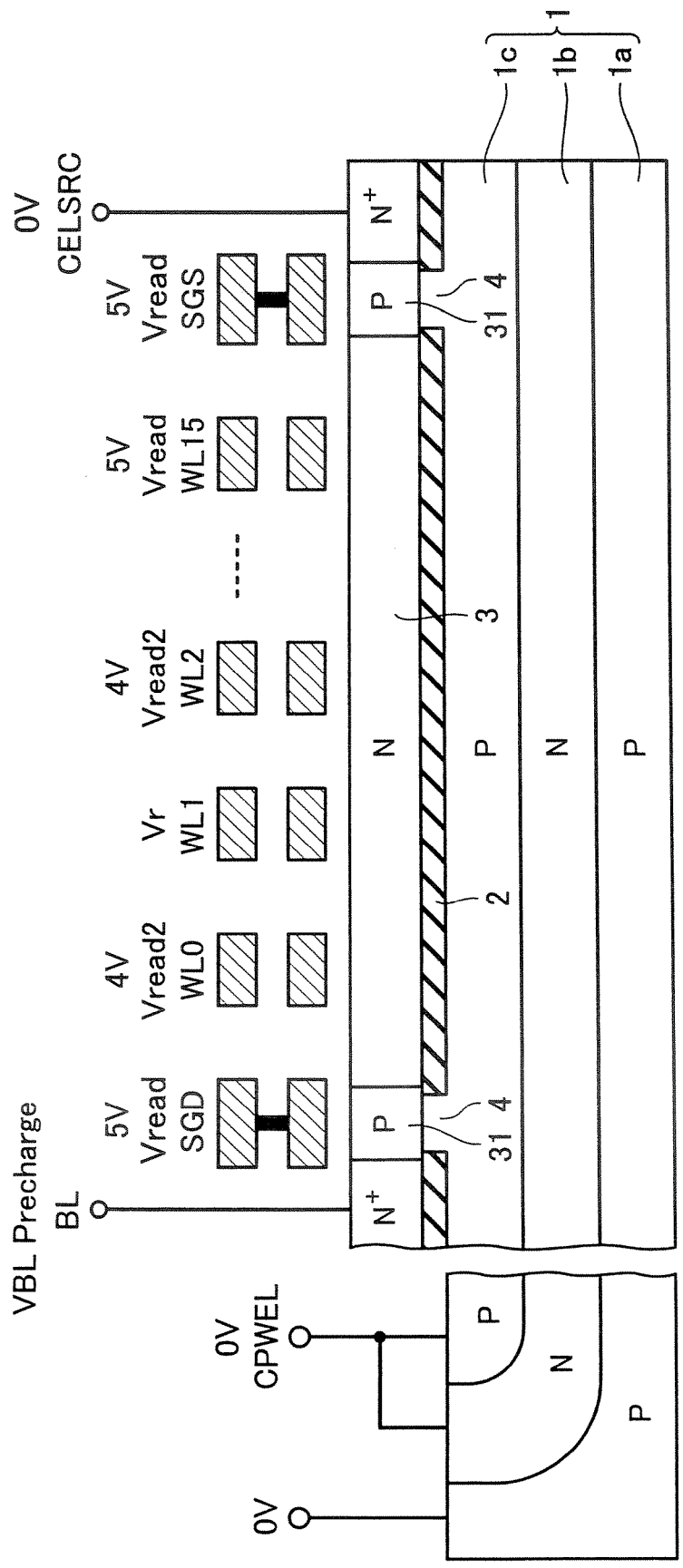
FIG. 49 shows a read condition in a flash memory in accordance with another embodiment with reference to that shown in FIG. 23.

(f) Other read conditions may be used, which are different from that explained with reference to FIG. 23. For example, FIG. 49 shows another read condition, in which pass voltage Vread2 applied to the word lines disposed on the both side of the selected cell (i.e., selected word line WL1 in FIG. 49) is set to be lower than the pass voltage Vread applied to other non-selected word lines. For example, Vread is set at 5V while Vread2 is set at 4V.

Additional Embodiments

Explained below are additional embodiments, in which multiple openings are formed at locations corresponding to the source/drain regions of memory cells in the NAND cell unit.

Figure 50:
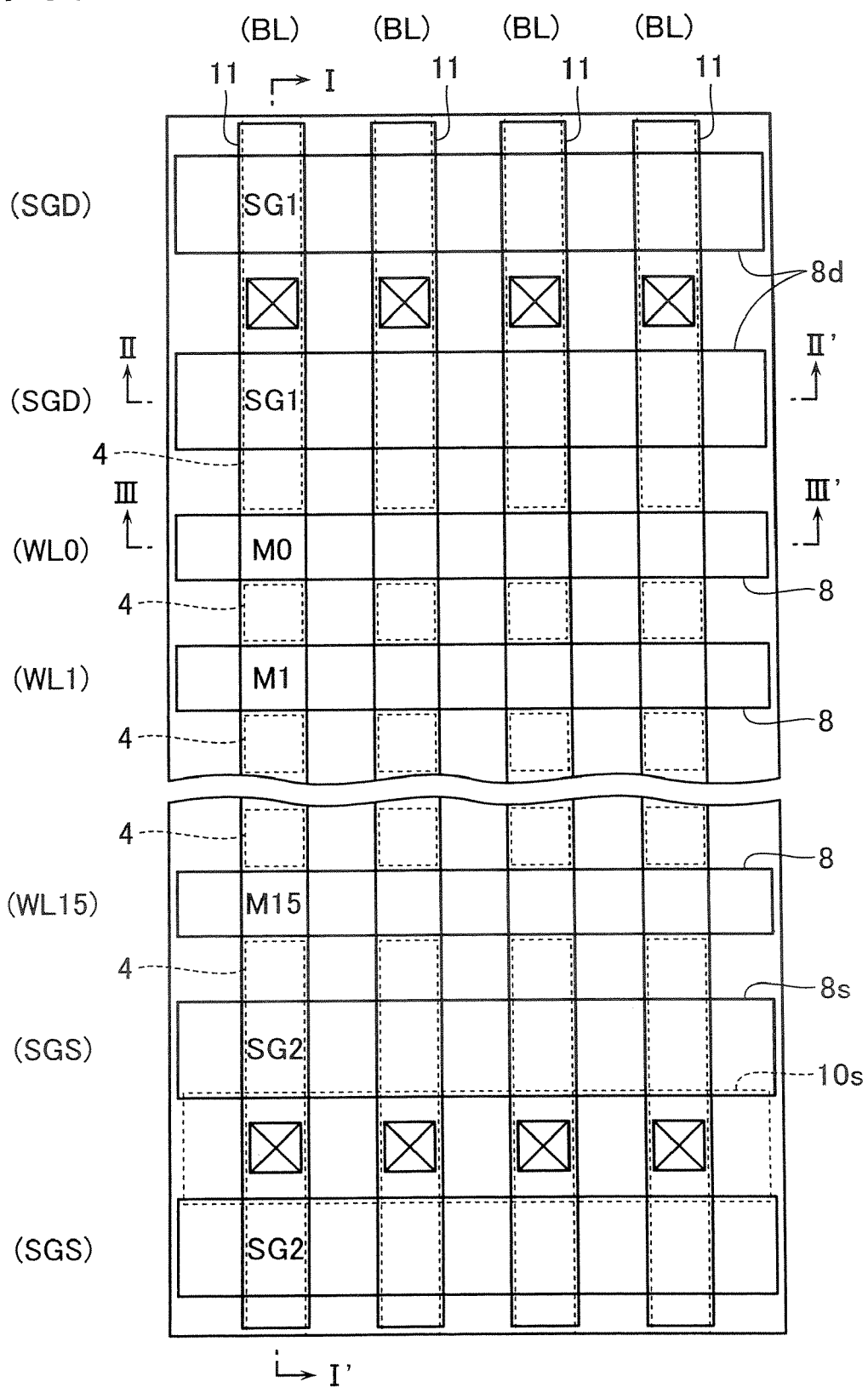
FIG. 50 shows plan view of a memory cell array of a NAND-type-flash memory in accordance with an additional embodiment of the present invention.
Figure 51:
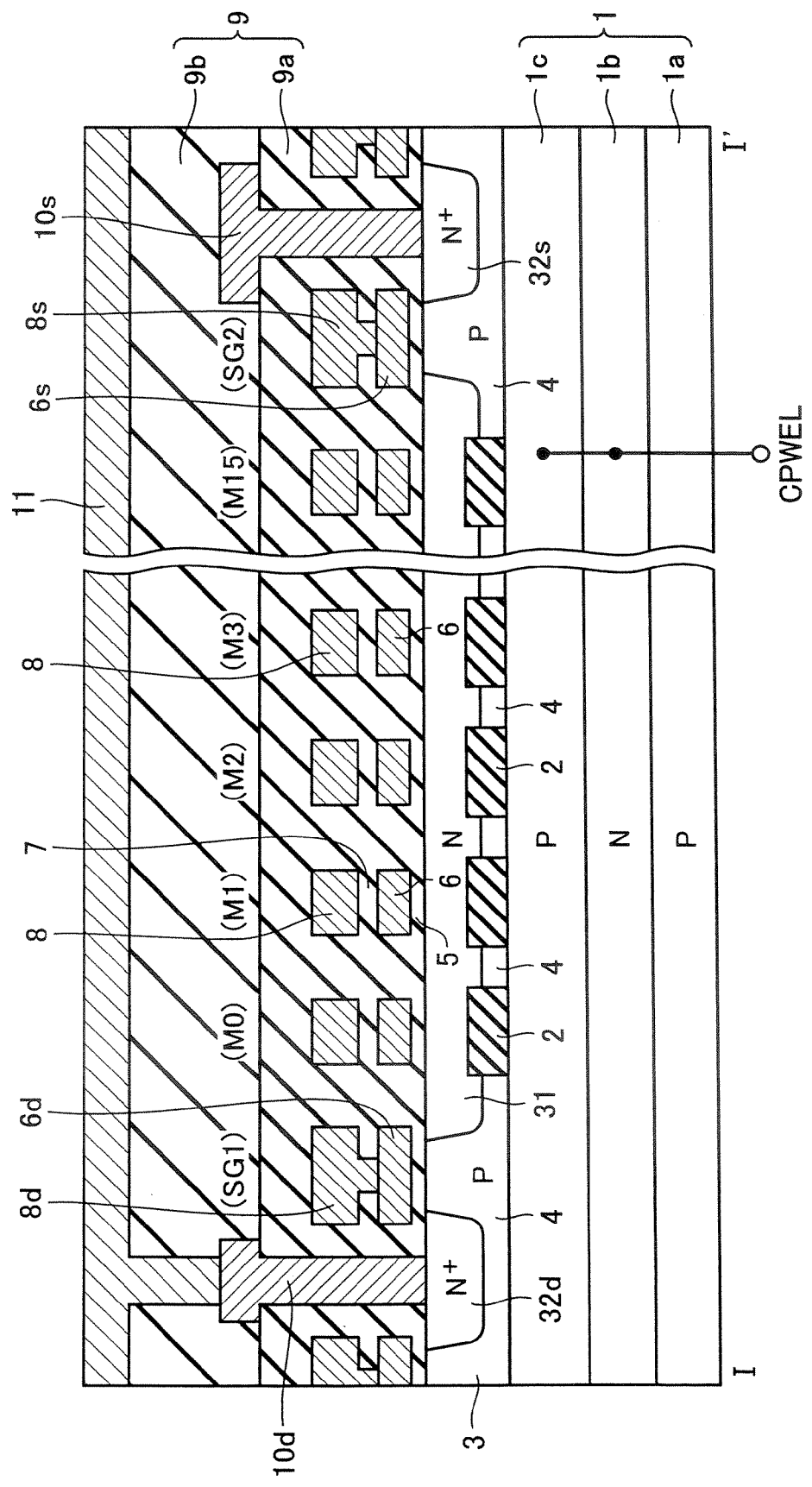
FIG. 51 shows a sectional view of the memory cell array taken along line I-I' in FIG. 50.
Figure 52:
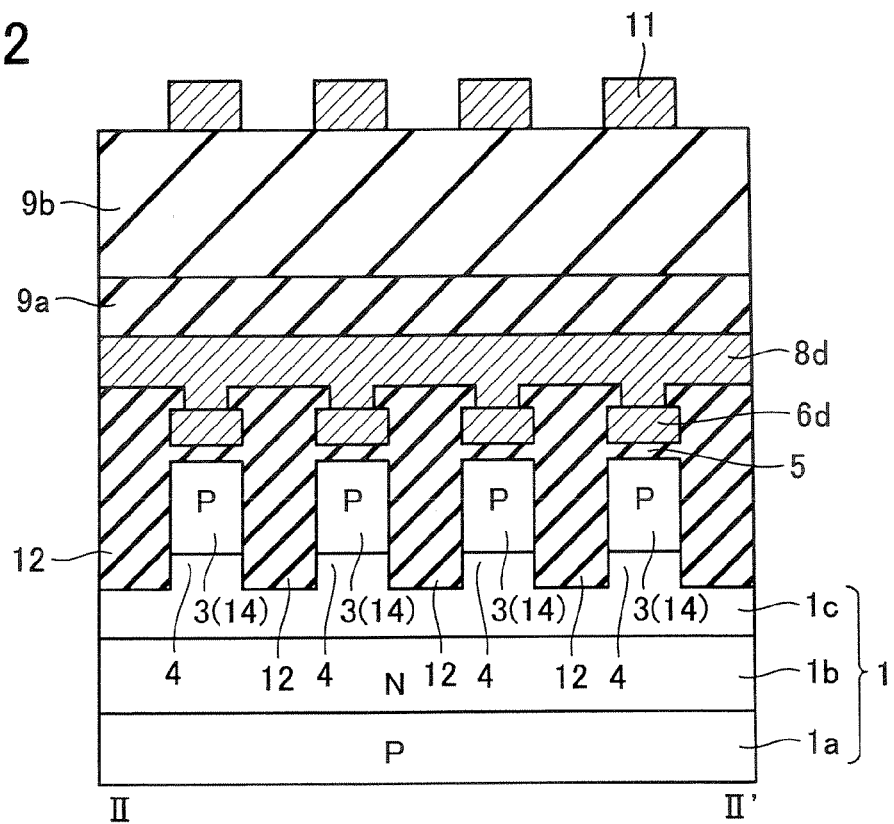
FIG. 52 shows a sectional view of the memory cell array taken along line II-II' in FIG. 50.
Figure 53:
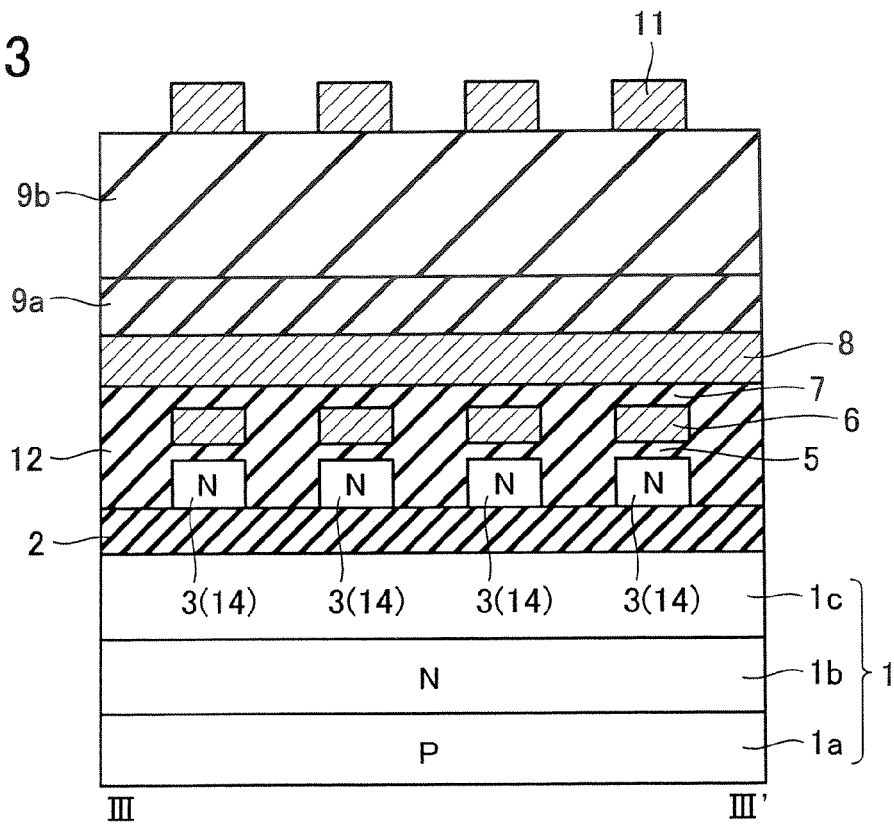
FIG. 53 shows a sectional view of the memory cell array taken along line III-III' in FIG. 50.

FIG. 50 is a plan view of a memory cell array of a NAND-type flash memory in accordance with an additional embodiment; FIG. 51 is its sectional view taken along a bit line (BL) (i.e., I-I' sectional view of FIG. 50); FIG. 52 is its sectional view taken along a select gate line (SGD) (i.e., II-II' sectional view of FIG. 50); and FIG. 53 is its sectional view taken along a word line (WL) (i.e., III-III' sectional view of FIG. 50).

Note here that, in FIGS. 50-53, the portions corresponding to those in the above-described embodiments are designated by the same reference symbols as in the above-described embodiments.

The device body is an SOI substrate, which has a single crystalline silicon substrate 1 and a silicon layer 3 formed thereabove. The silicon layer 3 is insulated from the substrate 1 with an insulating film, for example, a silicon oxide film 2, interposed therebetween. The silicon layer 3 is not perfectly insulated from the substrate 1, but is in contact with the substrate 1 via openings (or holes) 4 formed in the oxide film 2. Including this meaning, the SOI substrate in accordance with this embodiment will be referred to as a "partial SOI substrate" hereinafter.

The silicon substrate 1 has such a well structure in the memory cell array area that an n-type of well 1b is formed on a p-type of silicon substrate 1a; and a p-type of well 1c on the n-type of well 1b.

The silicon layer 3 is a crystallized or re-crystallized one in such a way that an n-type of polycrystalline or amorphous silicon layer is deposited on the oxide film 2 and annealed. In this crystallizing anneal process, crystallization is progressed as a solid-phase epitaxial growth, in which the substrate silicon crystal exposed at the openings 4 serve as seeds.

As shown in FIG. 51, n-type of diffusion layer 31 is formed by ion implantation on a cell formation area of the entire memory cells (i.e., on the channel body regions and source/drain regions) in an NAND cell unit (NAND string) in the silicon layer 3. The diffusion layer 31 is not extended to the channel body regions of the select gate transistors disposed at the both ends of the NAND cell unit, and the p-type of layer 3 is remained under the select gate lines as it is.

Silicon layer 3 is divided into stripe-shaped device formation areas 14 which are separated from each other with a device-isolating insulator film 12 as shown in FIGS. 52 and 53. Floating gates 6 are formed above the silicon layer 3 with tunnel insulating film 5 interposed therebetween, and control gates 8 are formed above the floating gates 6 with inter-gate insulating film 7 interposed therebetween.

Floating gates 6 are formed at the respective memory cells to be separated from each other; and control gates 8 are formed to be continued in one direction, thereby constituting word lines WL (WL0-WL15), each of which is a common one for multiple memory cells. Although, in this embodiment, the floating gate is formed of a polysilicon film, it may be formed as an insulating charge storage layer.

The equivalent circuit of the memory cell array is the same as shown in FIG. 5. Select gate transistors SG1 and SG2 are disposed at both ends of the serially connected memory cells M0-M15, and these constitute a NAND cell unit. Gates of these select gate transistors SG1 and SG2 are formed of the same polysilicon films 6d, 8d and 6s, 8s as floating gate 6 and control gate 8, which are stacked and in contact with each other, thereby constituting select gate lines SGD and SGS disposed in parallel with word lines WL.

The memory cell array is covered with an interlayer insulating film 9 (9a, 9b), on which bit lines (BL) 11 are formed. On the interlayer insulating film 9a, a common source line (CELSRC) 10s are formed to be in contact with the source regions 32s of the select gate transistors SG1 in the NAND cell units, and bit line contact plug 10d is formed of the same conductive material film as the common source line. The bit lines 11 are connected to the drain regions 32d via the contact plug 10d.

$n^+$-type of diffusion layers are formed at the source line and bit line contact portions (i.e., at the common drain region 32d of the adjacent two select gate transistors SG1 and at the common source region 32s of the adjacent two select gate transistors SG2), so that contact resistances of these portions are made low.

The silicon layer 3 is n-type, and this n-type silicon layer 3 is used as channel bodies and source/drains of multiple memory cells constituting a NAND cell unit as it is without forming source and drain diffusion layers, so that adjacent two memory cells have a common source/drain. Therefore, the memory cell is formed as a depletion(D)-type of and n-channel type of transistor as formed. By contrast, the select gate transistors SG1 and SG2 are formed on the p-type of silicon layer 3 as enhancement (E) type of and n-channel type of transistors, which are cut off with 0V gate voltage.

In this embodiment, the openings 4 in the oxide film 2 are formed not only at the locations corresponding to all source/drain regions of memory cells in the NAND cell unit but also at other locations corresponding to the channel bodies and source/drain regions of the select gate transistors SG1 and SG2.

The portions of the silicon substrate 1, which are in contact with the p-type silicon layer 3 via the openings 4, serve as seeds of the solid-phase epitaxial-growth when the silicon layer 3 is crystallized. That is, performing epitaxial growth with multiple seeds distributed, the silicon layer 3 will be reproduced as a good quality crystalline layer.

Next, the fabrication process of the flash memory in accordance with this embodiment will be explained with reference to FIGS. 54 to 57, which are sectional views corresponding to FIG. 51.

Figure 54:
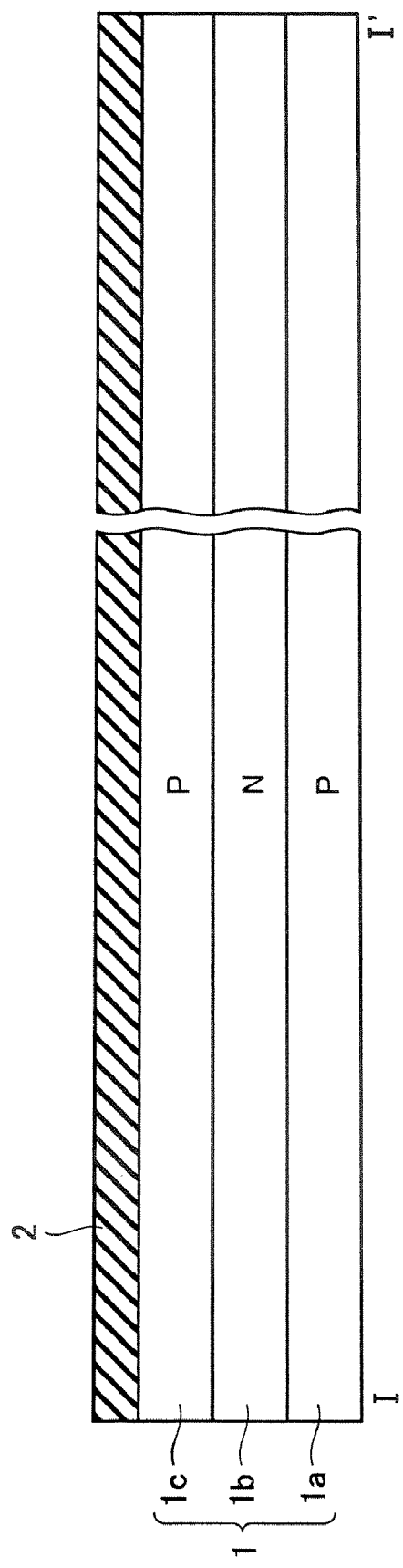
FIG. 54 shows I-I sectional view of the process for forming an oxide film on the substrate.
Figure 55:
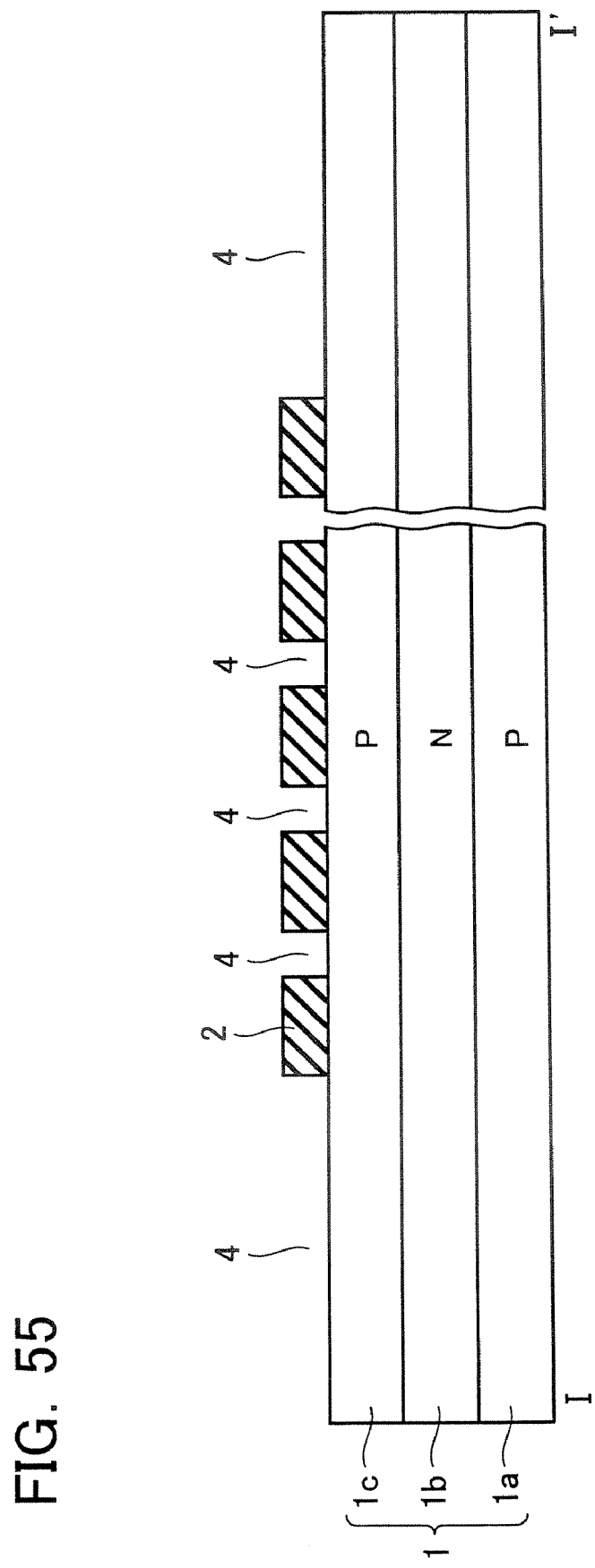
FIG. 55 shows I-I' sectional view of the process for forming openings in the oxide film.

As shown in FIG. 54, silicon oxide film 2 is formed on the silicon substrate 1. Then, as shown in FIG. 55, openings (i.e., holes) 4 are formed in the oxide film 2 at the locations corresponding to channel bodies and source/drain regions of the select gate transistors formed later and source/drain regions of the memory cells. At this step, each of the openings 4 is formed as stripe-shaped one extending continuously in perpendicular to the sheet surface of FIG. 55.

Figure 56:
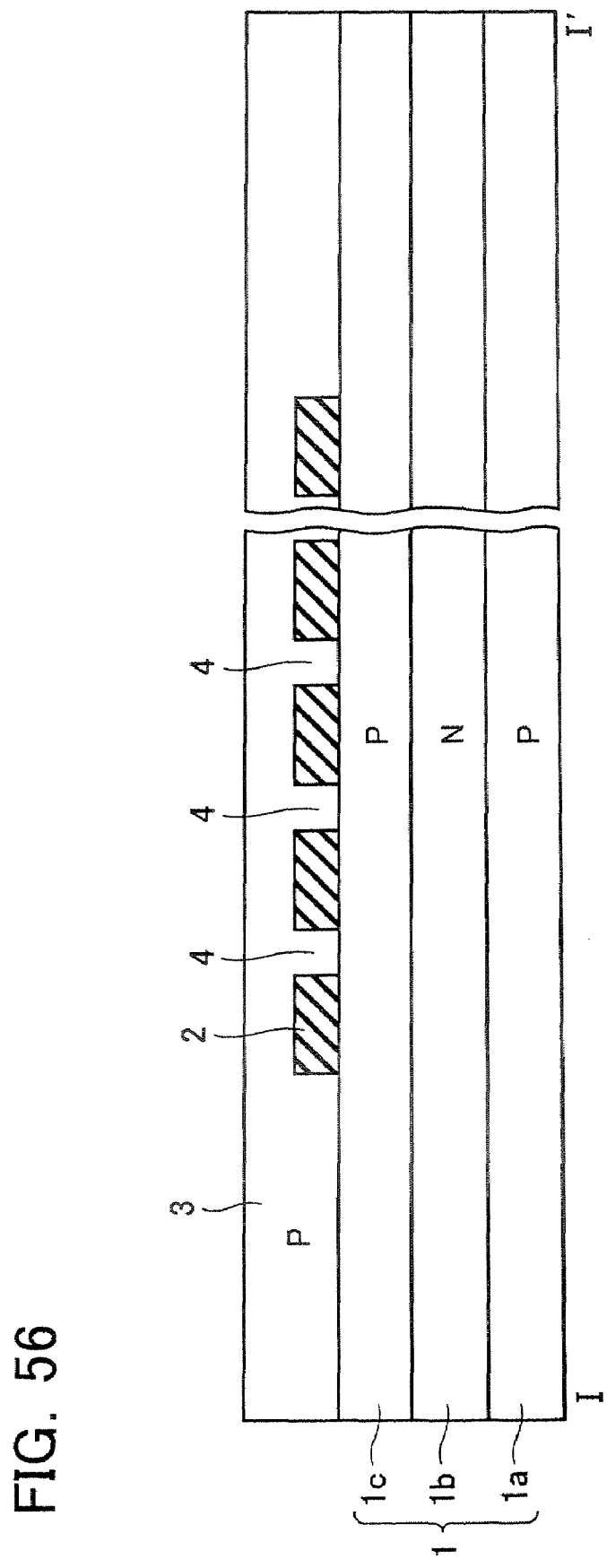
FIG. 56 shows I-I' sectional view of the process for forming a silicon layer of the substrate.

Following it, as shown in FIG. 56, p-type of silicon layer 3 is formed. Explaining in detail, a polysilicon layer or an amorphous silicon layer is deposited and subjected to crystallizing anneal. The silicon layer 3 is made crystalline as a result of solid-phase epitaxial growth, in which the substrate portions exposed at the openings 4 serve as seeds.

Figure 57:
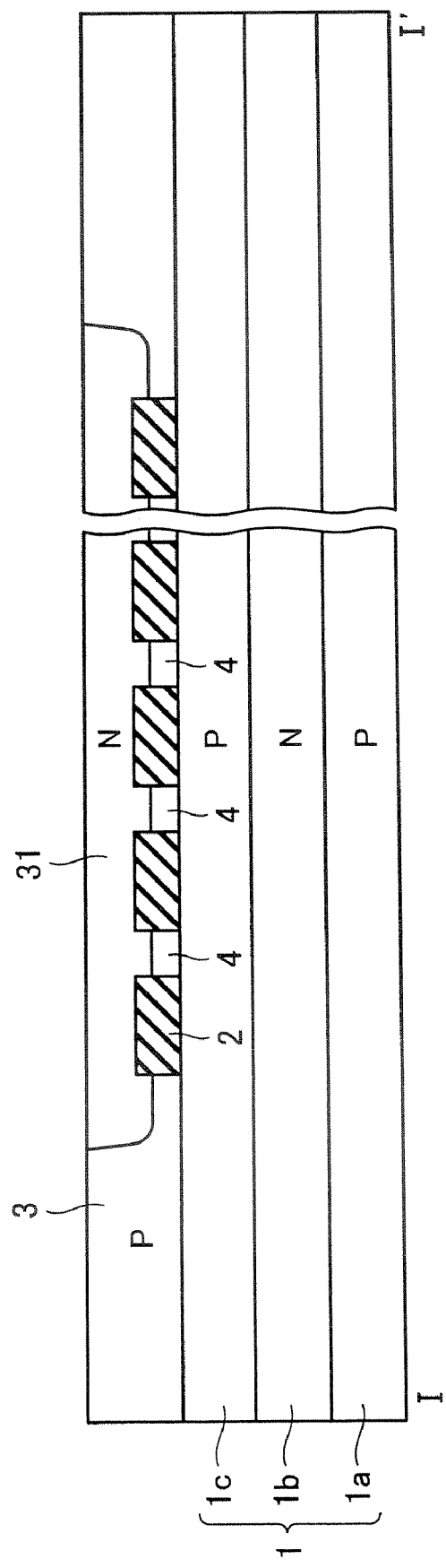
FIG. 57 shows I-I' sectional view of the process for forming an n-type diffusion layer in the silicon layer.

Next, as shown in FIG. 57, ion implantation is performed to form n-type diffusion layer 31 on the area where memory cells are to be formed later, i.e., channel bodies and source/drain regions of all memory cells.

Thereafter, it will be followed by the same process as the conventional NAND-type flash memory. That is, tunnel oxide film 5 is formed on the silicon layer 3; and then a first polysilicon film is deposited, which serves as floating gates. Next, the device isolating trench is formed with a depth at least reaching the oxide film 2; and device isolating film 12 is buried in it.

As a result of this device isolating process, the silicon layer 3 is patterned to multiple stripe-shaped device formation areas 14, which are isolated from each other and continued in the direction of the bit line. At this time, the first polysilicon film serving as floating gates is patterned to the same stripe-shaped patterns as the device formation areas 14.

Then, inter-gate insulating film 7 is formed; and then a second polysilicon film is deposited, which serves as control gates. Patterning the second polysilicon film, word lines 8 and select gate lines 8d and 8s are formed. This polysilicon patterning process is performed to the extent of that the first polysilicon film is etched. As a result, floating gates 6 are formed to be separated from each other in the direction of cell channel length. Although the detail is not explained here, in the select gate lines 8d and 8s, the first and second polysilicon films are in contact with each other.

Then, ion implantation is performed for bit line and source line contact areas, drain regions 32d and source regions 32s are formed with $n^+$-type of diffusion layers in these areas.

Thereafter, as shown in FIGS. 51 to 53, deposit the first interlayer insulating film 9a; form contact holes in it; and form the common source line 10s and bit line contact plug 10d. Following it, deposit the second interlayer insulating film 9b; form contact holes in it; and then form the bit lines 11.

The operations of the flash memory in accordance with this embodiment will be explained below. As described above, each of as formed memory cells is in a depletion (D)-type state (i.e., erase state), and write in the narrow sense is defined by: injecting electrons into the floating gate and making the memory cell enhancement (E)-type with a positive threshold voltage. This memory state with the positive threshold state is dealt with, for example, a "0" data state.

Data erase is defined by: discharging electrons in the floating gate, thereby setting the memory cell to be in the erased state (D-type state). The erased state is dealt with a "1" data state. With these states, binary data may be stored. Controlling the cell threshold distributions to have multiple write threshold states, multi-level data storage may be possible. Explained below is the binary data storage.

Data erase is performed for an erase unit, one block BLK, which is defined as a set of NAND cell units sharing word lines WL0-WL15 in the equivalent circuit shown in FIG. 5.

In a selected block, select gate lines SGD, SGS, bit lines BL and common source line CELSRC are set to be floating; the entire word lines WL0-WL15 in the elected block are set at 0V; and positive erase voltage Vera is applied to a well node CPWEL, which is in contact with the p-type well 1c and n-type well 1b. The erase voltage Vera is a boosted voltage generated from a boost circuit, which is higher than the power supply voltage, for example, 15V to 24V.

Under this bias condition, the PN junction between p-type silicon layer 3 and n-type diffusion layer 31 under the cell array area is forward biased via the opening 4. Therefore, the n-type layer 31 is charged up to the erase voltage Vera. As a result, a large electric field is applied between the floating gate and the cell channel in every memory cell, and electrons in floating gate are discharged by FN tunneling, so that the erase state (i.e., "1" data state) with a negative threshold voltage may be obtained.

Supposing that a set of memory cells arranged along a word line is defined as one page or two pages, data write is performed by a page. Well node CPWEL is applied with 0V (or small and negative voltage); the selected word line WL1 is applied with write voltage Vpgm, that is set at 15V to 20V; the remaining non-selected word lines are applied with positive medium voltage Vm lower than Vpgm; select gate line SGD on the bit line side is applied with Vdd; select gate line SGS on the source line side is applied with 0V; and source line CELSRC is applied with 0V or a suitable positive voltage.

Prior to the above-described write bias application, 0V ("0" write data) and Vdd ("1" write data) are applied to bit lines BL in accordance with write data. As a result, when "0" write time, the NAND cell channel is applied with 0V. In case of "1" write, the select gate transistor SG1 is turned off when source thereof is charged up to Vdd-Vth (Vth: threshold voltage of select gate transistors), so that the NAND cell channel becomes floating.

The write voltage Vpgm and medium voltage Vm being applied under the above-described state, electrons are injected into the floating gate in the "0" write selected cell by FN tunneling. As a result, "0" data defined by a positive threshold voltage may be written into the selected cell. By contrast, the floating cell channel is boosted in potential by capacitive coupling in the "1" write cell, so that electron injection does not occur in it. Therefore, the "1" write cell is kept in the "1" data state.

Data read also is performed by a page. The common source line CELSRC is set at 0V, and bit line BL is precharged to a positive voltage VBL, and kept in a floating state. A selected word line is applied with read voltage Vr (e.g., 0V); the remaining non-selected word lines are applied with pass voltage Vread, which is able to turn on cell without regard to cell data; and select gate lines SGD and SGS are applied with pass voltage Vread.

As a result, in case cell data is "0", the selected cell is not turned on, and the corresponding bit line BL is little discharged. By contrast, in case the selected cell's data is "1", the bit line will be discharged via the NAND cell unit including the selected cell. Therefore, detecting the bit line voltage with the sense amplifier after having performed bit line discharge operation for a certain period, data may be read out.

The substrate in this embodiment is not an SOI substrate, which has a silicon layer perfectly isolated from the substrate, but a partial SOI substrate. While it is required of this partial SOI substrate to be subjected to crystallizing anneal process, it may be obtained inexpensively in comparison with the ordinary SOI substrate. Selecting the thickness of the silicon layer, device isolation is easy. Further, it is possible to achieve such a miniaturized cell structure that is not achieved with an ordinary bulk type of cell array.

In addition, in case of NAND-type flash memory with the ordinary SOI substrate, it is difficult to apply the erase voltage to the channel bodies of all NAND cell units at a time. To improve this problem, it is in need of specifically thinking for example, burying back gates under every channel body.

By contrast, in this embodiment, the silicon layer 3, on which the channel bodies of NAND cell units are formed, is in contact with the substrate 1 via the openings 4 formed in the oxide film 2. Therefore, it is possible to apply the erase voltage to the channel bodies via the substrate 1 for erasing in a lump, so that it is able to certainly perform data erase.

Further, in this embodiment, openings 4 of the oxide 2 are formed under every source/drain region of the memory cells in the NAND cell unit, and the exposed portions of the substrate at these openings 4 serve as seeds for solid-phase epitaxy of the silicon layer 3. As a result, the silicon layer 3 becomes a good quality crystal as a whole. This point will be explained in detail below.

Supposing that there is not opening in the memory cell formation region in the NAND cell unit, the crystallizing process of the silicon layer 3 is performed by use of the openings under the select gate transistors as seeds, so that it is necessary to do epitaxial growth for a long distance in the lateral direction. Therefore, there is such a possibility that the silicon portion far from the seed is not well made crystalline. If the memory cell's channel body is remained in an amorphous or poly-crystalline state, it is impossible to achieve a good cut-off property, so that some problems will be remained in the memory cell performance.

By contrast to this, in this embodiment, since there are provided openings at the locations corresponding to all source/drain regions of the memory cells, the distance of epitaxial growth from each seed portion in the crystallizing process becomes about as short as the memory cell's gate length. As a result, the silicon layer 3 in the NAND cell unit is made a good single-crystalline layer as a whole.

While, in the above-described additional embodiment, the openings 4 in the oxide film 2 have been formed at the locations corresponding to the source/drain regions of all memory cells, it is not always necessary to form openings at the locations corresponding to the entire source/drain regions. Forming at least one opening, preferably forming multiple openings, it is possible to obtain a good crystalline layer.

Figure 58:
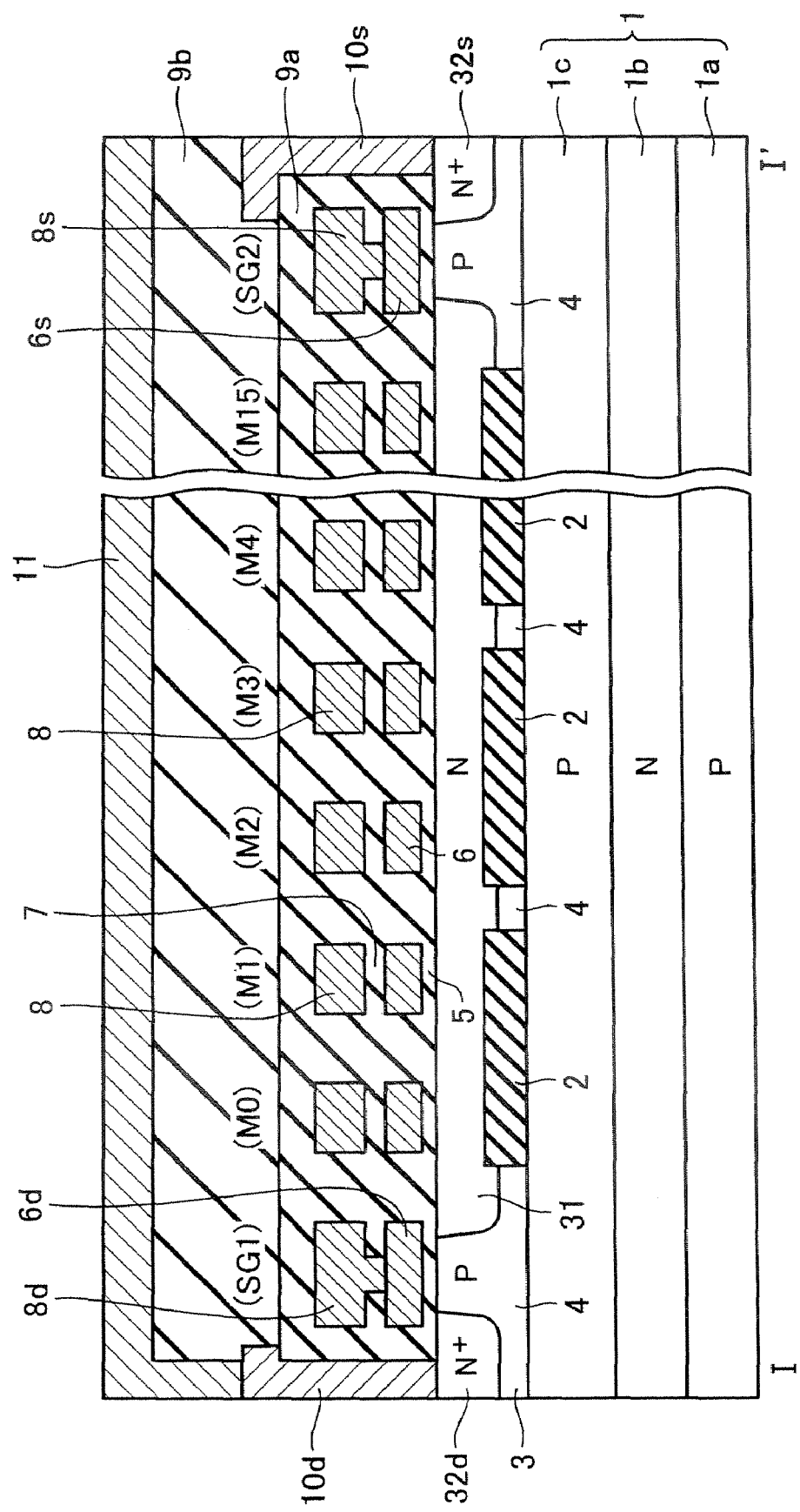
FIG. 58 shows I-I' sectional view for explaining the NAND cell unit formation.

FIG. 58 shows a sectional view of a NAND flash memory in accordance with another additional embodiment in correspondence with FIG. 51. The portions corresponding to those in the above-described embodiment are designated with the same reference symbols as in the above-described embodiment, and the detailed explanation will be omitted.

In this embodiment, the openings 4 are formed at intervals of two source/drain regions of memory cells in the NAND cell unit. Explaining in detail, the openings 4 are selectively formed under the common source/drain regions between even numbered memory cells (i.e., 2nd, 4th, . . . , 14th memory cells) in the NAND cell unit counted from the select gate transistor SG1 (or SG2) side and the following ones. In other words, there are not formed openings at the locations under the common source/drains of the successive two memory cells (M0, M1), (M2, M3), . . . , (M14, M15).

It is the same as in the above-described embodiment that the openings 4 are formed under the channel bodies and source/drain regions of the select gate transistors.

According to the above-described opening arrangement, grain boundaries, which may be formed in the post-crystallized silicon layer, are not positioned at the channel bodies of memory cells. This situation will be explained in detail with reference to FIGS. 59A to 59F.

FIGS. 59A to 59F show schematically the progressive single-crystal growing situations in the silicon layer 3 of the partial SOI substrate in the crystallizing anneal process, where the silicon layer 3 is crystallized from the seed portions at the openings 4. In these drawings, oblique line portions in the silicon layer 3 designate epitaxial growth areas.

Figure 59A:
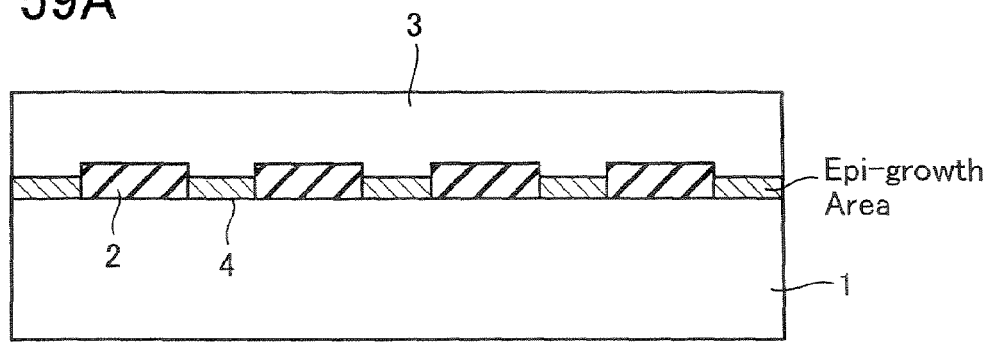
FIGS. 59A to 59F show the changes of the epitaxially grown area in the epitaxial growth process.
Figure 59B:
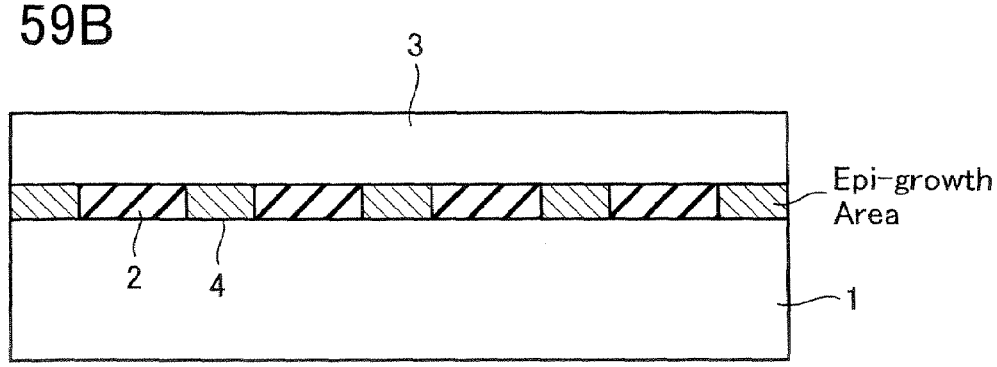
Figure 59C:
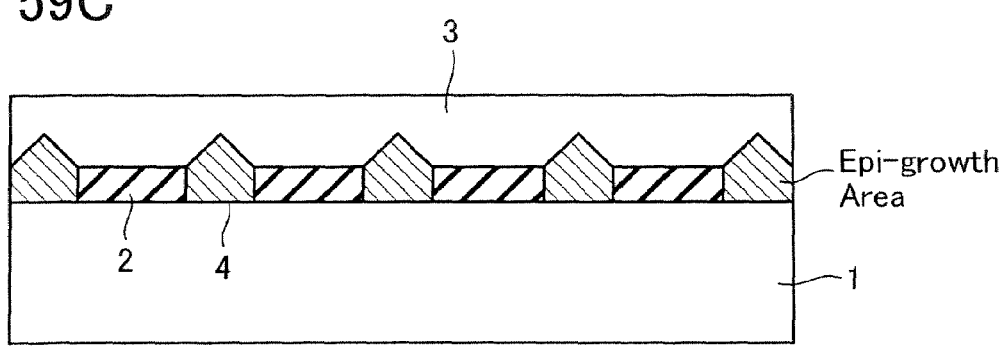
Figure 59D:
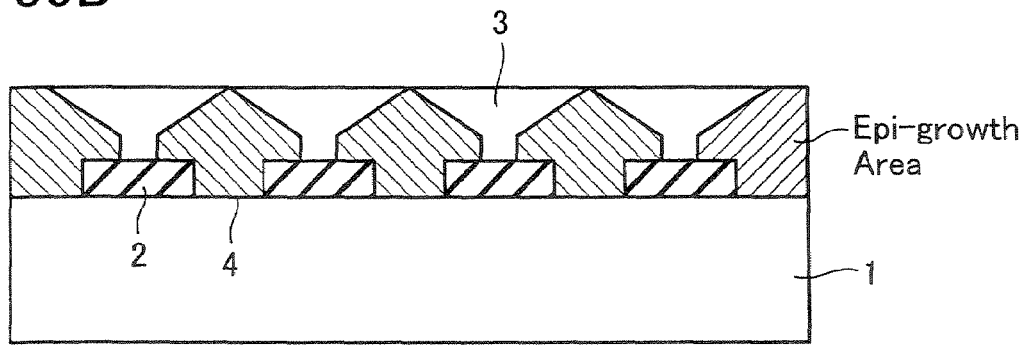

At the beginning of the epitaxial growth, as shown in FIGS. 59A and 59B, the single-crystallization is limited within each opening 4, and progressed only in the direction perpendicular to the substrate 1. Thereafter, the epitaxial growth will be progressed in the horizontal direction (i.e., lateral direction), too. However, the epitaxial growth rate in the lateral direction is slower than that in the vertical direction. As a result, as shown in FIGS. 59C and 59D, the front of the single-crystal area will be sloped.

Figure 59E:
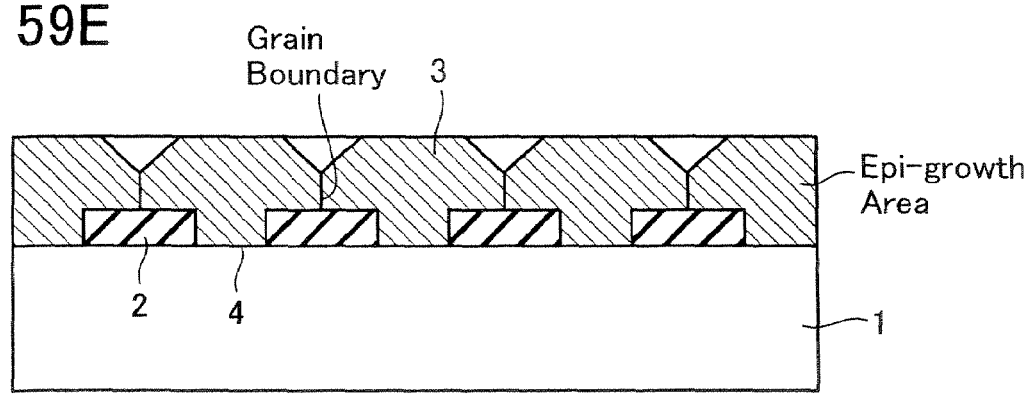
Figure 59F:
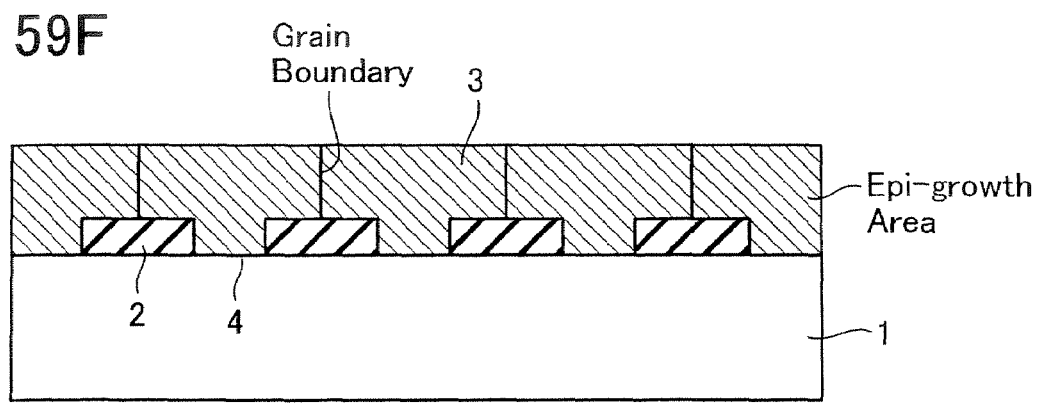

When epitaxital growth areas progressed from adjacent two openings 4 collide with each other on the oxide film 2, crystal lattices thereof are aligned ideally with each other because two epitaxial growth areas are formed of the same crystal. However, as shown in FIG. 59E, as a result of delicate disturbances, grain boundaries are formed between every two epitaxital growth areas. The grain boundaries being not removed finally as shown in FIG. 59F, the silicon layer 3 may not be made single-crystalline as a whole.

Formed in the grain boundaries are fixed charges, interface states and electron-hole pair generation centers. However, in this embodiment, as apparent from the opening arrangement shown in FIG. 58, the locations where the grain boundaries are formed are not under the channel bodies of the memory cells but under the source/drain regions.

If crystal defects are not formed in the channel body, the memory cell shows a good ON/OFF property. If the crystalline property of the source/drain region is bad, it causes in general leakage current between source/drain region and the substrate. However, in this embodiment, the source/drain regions, crystalline property of which is bad, are insulated from the substrate 1 by the oxide film 2. Therefore, the above-described leakage current between the source/drain regions and the substrate will not be carried. While there is a fear of leakage current flowing from the source/drain regions in the lateral direction based on the grain boundaries, it will hardly affect cell properties because the leakage current flows in the same direction as the cell current.

According to this embodiment, even if grain boundaries are formed in the solid-phase epitaxially grown layer, it affects little the memory cell, so that there will be provided a NAND-type flash memory with a good property.

The above-described embodiment will be generalized as follows: openings being formed at common source/drain regions between even numbered memory cells counted from the select gate transistor SG1 (or SG2) and the following ones, the same effect will be obtained. For example, there is disposed the oxide film 3 without openings under the successive four memory cells (M0-M3), (M4-M7), (M8-M11), and (M12-M15), while openings are formed under the source/drain regions between the fourth memory cell M3 and the following memory cell M4, between the eighth memory cell M7 and the following memory cell M8, and between the twelfth memory cell M11 and the following memory cell M12. By use of the above-described opening arrangement, there is not a fear of grain boundaries formed in the channel bodies of memory cells.

Figure 60:
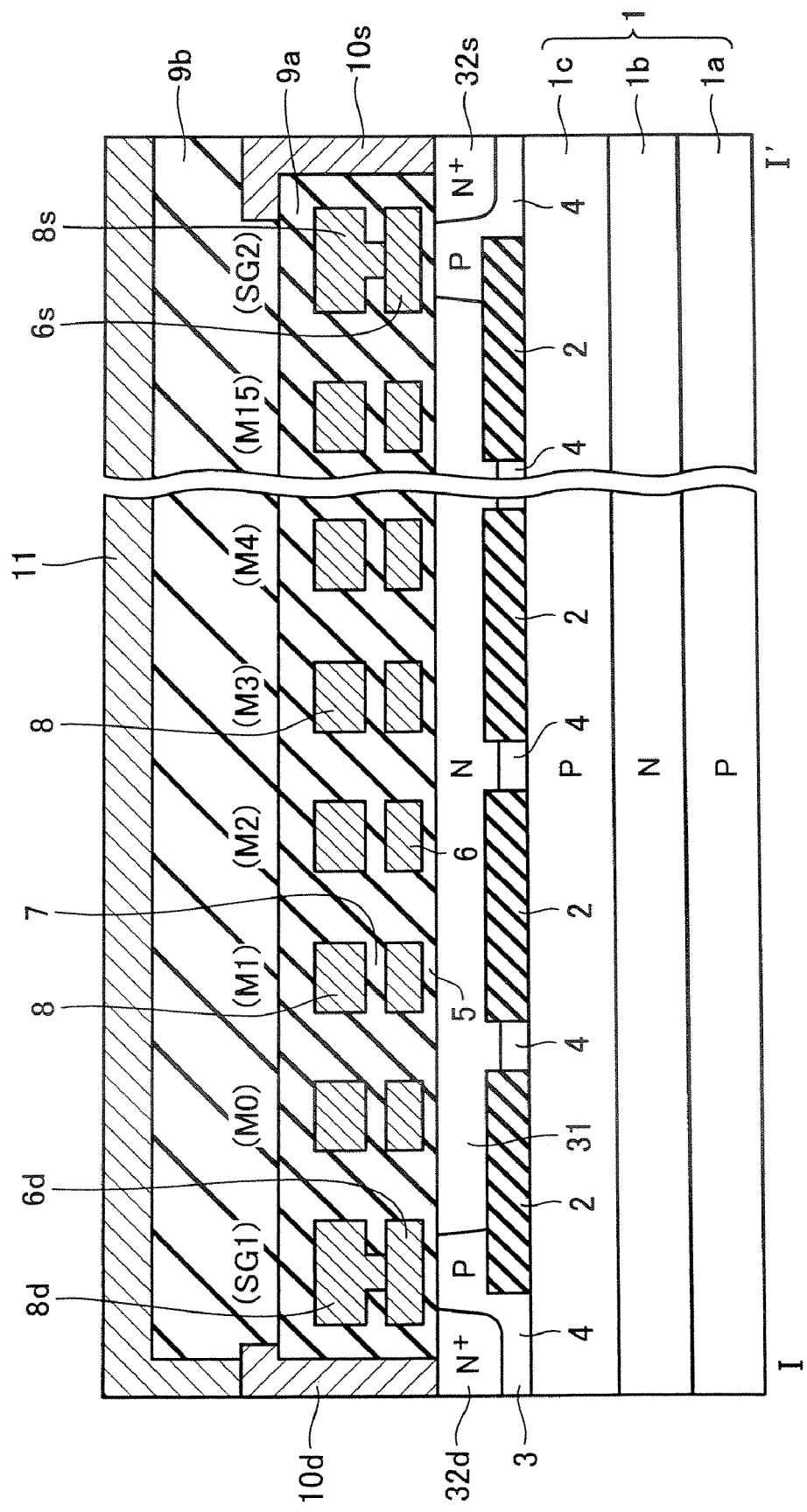
FIG. 60 shows I-I' sectional view of the memory cell array in accordance with another example.

FIG. 60 shows another example, the sectional view of which is in correspondence with FIG. 58. In this example, the openings 4 are selectively formed under the common source/drain regions between successive odd numbered memory cells and the following ones. In detail, the openings 4 are formed under the source/drain regions between the 1st, 3rd, 5th, . . . , 15th memory cells in the NAND cell unit counted from the select gate transistor SG1 (or SG2) and the following ones.

In this case, there is not formed an opening under the source/drain region between memory cell M0 and select gate transistor SG1 on one end of the NAND cell unit, and under the source/drain region between memory cell M15 and select gate transistor SG2 on the other end. Therefore, the spaces between adjacent openings in the oxide film 2 in these areas are made the same as those at other locations in the NAND cell unit.

As a result, based on the same reason as the above-described example, even at the end portion of the memory cell string, the grain boundaries are located in the source/drain regions. In other words, no grain boundaries are formed in the channel bodies of the select gate transistors SG1 and SG2. Therefore, the same effect will be obtained as the above-described example.

The opening arrangement is not limited to the above-described example, in which the openings are formed under the source/drain regions between every odd numbered memory cell and the flowing one. For example, in case the openings may be formed under the source/drain regions between every four odd numbered memory cell (i.e., 3rd, 7th, . . . , 15th memory cells) and the following ones, the same effect will be obtained.

The above-described additional embodiment may be variously modified as follows:

(a) It is effective to use a p-channel type of transistor as a memory cell, which is obtained by reversing p-type and n-type in the above-described embodiment.

(b) It is not always necessary that the openings 4 are aligned with the source/drain regions of memory cells. It is permitted that the openings 4 are slightly shifted from the location just under the source/drain regions.

(c) The opening shape under the select gate transistor area is not limited to the above-described example. For example, it is useful such a case that there are openings under the channel bodies of select gate transistors while no openings are formed under the source/drain regions at the bit line contact and source line contact portions. Alternatively, it is also useful such a case that there are openings under the source/drain regions at the bit line contact and source line contact portions while no openings are formed under the channel bodies of select gate transistors.

(d) As a method of forming a crystalline silicon layer 3, it is useful to add a vapor-phase growing process. That is, firstly, form the epitaxial layer on the opening portion of the substrate with the openings formed by use of vapor-phase growth; then, as similar to the above-described embodiment, deposit the amorphous silicon or polysilicon layer on it; and finally perform crystallizing anneal.

As a result, crystallization is progressed from the vapor-phase epitaxial layer serving as a seed, it is possible to obtain a well-crystallized silicon layer.

(e) It is permitted that the silicon layer 3 is formed as an intrinsic semiconductor layer with impurities contained little, and then made a p-type (or n-type) one by ion implantation after crystallization.

(f) As a method of forming a partial SOI substrate, SIMOX (Separation by Implanted Oxygen) method may be used. That is, selective oxygen ion implantation is performed for the substrate; and then anneal is performed. As a result, it may be provided the same partial SOI substrate as in the above-described embodiment.

What is claimed is:

1. A semiconductor memory device comprising:
   a semiconductor substrate;
   a semiconductor layer formed on the semiconductor substrate with an insulating film interposed therebetween, the semiconductor layer being in contact with the semiconductor substrate via an opening formed in the insulating film; and
   a NAND cell unit formed on the semiconductor layer with a plurality of electrically rewritable and non-volatile memory cells connected in series and first and second select gate transistors disposed at both ends thereof,
   wherein the semiconductor layer is a crystalline layer epitaxially grown from a seed crystal area in the semiconductor substrate, which is in contact with the semiconductor layer via the opening.

2. The semiconductor memory device according to claim 1, wherein
   the semiconductor layer is an n-type of silicon layer;
   the memory cells are formed as n-channel type of transistors, in each of which the n-type silicon layer serves as a channel body, source and drain regions, and a charge storing layer and a control gate are stacked above the channel body; and
   the first and second select gate transistors are formed as n-channel type of transistors, in the channel body regions of which p-type of diffusion layers are formed.

3. The semiconductor memory device according to claim 1, wherein
   the opening in the insulating film is formed under at least one of the first and second select gate transistors.

4. The semiconductor memory device according to claim 1, wherein
   the opening in the insulating film is formed under at least one of the drain region of the first select gate transistor and the source region of the second select gate transistor.

5. The semiconductor memory device according to claim 1, wherein
   the opening in the insulating film is formed under at least one of a first area extending from the drain region to the channel region of the first select gate transistor and a second area extending from the source region to the channel region of the second select gate transistor.

6. The semiconductor memory device according to claim 1, further comprising:
   a bit line formed to be in contact with the drain region of the first select gate transistor; and
   a source line formed to be in contact with the source region of the second select gate transistor, wherein
   the opening in the insulating film is formed under at least one of the bit line and the source line contact areas.

7. The semiconductor memory device according to claim 1, wherein
   the opening in the insulating film is formed under at least one of the memory cells.

8. The semiconductor memory device according to claim 1, wherein
   the semiconductor layer is divided into a plurality of stripe-shaped device forming areas surrounded by a device isolating film buried in the semiconductor layer with such a depth as to reach the insulating film, and
   the control gates of the corresponding memory cells and gates of the corresponding first and second select gate transistors in NAND cell units formed on the device forming areas are formed to be continued as crossing the device forming areas, thereby serving as word lines and select gate lines, respectively.

9. A semiconductor memory device comprising:
   a semiconductor substrate;
   a semiconductor layer formed on the semiconductor substrate with an insulating film interposed therebetween; and
   a NAND cell unit formed on the semiconductor layer with a plurality of electrically rewritable and non-volatile memory cells connected in series, wherein openings are formed in the insulating film at locations corresponding to source/drain regions of the memory cells, and the semiconductor layer is in contact with the semiconductor substrate via the openings,
   wherein the semiconductor layer is a crystalline layer epitaxially grown from seed crystal areas in the semiconductor substrate, which are in contact with the semiconductor layer via the openings.

10. The semiconductor memory device according to claim 9, wherein
the openings in the insulating film are formed under the common source/drain regions between even numbered memory cells and the following ones in the NAND cell unit.

11. The semiconductor memory device according to claim 9, wherein
the openings in the insulating film are formed under the common source/drain regions between odd numbered memory cells and the following ones in the NAND cell unit.

12. The semiconductor memory device according to claim 9, wherein
the NAND cell unit includes first and second select gate transistors disposed at both ends of the memory cells connected in series, and wherein
the openings in the insulating film are formed under not only the source/drain regions of the memory cells but also at least one of the first and second select gate transistors.

13. The semiconductor memory device according to claim 12, wherein
the semiconductor layer is a p-type of silicon layer, on which an n-type of diffusion layer is so formed as to extend over the whole memory cell area in the NAND cell unit;
the memory cells are formed as n-channel, depletion type of transistors, in each of which the n-type of diffusion layer serves as a channel body, source and drain regions, and a charge storing layer and a control gate are stacked above the channel body; and
the first and second select gate transistors are formed as n-channel, enhancement type of transistors, in each of which the p-type of silicon layer serves as a channel body.

* * * * *